(12) United States Patent
Suk et al.

(10) Patent No.: US 9,412,849 B1
(45) Date of Patent: Aug. 9, 2016

(54) METHOD OF FABRICATING SEMICONDUCTOR DEVICE

(71) Applicant: SAMSUNG ELECTRONICS CO., LTD., Suwon-Si, Gyeonggi-Do (KR)

(72) Inventors: Sung-Dae Suk, Seoul (KR); Dong-Il Bae, Incheon (KR)

(73) Assignee: SAMSUNG ELECTRONICS CO., LTD., Suwon-Si, Gyeongg-Do (KR)

( * ) Notice: Subject to any disclaimer, the term of this patent is extended or adjusted under 35 U.S.C. 154(b) by 0 days.

(21) Appl. No.: 14/966,174

(22) Filed: Dec. 11, 2015

(51) Int. Cl.
| | | |
|---|---|---|
| *H01L 21/00* | (2006.01) | |
| *H01L 29/66* | (2006.01) | |
| *H01L 29/423* | (2006.01) | |
| *H01L 21/02* | (2006.01) | |
| *H01L 21/308* | (2006.01) | |
| *H01L 29/06* | (2006.01) | |
| *H01L 21/84* | (2006.01) | |
| *H01L 21/311* | (2006.01) | |

(52) U.S. Cl.
CPC .... *H01L 29/66795* (2013.01); *H01L 21/02532* (2013.01); *H01L 21/308* (2013.01); *H01L 21/31144* (2013.01); *H01L 21/845* (2013.01); *H01L 29/0673* (2013.01); *H01L 29/42392* (2013.01); *H01L 29/66545* (2013.01)

(58) Field of Classification Search
CPC ............ H01L 29/42392; H01L 21/845; H01L 21/31144; H01L 21/308; H01L 29/0673
USPC .......................................................... 438/157
See application file for complete search history.

(56) References Cited

U.S. PATENT DOCUMENTS

| | | |
|---|---|---|
| 8,183,104 B2 | 5/2012 | Hobbs et al. |
| 2013/0270512 A1 | 10/2013 | Radosavljevic et al. |
| 2013/0320294 A1* | 12/2013 | Cappellani ........ H01L 29/66439 257/9 |
| 2014/0097502 A1 | 4/2014 | Sun et al. |
| 2014/0151639 A1 | 6/2014 | Chang et al. |
| 2014/0291772 A1 | 10/2014 | Rachmady et al. |
| 2015/0034899 A1 | 2/2015 | Ching et al. |
| 2015/0035071 A1 | 2/2015 | Ching et al. |
| 2015/0053912 A1 | 2/2015 | Ching et al. |
| 2015/0053928 A1 | 2/2015 | Ching et al. |

* cited by examiner

*Primary Examiner* — Tuan Nguyen
(74) *Attorney, Agent, or Firm* — F. Chau & Associates

(57) ABSTRACT

A method of fabricating a semiconductor device includes forming first and second fin-type structures on first and second regions of a substrate, respectively, forming first and second capping layers on the first and second fin-type structures, respectively, forming a first dummy gate electrode on the first capping layer and a second dummy gate electrode on the second capping layer, exposing the first capping layer and the second capping layer by removing the first dummy gate electrode and the second dummy gate electrode, forming a second wire pattern group on the second region, and forming a first wire pattern group on the first region.

19 Claims, 73 Drawing Sheets

METHOD OF FABRICATING SEMICONDUCTOR DEVICE

TECHNICAL FIELD

Example embodiments of the present disclosure relate to a method of fabricating a semiconductor device, and more particularly, to a method of fabricating a semiconductor device having a gate-all-around structure.

DISCUSSION OF THE RELATED ART

As one of scaling techniques for increasing the density of a semiconductor device, a gate-all-around structure in which a silicon body shaped of a nanowire is formed on a substrate, and in which a gate is formed to surround the silicon body, has been proposed.

Since the gate-all-around structure uses a three-dimensional channel, scaling can be achieved. In addition, current controlling capability can be improved without increasing a length of the gate. Further, a short channel effect (SCE) in which a potential of a channel region is affected by drain voltage can be effectively suppressed.

SUMMARY

Example embodiments of the present disclosure provide a method of fabricating a semiconductor device including wire channels having different materials in different regions of a substrate.

According to an example embodiment of the present disclosure, a method of fabricating a semiconductor device includes forming a first fin-type structure on a first region of a substrate. The first fin-type structure includes a first semiconductor pattern and a second semiconductor pattern alternately stacked on one another and extending in a first direction. The method further includes forming a second fin-type structure on a second region of the substrate. The second fin-type structure includes a third semiconductor pattern and a fourth semiconductor pattern alternately stacked on one another and extending in a second direction. The method further includes forming a first capping layer extending in a third direction different from the first direction on the first fin-type structure, and forming a second capping layer on sidewalls and a top surface of the second fin-type structure. The second capping layer extends in a fourth direction different from the second direction and includes a semiconductor material. The method further includes forming a first dummy gate electrode on the first capping layer and a second dummy gate electrode on the second capping layer, exposing the first capping layer and the second capping layer by removing the first dummy gate electrode and the second dummy gate electrode, forming a second wire pattern group including the third semiconductor pattern on the second region by removing the second capping layer and the fourth semiconductor pattern, and forming a first wire pattern group including the second semiconductor pattern on the first region by removing the first capping layer and the first semiconductor pattern.

According to an example embodiment of the present disclosure, a method of fabricating a semiconductor device includes forming a first fin-type structure on a first region of a substrate. The first fin-type structure includes a first semiconductor pattern and a second semiconductor pattern alternately stacked on one another and extending in a first direction. The method further includes forming a second fin-type structure on a second region of the substrate. The second fin-type structure includes a third semiconductor pattern and a fourth semiconductor pattern alternately stacked on one another and extending in a second direction. The method further includes forming a first capping layer formed on sidewalls and a top surface of the first fin-type structure and extending in a third direction different from the first direction, forming a second capping layer on the second fin-type structure and extending in a fourth direction different from the second direction, forming a first dummy gate electrode on the first capping layer and a second dummy gate electrode on the second capping layer, exposing the first capping layer and the second capping layer by removing the first dummy gate electrode and the second dummy gate electrode, forming a second wire pattern group including the third semiconductor pattern on the second region by removing the second capping layer and the fourth semiconductor pattern, and forming a first wire pattern group including the second semiconductor pattern on the first region by removing the first capping layer and the first semiconductor pattern. The first capping layer and the second capping layer include different materials.

According to an example embodiment of the present disclosure, a method of fabricating a semiconductor device includes forming a stacked structure on a first region and a second region of a substrate. The stacked structure includes a first semiconductor pattern and a second semiconductor pattern alternately stacked on one another. The method further includes forming a first mask pattern and a second mask pattern on the stacked structure formed on the first region and the second region, and forming a first fin-type structure on the first region of the substrate. The first fin-type structure includes a first semiconductor pattern and a second semiconductor pattern alternately stacked on one another and extending in a first direction. The first fin-type structure is formed by etching the stacked structure using the first mask pattern. The method further includes forming a second fin-type structure on the second region of the substrate by etching the stacked structure using the second mask pattern. The second fin-type structure includes a third semiconductor pattern and a fourth semiconductor pattern stacked on one another and extending in a second direction. The fourth semiconductor pattern and the second semiconductor pattern include the same material. The method further includes forming a first capping layer extending in a third direction different from the first direction on the first fin-type structure, and forming a second capping layer on sidewalls and a top surface of the second fin-type structure. The second capping layer extends in a fourth direction different from the second direction and includes the same material as the fourth semiconductor pattern. The method further includes forming a first dummy gate electrode on the first capping layer and a second dummy gate electrode on the second capping layer, respectively, forming a first gate spacer on sidewalls of the first dummy gate electrode and a second gate spacer on sidewalls of the second dummy gate electrode, forming a recess in the second fin-type structure by removing the second dummy gate electrode and the second fin-type structure exposed at opposite sides of the second gate spacer, and forming an epitaxial layer filling the recess on the second fin-type structure. The method further includes exposing the first capping layer and the second capping layer by removing the first dummy gate electrode and the second dummy gate electrode, forming a second wire pattern group including the third semiconductor pattern on the second region and including one or more second wire patterns by removing the second capping layer and the fourth semiconductor pattern, forming a first wire pattern group including the second semiconductor patterns on the first region by removing the first capping layer and the first semiconductor pattern, forming a gate insulation layer along peripheries of the second wire patterns and sidewalls of the second gate spacer, and forming a gate electrode surrounding each of the second wire patterns on the gate insulation layer.

According to an example embodiment of the present disclosure, a method of fabricating a semiconductor device includes forming a first fin-type structure on a first region of a substrate. The first fin-type structure includes a first semiconductor pattern and a second semiconductor pattern alternately stacked on one another. The method further includes forming a second fin-type structure on a second region of the substrate. The second fin-type structure includes a third semiconductor pattern and a fourth semiconductor pattern alternately stacked on one another. A material forming the fourth semiconductor pattern is silicon-germanium (SiGe) or germanium (Ge). The method further includes forming a first capping layer on the first fin-type structure. The first capping layer includes silicon oxide. The method further includes forming a second capping layer on the second fin-type structure. The material forming the second capping layer and the material forming the fourth semiconductor pattern are the same material. The method further includes removing the second capping layer and the fourth semiconductor material at substantially a same time using a same etching process.

BRIEF DESCRIPTION OF THE DRAWINGS

The above and other features of the present disclosure will become more apparent by describing in detail example embodiments thereof with reference to the accompanying drawings, in which:

FIGS. 1A to 17B are perspective and cross-sectional views illustrating a method of fabricating a semiconductor device according to an example embodiment of the present disclosure.

FIGS. 18A-1 to 21B-2 are cross-sectional views illustrating a method of fabricating a semiconductor device according to an example embodiment of the present disclosure.

DETAILED DESCRIPTION

Figure 1A:
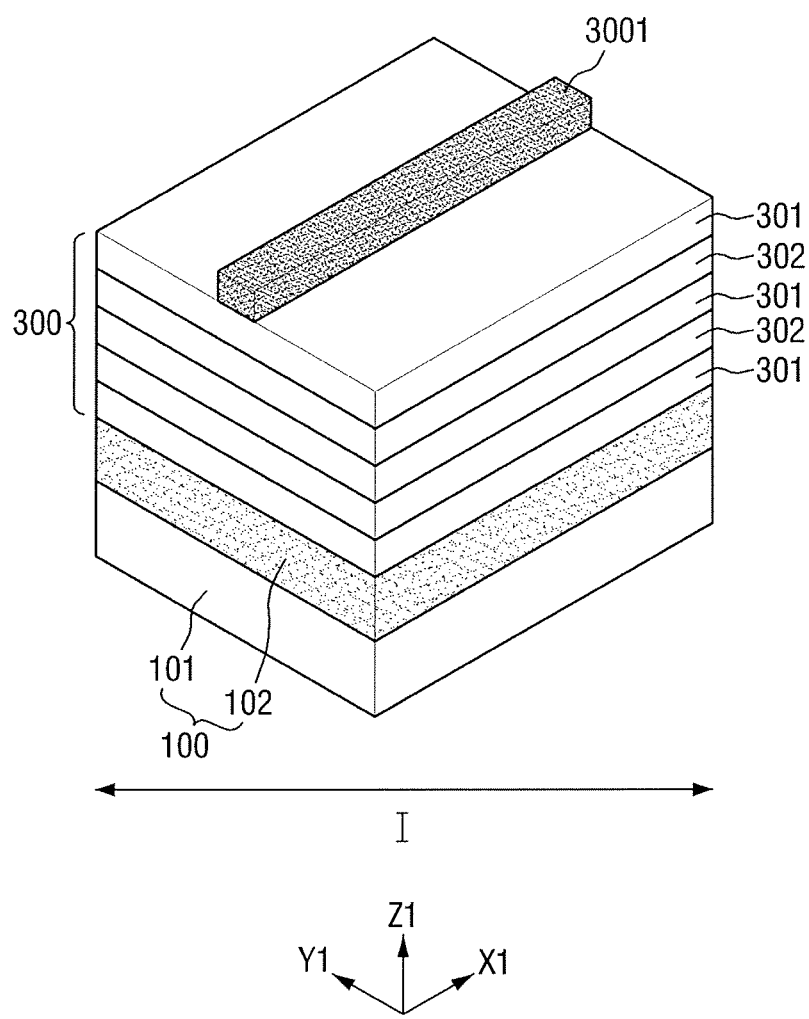

Example embodiments of the present disclosure will be described more fully hereinafter with reference to the accompanying drawings. In the drawings, the size and relative sizes of layers and regions may be exaggerated for clarity. Like reference numerals may refer to like elements throughout the accompanying drawings.

The terminology used herein is for the purpose of describing particular example embodiments only and is not intended to be limiting of the inventive concept. As used herein, the singular forms "a", "an" and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Herein, when events are described as occurring at substantially the same time, it is to be understood that the events may occur at exactly the same time or at about the same time as would be understood by a person having ordinary skill in the art.

Hereinafter, methods of fabricating semiconductor devices according to example embodiments of the present disclosure will be described with reference to the accompanying drawings.

First, a method of fabricating semiconductor devices according to an example embodiment of the present disclosure will be described with reference to FIGS. 1 to 17.

FIGS. 1A to 17B are perspective and cross-sectional views illustrating a method of fabricating a semiconductor device according to an example embodiment of the present disclosure.

Figure 1B:
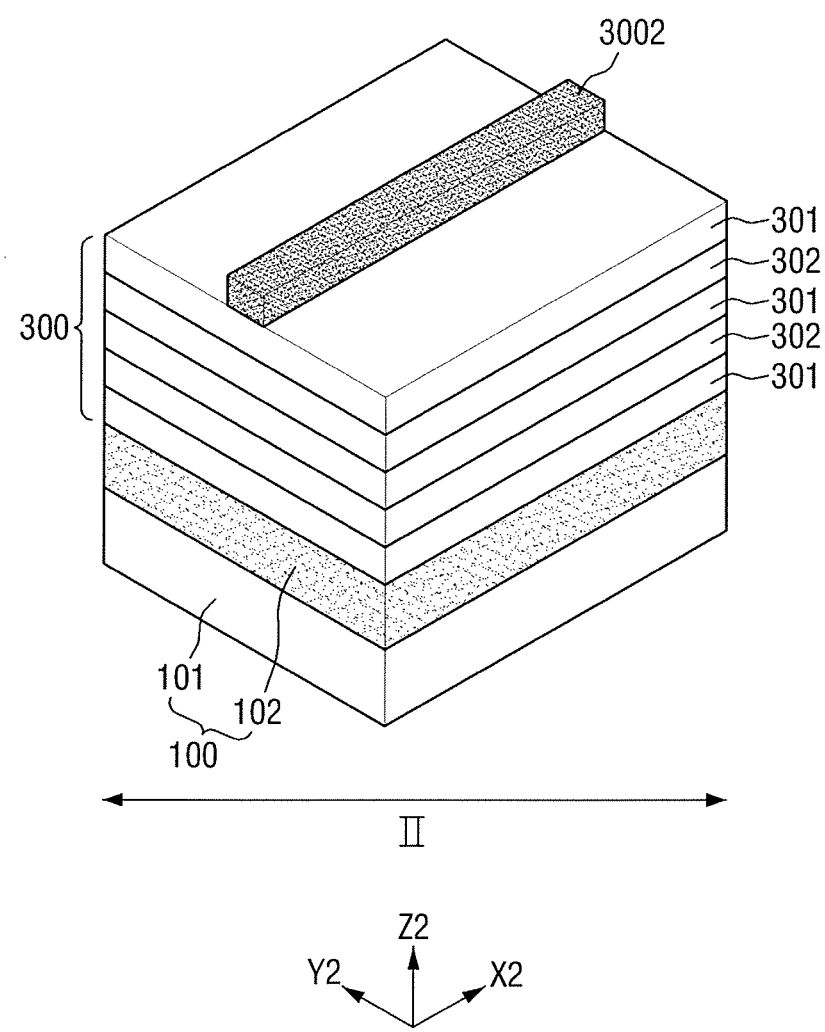

Referring to FIGS. 1A and 1B, a stacked structure 300 having a first semiconductor layer 301 and a second semiconductor layer 302 alternately stacked on one another is formed on a substrate 100.

The substrate 100 may include a first region I and a second region II. The first region I and the second region II may be regions spaced apart from each other or may be connected to each other.

According to an example embodiment, the first region I may include a P-type transistor region and the second region II may include an N-type transistor region. However, example embodiments of the present disclosure are not limited thereto.

The substrate 100 may be, for example, a bulk silicon substrate or a silicon-on-insulator (SOI) substrate. The substrate 100 may further be a silicon substrate or a substrate including other materials, such as silicon germanium, indium antimonide, lead telluride, lead telluride, indium arsenide, indium phosphide, gallium arsenide, or gallium antimonide. The substrate 100 may further be an epitaxial layer formed on a base substrate. However, the substrate 100 is not limited thereto.

In semiconductor devices according to example embodiments of the present disclosure, the substrate 100 may include a lower substrate 101 and an upper substrate 102 formed on one surface of the lower substrate 101. In an example embodiment, the lower substrate 101 may be a semiconductor substrate and the upper substrate 102 may be an insulating substrate. The substrate 100 may include a semiconductor substrate and an insulating substrate formed on one surface of the semiconductor substrate. For example, the substrate 100 may be a silicon-on-insulator (SOI) substrate.

The first semiconductor layer 301 and the second semiconductor layer 302 may be alternately stacked on one another on the substrate 100. The first semiconductor layer 301 and the second semiconductor layer 302 may be formed by, for example, an epitaxial growth process. However, example embodiments of the present disclosure are not limited thereto. A topmost layer of the stacked structure 300 may be, for example, the first semiconductor layer 301. However, example embodiments of the present disclosure are not limited thereto.

In the stacked structure 300, the first semiconductor layer 301 that is in contact with the substrate 100 may be adhered to the substrate 100 by, for example, wafer bonding. However, example embodiments of the present disclosure are not limited thereto.

According to an example embodiment, the first semiconductor layer 301 and the second semiconductor layer 302 include different materials. The first semiconductor layer 301 and the second semiconductor layer 302 may include materials having etching selectivity with respect to each other. That is, the first semiconductor layer 301 may include a material having etching selectivity with respect to the second semiconductor layer 302. Thus, when the second semiconductor layer 302 is etched, the first semiconductor layer 301 may not be substantially etched. Conversely, when the first semiconductor layer 301 is etched, the second semiconductor layer 302 may not be substantially etched. Reasons for forming the second semiconductor layer 302 of a material that has etching selectivity with respect to the first semiconductor layer 301 will be described in detail below.

The first semiconductor layer 301 may include one of silicon (Si) and a III-V semiconductor. However, example embodiments of the present disclosure are not limited thereto. The III-V semiconductor may include, for example, at least one of a binary compound, a ternary compound or a quaternary compound, and may be prepared by combining at least one group III element of aluminum (Al), gallium (Ga) and indium (In) with at least one group V element of phosphorus (P), arsenic (As) and antimony (Sb).

The second semiconductor layer 302 may include, for example, one of silicon-germanium (SiGe) and germanium (Ge). However, example embodiments of the present disclosure are not limited thereto.

Next, referring to the first region I, a first mask pattern 3001 extending in a first direction X1 is formed on the stacked structure 300. In addition, in the second region II, a second mask pattern 3002 extending in a third direction X2 is formed on the stacked structure 300.

Each of the first mask pattern 3001 and the second mask pattern 3002 may include, for example, at least one of silicon oxide, silicon nitride and silicon oxynitride. However, example embodiments of the present disclosure are not limited thereto.

Figure 2A:
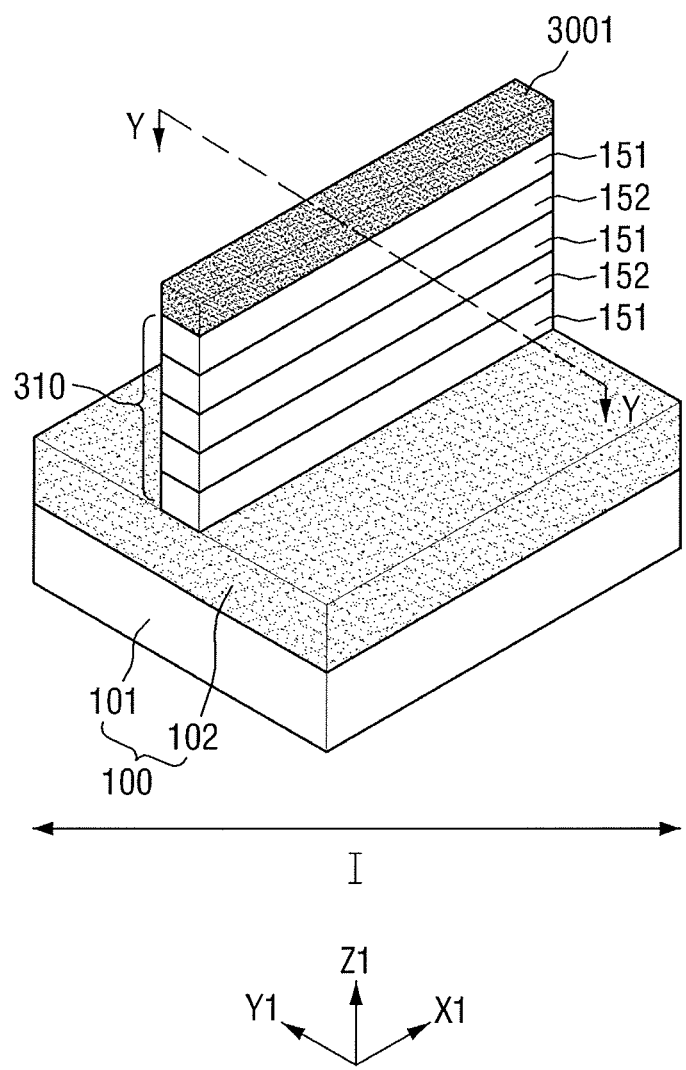
Figure 2B:
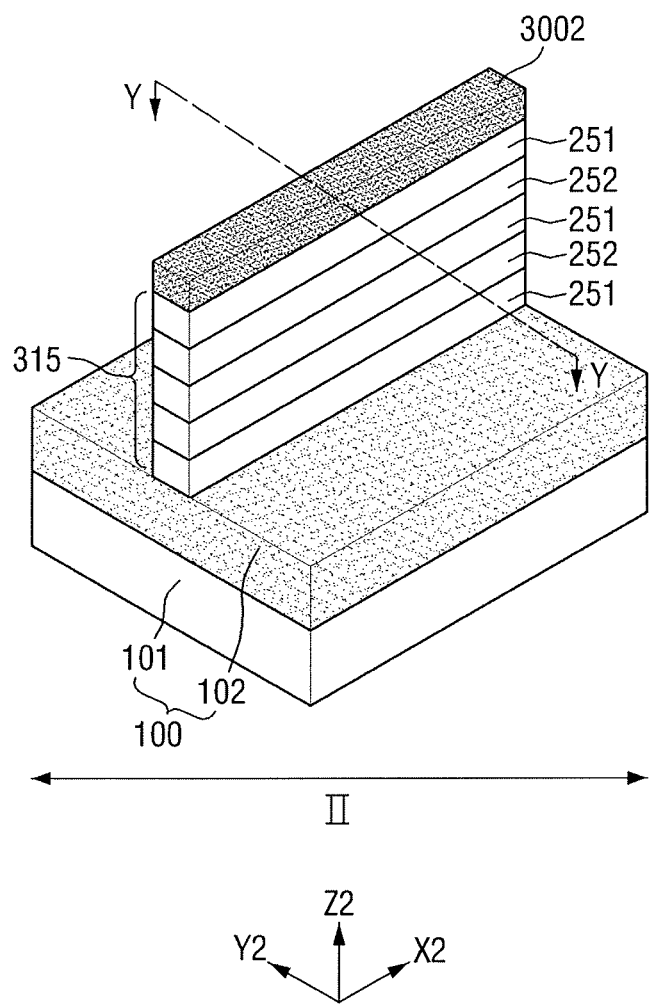

Referring to FIGS. 2A and 2B, the stacked structure 300 is etched using the first mask pattern 3001 and the second mask pattern 3002 as etch masks, thereby forming the first fin-type structure 310 and the second fin-type structure 315. For example, the stacked structure 300 is etched until a top surface of the substrate 100 is exposed, thereby forming the first fin-type structure 310 and the second fin-type structure 315.

The first fin-type structure 310 may be formed on the first region I and the second fin-type structure 315 may be formed on the second region II. The first fin-type structure 310 may extend lengthwise in the first direction X1 and the second fin-type structure 315 may extend lengthwise in the third direction X2.

The first fin-type structure 310 may include a first semiconductor pattern 151 and a second semiconductor pattern 152 alternately stacked on the substrate 100. The second fin-type structure 315 may include a third semiconductor pattern 251 and a fourth semiconductor pattern 252 alternately stacked on the substrate 100.

Since each of the first semiconductor pattern 151 and the third semiconductor pattern 251 is formed by etching the first semiconductor layer 301, the first semiconductor pattern 151 and the third semiconductor pattern 251 may include the same material. Since each of the second semiconductor pattern 152 and the fourth semiconductor pattern 252 is formed by etching the second semiconductor layer 302, the second semiconductor pattern 152 and the fourth semiconductor pattern 252 may include the same material.

Next, the first mask pattern 3001 and the second mask pattern 3002 positioned on the first fin-type structure 310 and the second fin-type structure 315, respectively, may be removed. Next, a first capping layer 131 may be formed on the first fin-type structure 310. In addition, a second capping layer 231 may be formed on the second fin-type structure 315.

Figures 1, 3A:
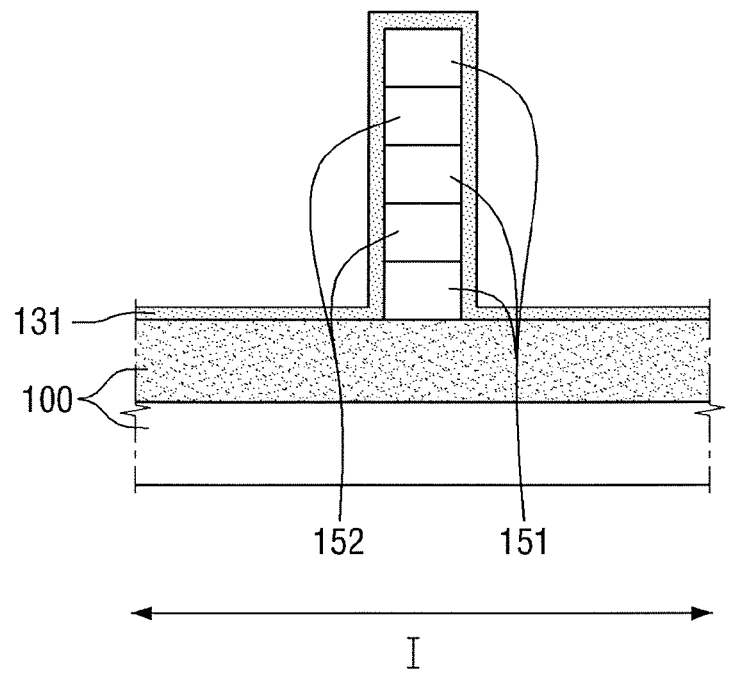
Figures 2, 3A:
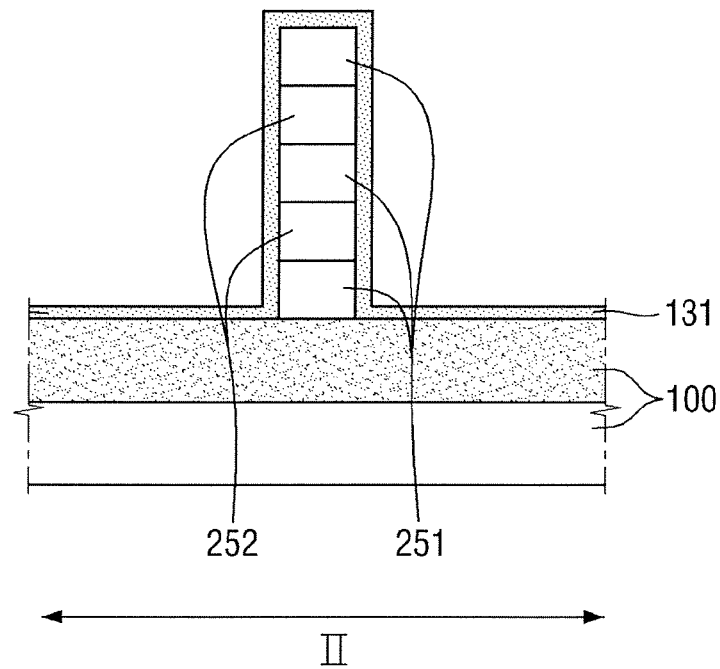
Figures 1, 3B:
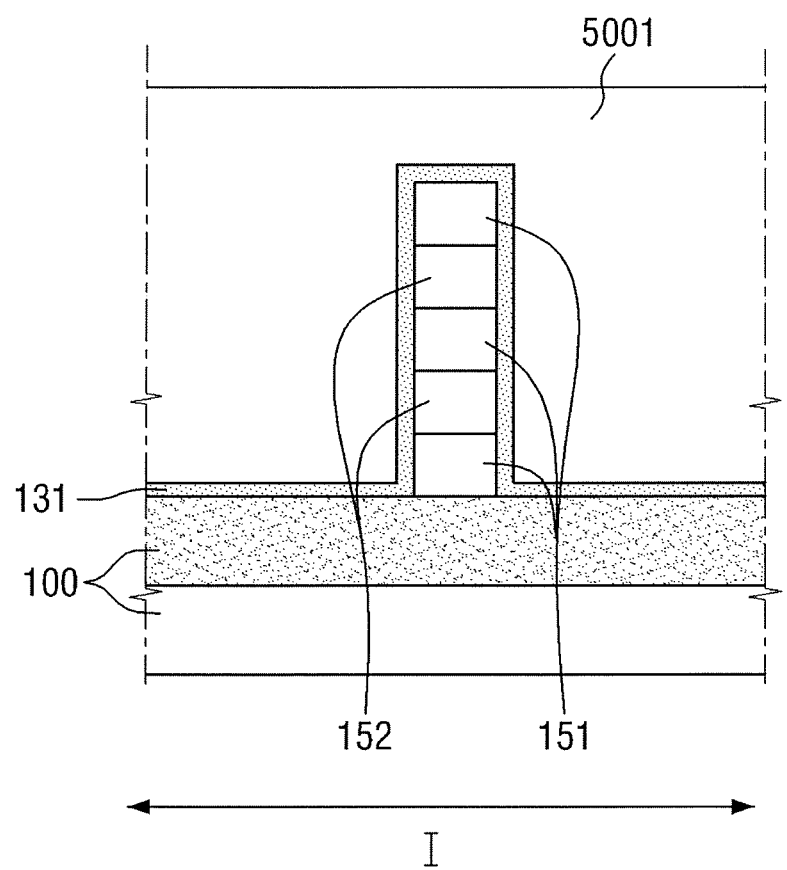
Figures 2, 3B:
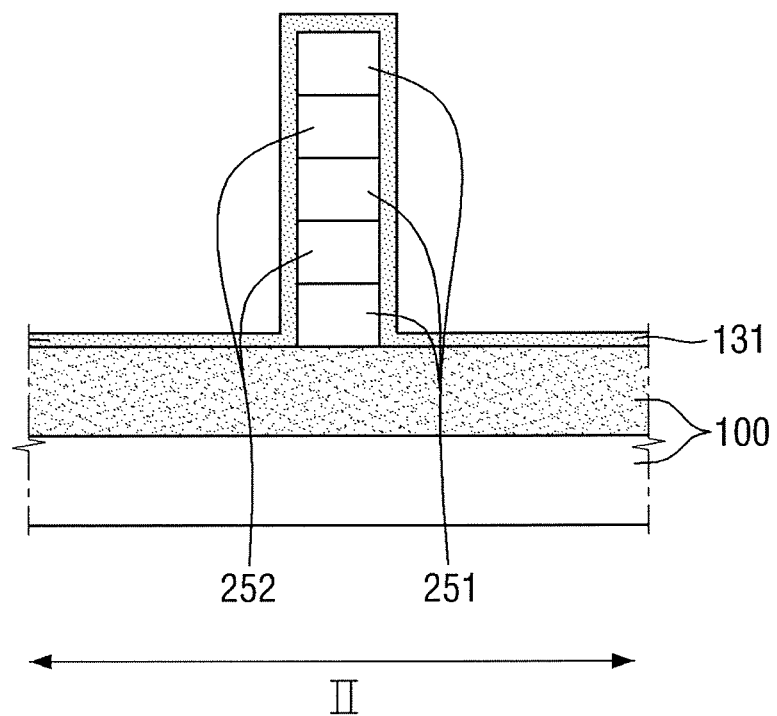
Figures 1, 3C:
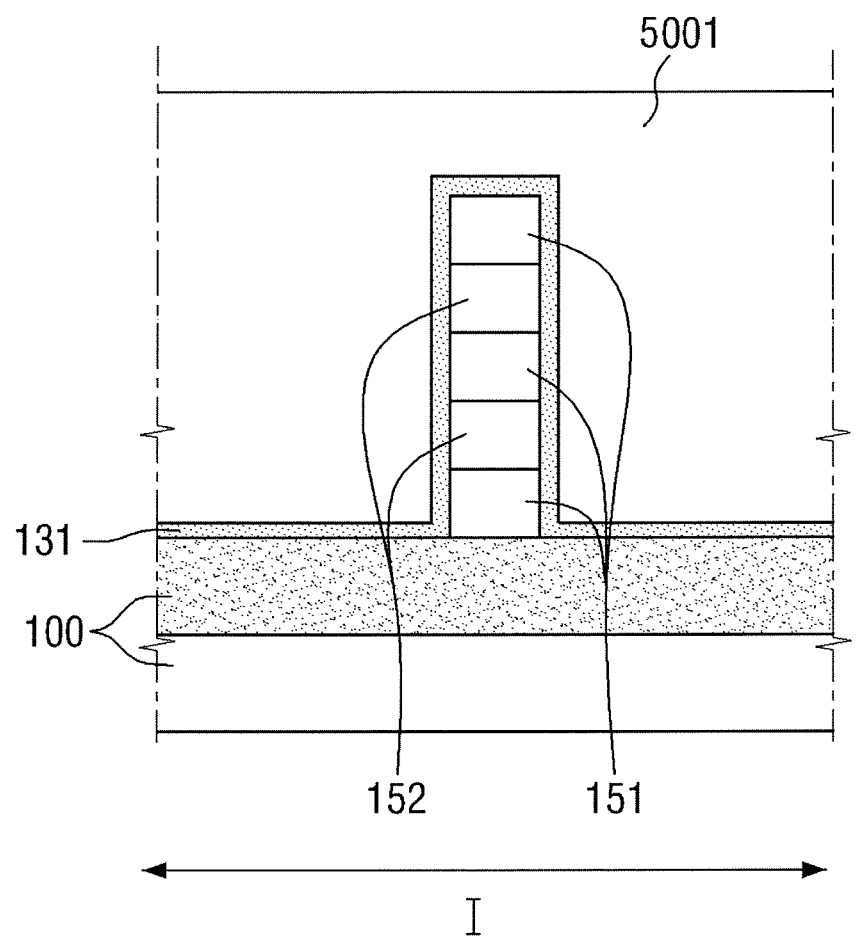
Figures 2, 3C:
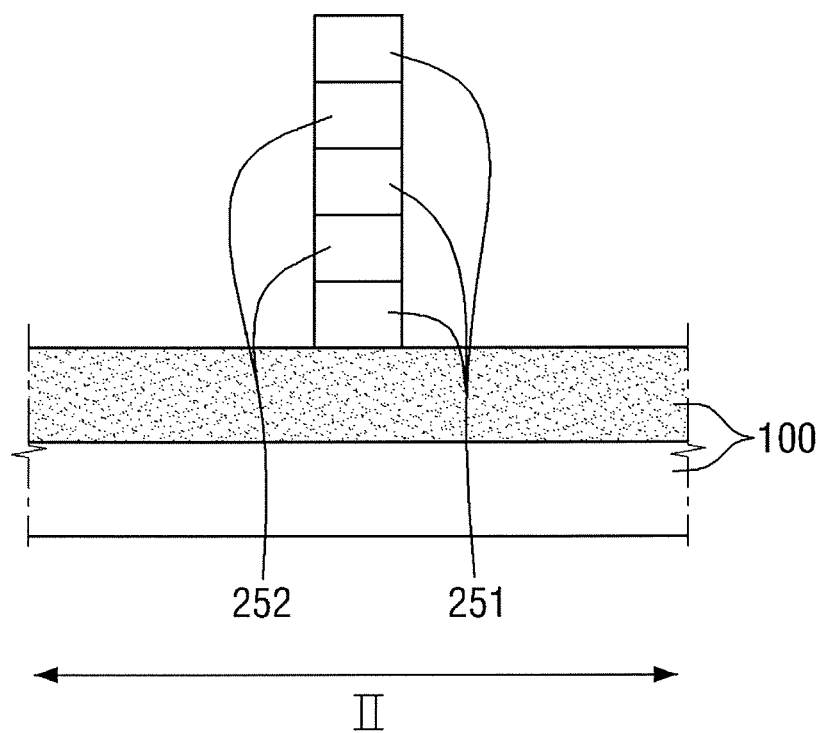
Figures 1, 3D:
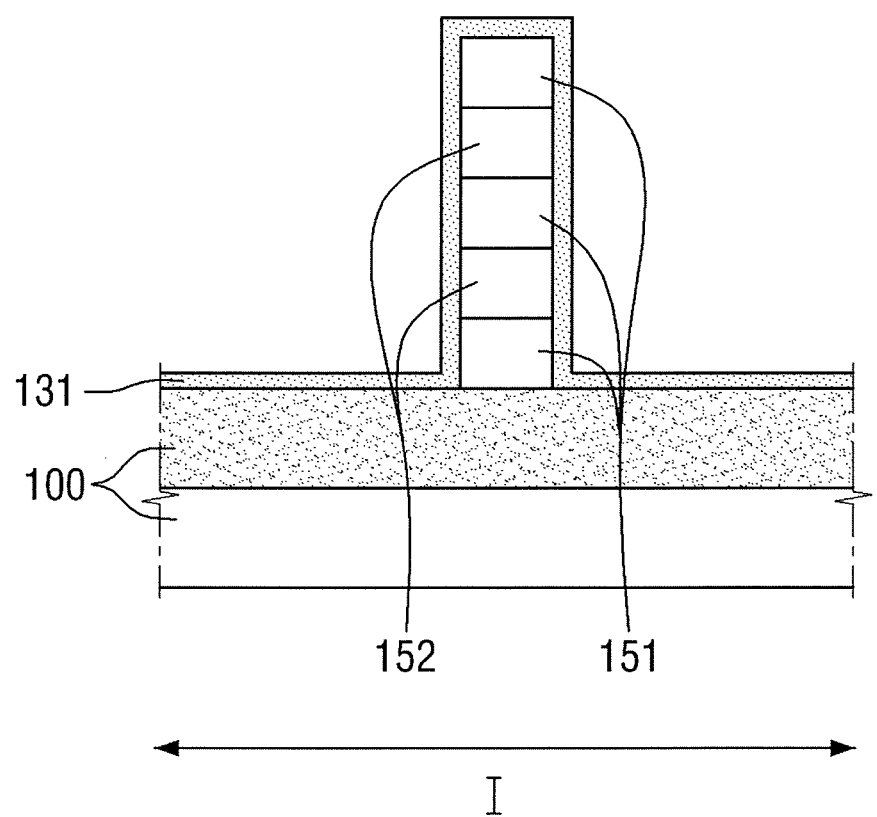
Figures 2, 3D:
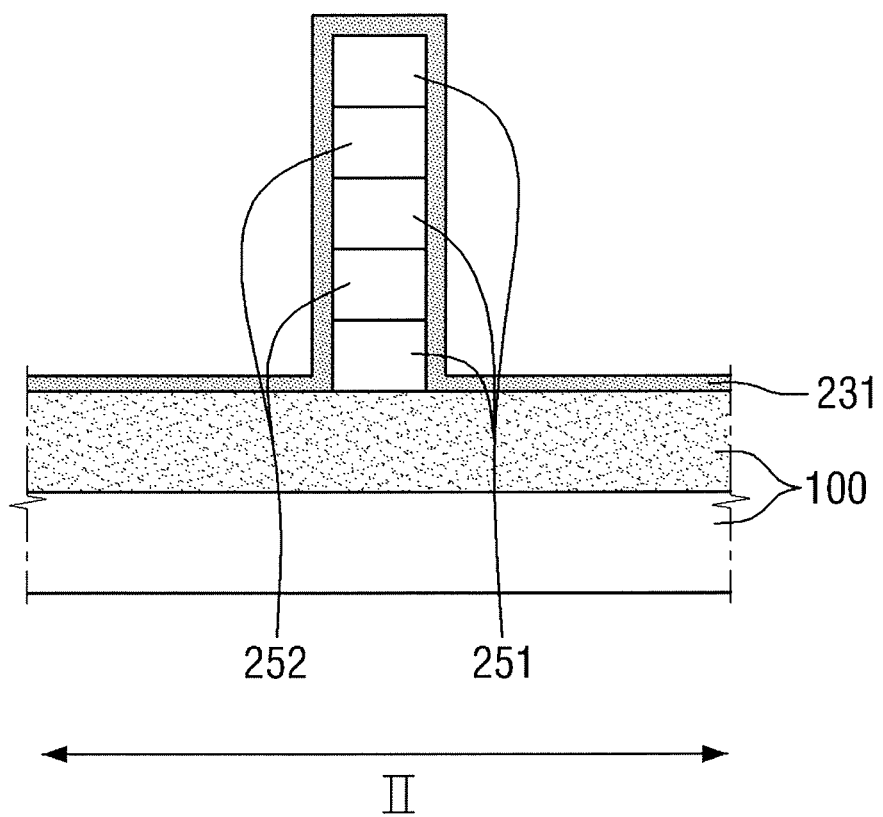
Figures 1, 3E:
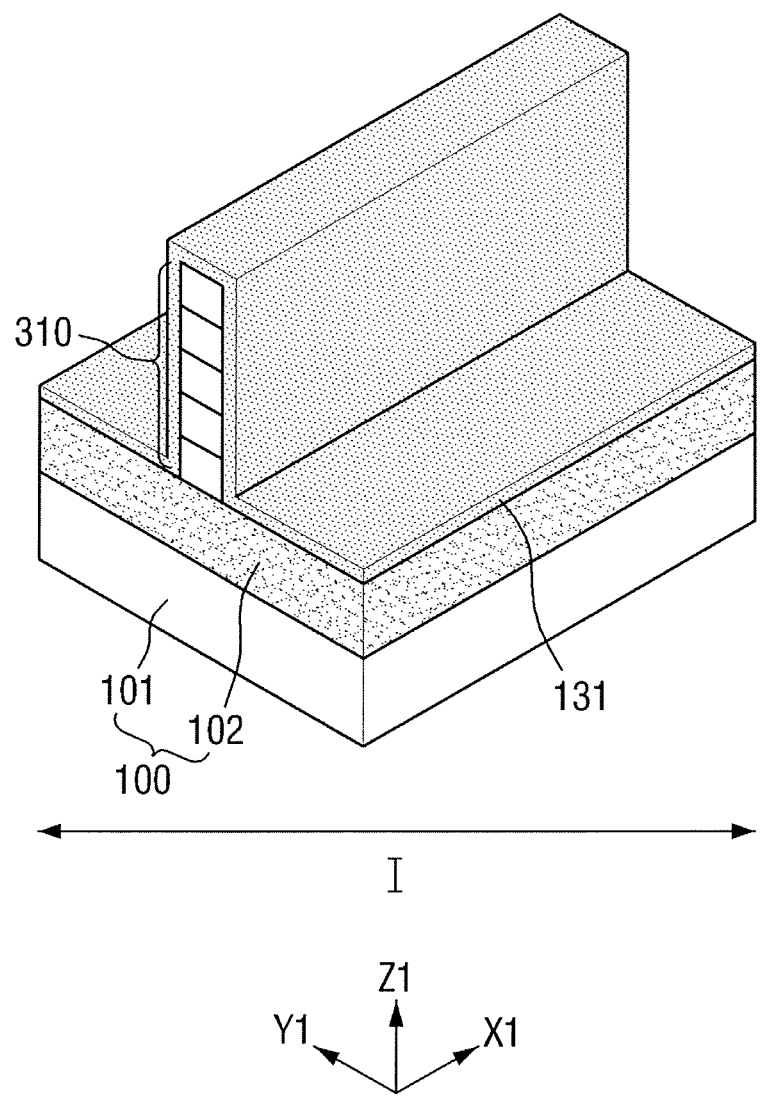
Figures 2, 3E:
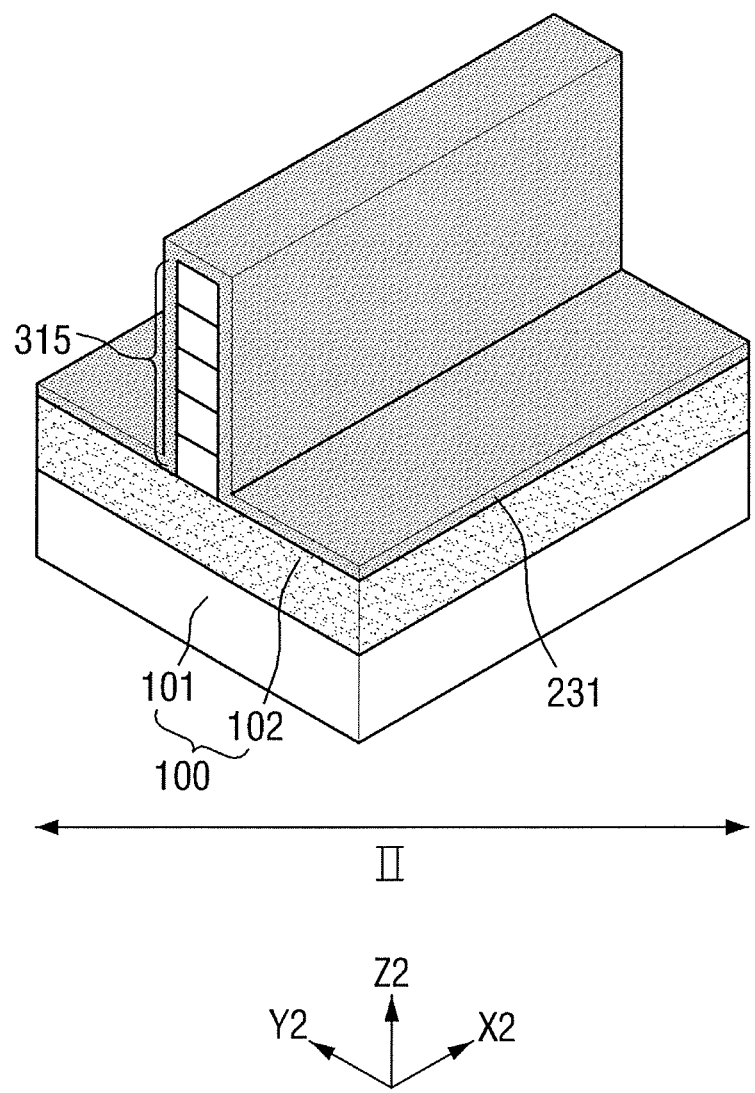

Intermediate process steps for forming the first capping layer 131 and the second capping layer 231 will be described with reference to FIGS. 3A-1 to 3E-2. FIGS. 3A-1 to 3D-2 are cross-sectional views taken along the line Y-Y of FIGS. 2A-2B. FIGS. 3E-1 and 3E-2 are perspective views taken in the same direction as in FIGS. 2A-2B.

Referring to FIGS. 3A-1 and 3A-2, the first capping layer 131 covering the first fin-type structure 310 and the second fin-type structure 315 may be formed on the first region I and the second region II of the substrate 100. The first capping layer 131 may be conformally formed on the substrate 100. For example, the first capping layer 131 may be formed on the substrate 100 such that the first capping layer 131 conforms to the shape of the surface(s) on which it is formed. The first capping layer 131 may include an insulating material, such as silicon oxide. However, example embodiments of the present disclosure are not limited thereto.

The first capping layer 131 may be formed, for example, by chemical vapor deposition (CVD), physical vapor deposition (PVD) or atomic layer deposition (ALD). However, example embodiments of the present disclosure are not limited thereto.

Referring to FIGS. 3B-1 to 3C-2, a first mask layer 5001 covering the first fin-type structure 310 may be formed on the first region I, and an etching process may be performed using the first mask layer 5001 to remove the first capping layer 131 from the second region II while leaving the first capping layer 131 on the first region I. The first mask layer 5001 may include, for example, at least one of silicon oxide, silicon nitride, silicon oxynitride, a metal, photoresist, spin on glass (SOG) and/or spin on hard mask (SOH). However, example embodiments of the present disclosure are not limited thereto. Therefore, the first mask layer 5001 may include a material having etching selectivity with respect to the first capping layer 131. The first mask layer 5001 may be formed, for example, by at least one of chemical vapor deposition (CVD), physical vapor deposition (PVD), atomic layer deposition (ALD) and spin coating.

Next, referring to FIGS. 3D-1 to 3E-2, once the first capping layer has been removed from the second region II, a second capping layer 231 covering the second fin-type structure 315 may be formed on the substrate 100 in the second region II. The second capping layer 231 may be conformally formed on the substrate 100. For example, the second capping layer 231 may be formed on the substrate 100 such that the second capping layer 231 conforms to the shape of the surface(s) on which it is formed. The second capping layer 231 may include a semiconductor material such as, for example, one of SiGe and Ge. However, example embodiments of the present disclosure are not limited thereto. The second capping layer 231 and the fourth semiconductor pattern 252 may be formed of the same semiconductor material. However, example embodiments of the present disclosure are not limited thereto.

Referring again to FIGS. 3E-1 and 3E-2, the first capping layer 131 covering the first fin-type structure 310 may be formed on the first region I of the substrate 100. In addition, the second capping layer 231 covering the second fin-type structure 315 may be formed on the second region II of the substrate 100. The second capping layer 231 may be formed on the second fin-type structure 315 by, for example, epitaxial growth. However, example embodiments of the present disclosure are not limited thereto. Thus, the second capping layer 231 may be formed by, for example, chemical vapor deposition (CVD), physical vapor deposition (PVD) or atomic layer deposition (ALD).

A manner of forming the first capping layer 131 and the second capping layer 231 on the substrate 100 has been described with reference to FIGS. 3A-1 to 3E-2. However, according to example embodiments, the formation of the first capping layer 131 and the second capping layer 231 on the substrate 100 is not limited to the manner disclosed herein. That is, example embodiments may utilize a variety of methods to form the first capping layer 131 and the second capping layer 231 in the first region I and the second region II of the substrate 100, respectively.

Figure 4A:
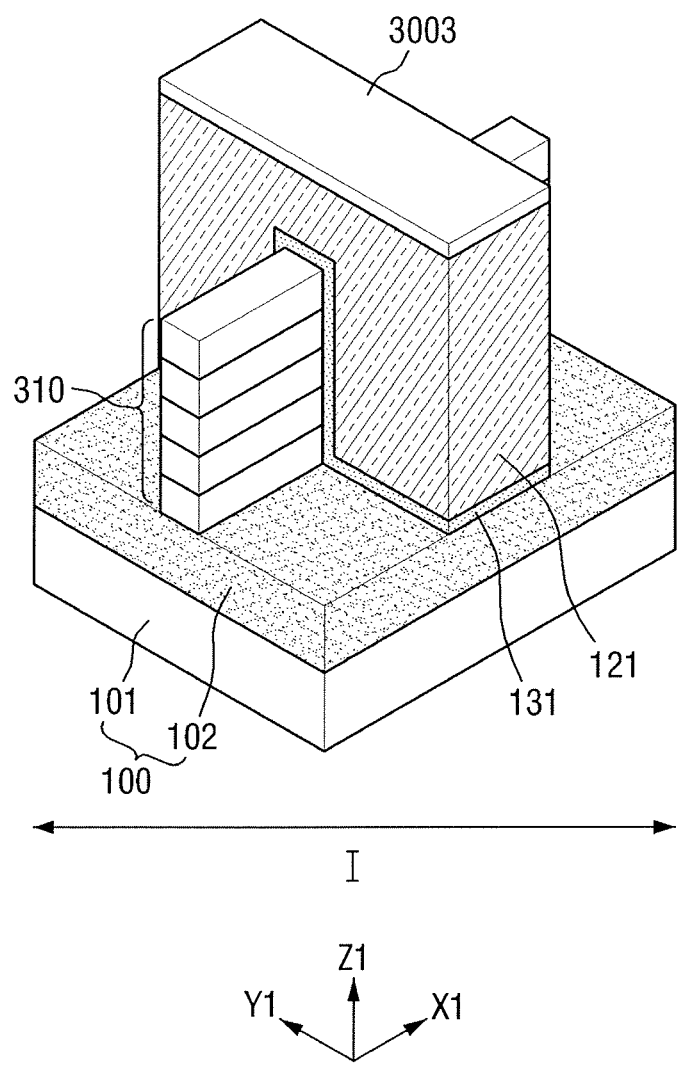
Figure 4B:
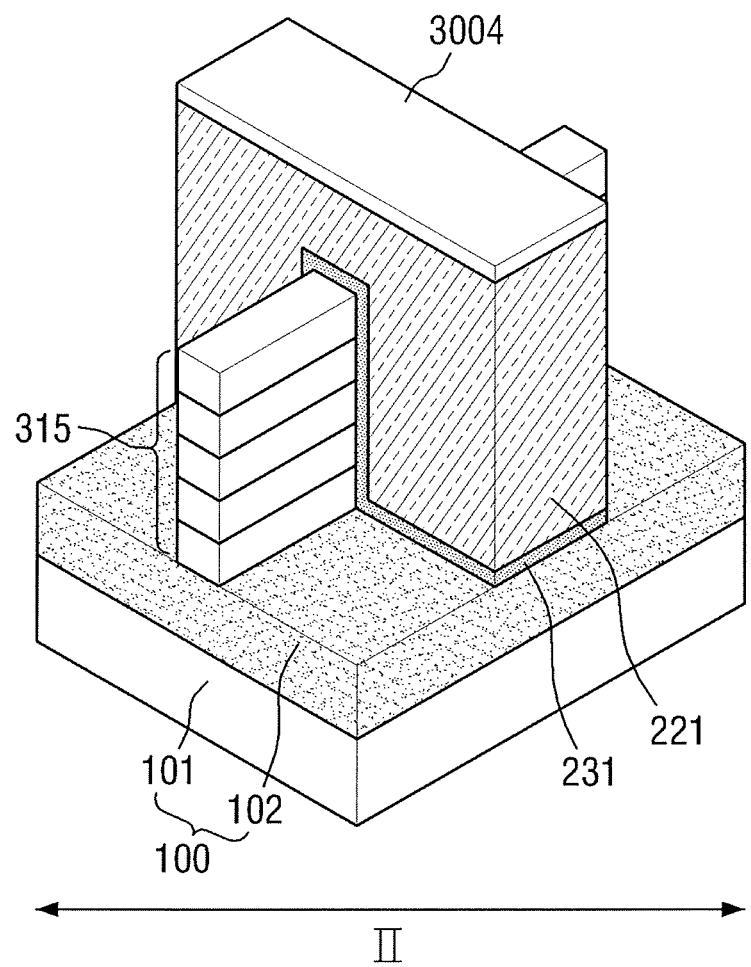

Referring to FIGS. 4A-4B, an etching process may be performed using a third mask pattern 3003, thereby forming the first capping layer 131 and a first dummy gate electrode 121 crossing the first fin-type structure 310 and extending in a second direction Y1.

In addition, an etching process may be performed using a fourth mask pattern 3004, thereby forming the second capping layer 231 and a second dummy gate electrode 221 crossing the second fin-type structure 315 and extending in a fourth direction Y2.

Accordingly, the first dummy gate electrode 121 may be formed on the first fin-type structure 310 and the second dummy gate electrode 221 may be formed on the second fin-type structure 315.

In an example embodiment, the first capping layer 131 is a silicon oxide layer and the second capping layer 231 includes a semiconductor material including one of SiGe and Ge, and each of the first dummy gate electrode 121 and the second dummy gate electrode 221 includes polysilicon or an amorphous silicon. However, example embodiments of the present disclosure are not limited thereto.

Figure 5A:
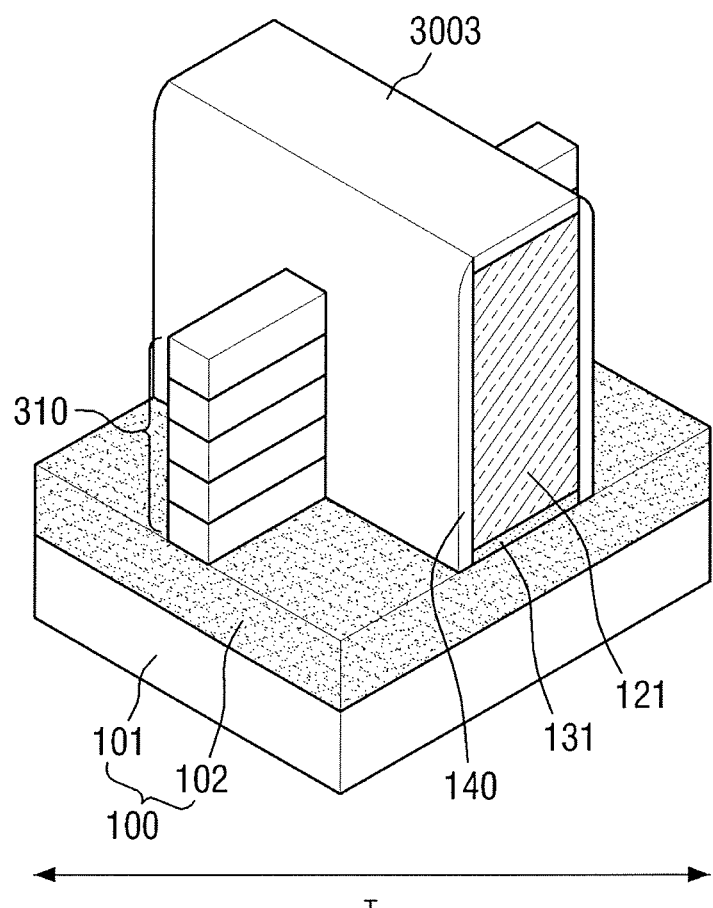
Figure 5B:
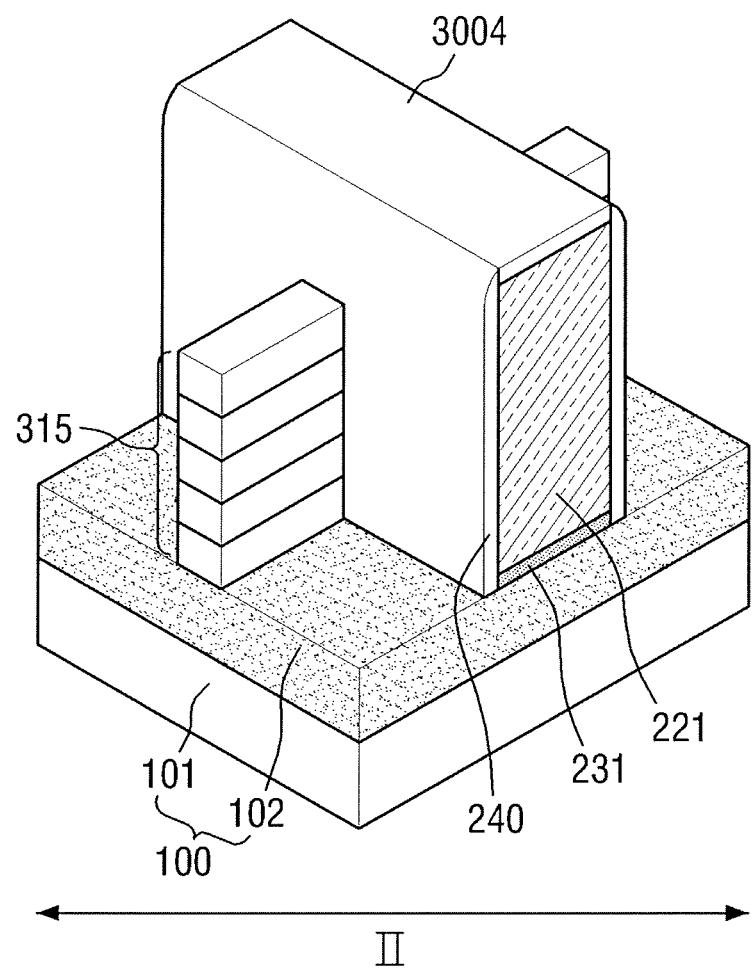

Referring to FIGS. 5A-5B, a first gate spacer 140 is formed on sidewalls of the first dummy gate electrode 121. In addition, a second gate spacer 240 is formed on sidewalls of the second dummy gate electrode 221.

Referring to the formation of the first gate spacer 140 and the second gate spacer 240, in an example embodiment, a spacer layer covering the first dummy gate electrode 121, the second dummy gate electrode 221, the first fin-type structure 310 and the second fin-type structure 315, is formed on the substrate 100. Thereafter, the spacer layer may be etched back, thereby forming the first gate spacer 140 on the sidewalls of the first dummy gate electrode 121 and the second gate spacer 240 on the sidewalls of the second dummy gate electrode 221.

Each of the first gate spacer 140 and the second gate spacer 240 may include, for example, at least one of silicon nitride (SiN), silicon oxynitride (SiON), silicon oxide ($SiO_2$), silicon oxycarbonitride (SiOCN) and combinations thereof. Each of the first gate spacer 140 and the second gate spacer 240 may be formed of a single layer. However, example embodiments of the present disclosure are not limited thereto. For example, according to example embodiments, each of the first gate spacer 140 and the second gate spacer 240 may have a multi-layered structure.

Figure 6A:
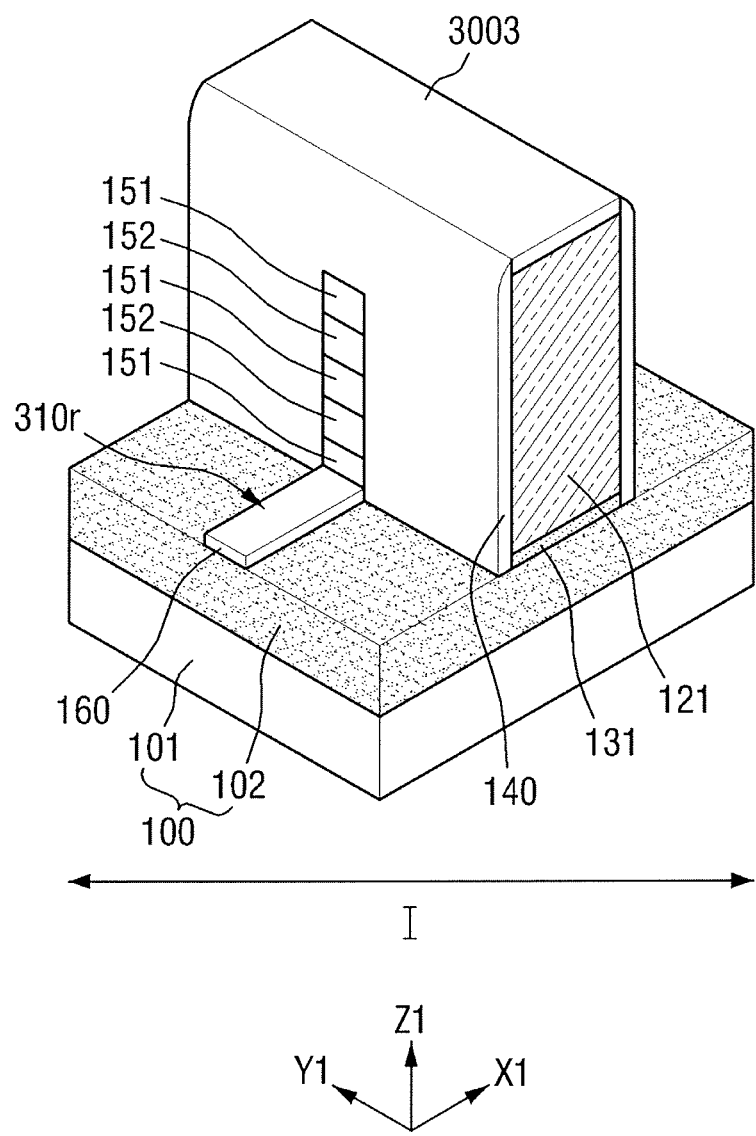
Figure 6B:
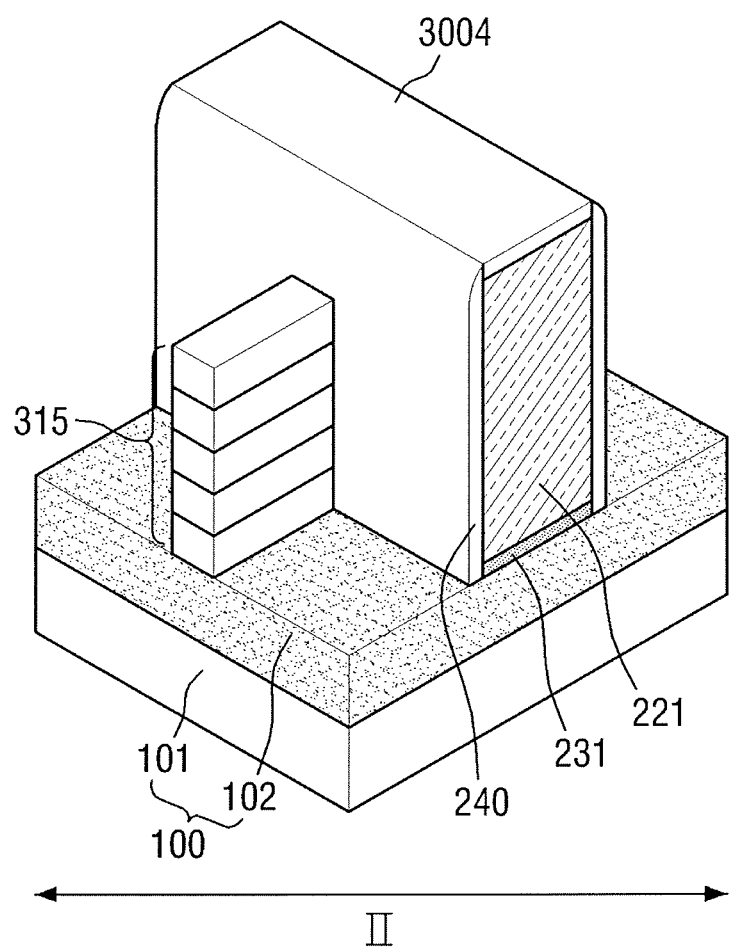

Referring to FIGS. 6A-6B, the first dummy gate electrode 121 and the first fin-type structure 310 exposed to opposite sides of the first gate spacer 140 are removed, thereby forming a first recess 310r in the first fin-type structure 310 on opposite sides of the first dummy gate electrode 121.

While the first recess 310r is formed, a portion of the first semiconductor pattern 151 that is in contact with the substrate 100 remains, thereby forming the first epitaxial seed layer 160. However, example embodiments of the present disclosure are not limited thereto. For example, according to example embodiments, the first semiconductor pattern 151 that is in contact with the substrate 100 is also removed, thereby exposing the top surface of the substrate 100.

The first semiconductor pattern 151 and the second semiconductor pattern 152 alternately stacked on the substrate 100 are exposed through lateral surfaces of the first recess 310r.

When the first recess 310r is formed in the first fin-type structure 310, the second region II may be covered using a photoresist pattern. However, example embodiments of the present disclosure are not limited thereto.

Figure 7A:
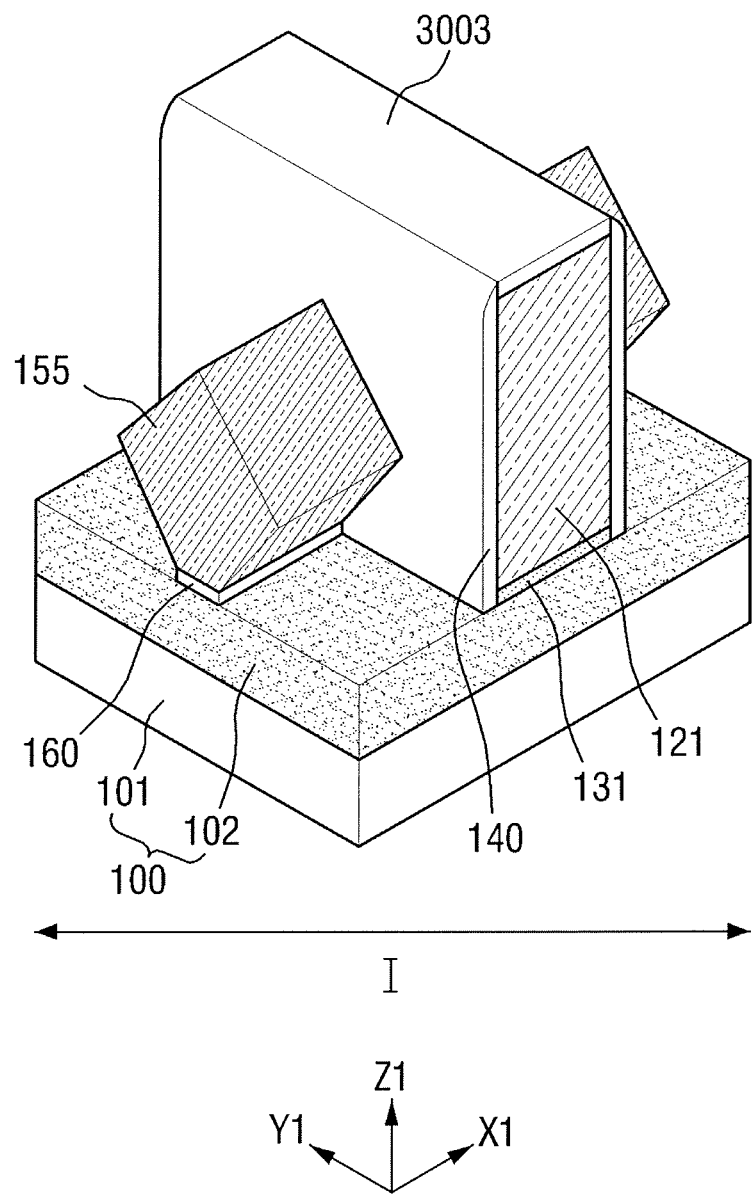
Figure 7B:
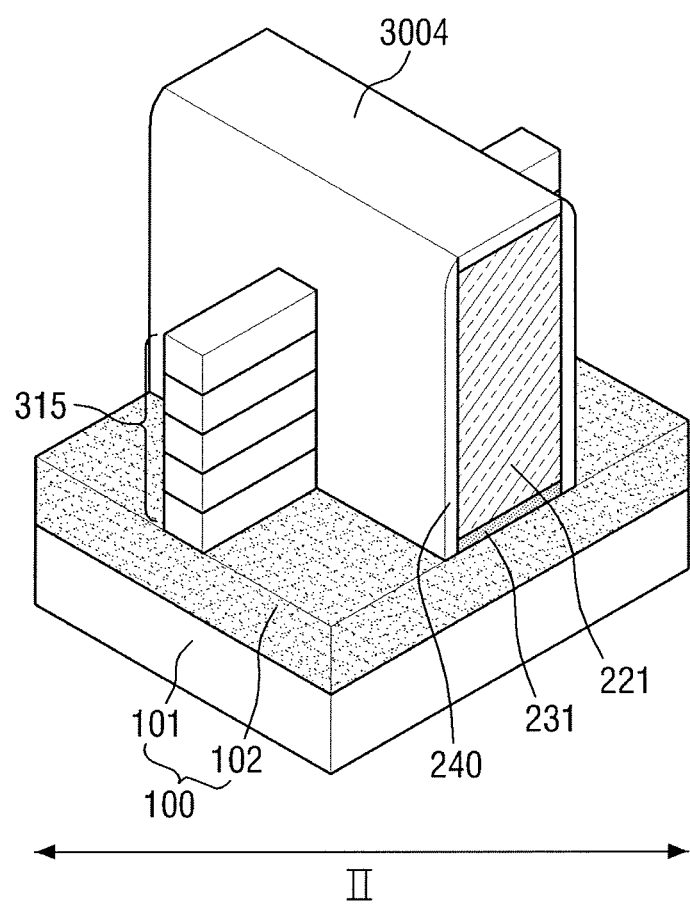

Referring to FIGS. 7A and 7B, a first epitaxial layer 155 filling the first recess 310r is formed on the first fin-type structure 310. The first epitaxial layer 155 functions as a first source/drain, and is formed on opposite sides of the first dummy gate electrode 121. Herein, the first epitaxial layer 155 may be referred to as the first source/drain 155.

The first epitaxial layer 155 may be formed by epitaxial growth. The first epitaxial layer 155 may be grown using the first epitaxial seed layer 160 and the first semiconductor pattern 151 and the second semiconductor pattern 152 exposed through the lateral surfaces of the first recess 310r as seed layers. In example embodiments, the first epitaxial seed layer 160 is not provided, and the first epitaxial layer 155 may be grown using the first semiconductor pattern 151 and the second semiconductor pattern 152 exposed through the lateral surfaces of the first recess 310r as seed layers.

The first epitaxial layer 155 may have an outer circumferential surface having various shapes. For example, the shape of the outer circumferential surface of the first epitaxial layer 155 may be at least one of a diamond, a circle and a rectangle.

In FIGS. 7A and 7B, a diamond shape (also referred to as a pentagonal or hexagonal shape) is illustrated by way of example. However, example embodiments of the present disclosure are not limited thereto.

In an example embodiment, the first epitaxial layer 155 may include a material capable of applying compressive stress to the second semiconductor pattern 152 to be used as a channel region of a p-channel metal-oxide-semiconductor field effect transistors (p-type MOSFET) in a subsequent process. The first epitaxial layer 155 may include a material having a larger lattice constant than the second semiconductor pattern 152. In an example embodiment, when the second semiconductor pattern 152 includes SiGe, the first epitaxial layer 155 includes SiGe having a higher content of Ge than the second semiconductor pattern 152.

Figure 8A:
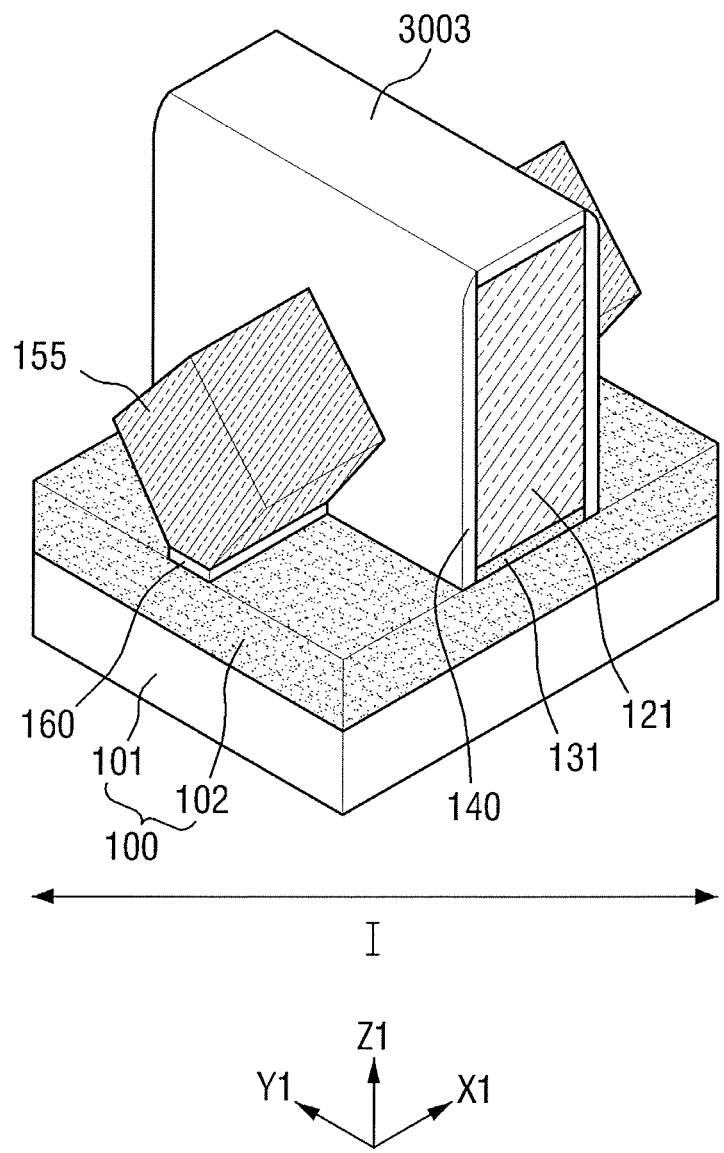
Figure 8B:
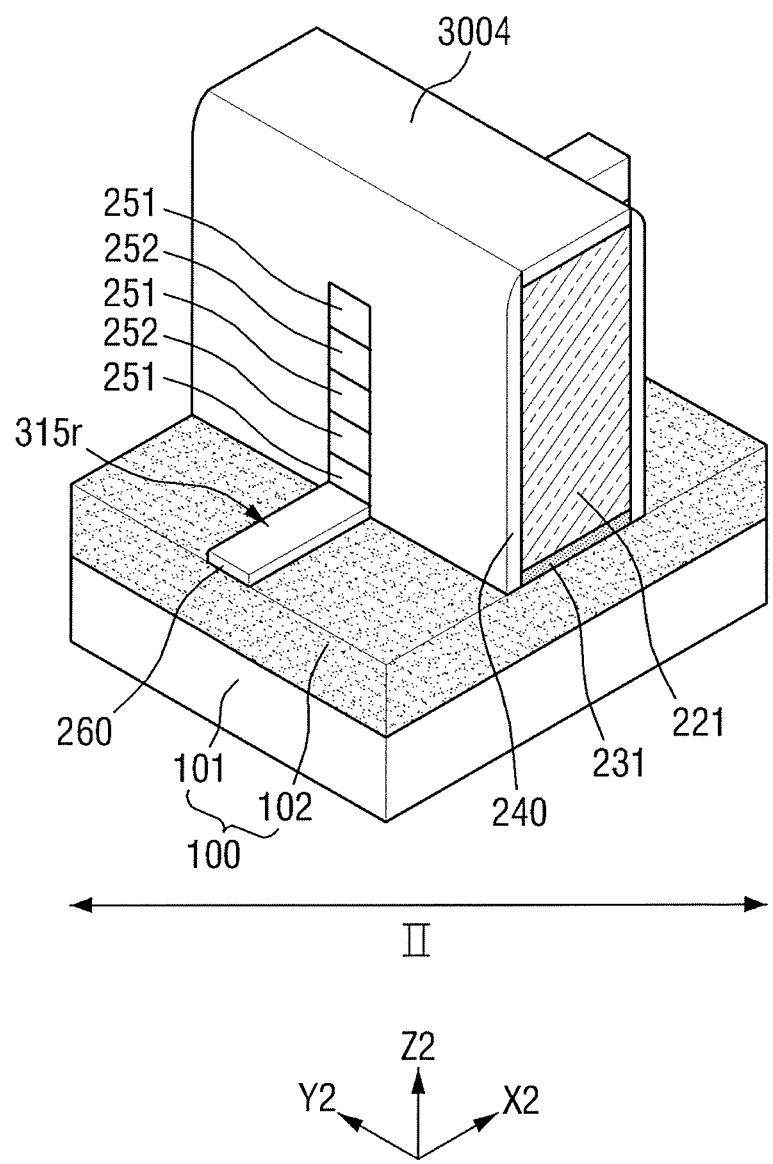

Referring to FIGS. 8A and 8B, the second dummy gate electrode 221 and the second fin-type structure 315 exposed to opposite sides of the second gate spacer 240 are removed, thereby forming a second recess 315r in the second fin-type structure 315 on opposite sides of the second dummy gate electrode 221.

While the second recess 315r is formed, a portion of the third semiconductor pattern 251 that is in contact with the substrate 100 remains, thereby forming a second epitaxial seed layer 260. However, example embodiments of the present disclosure are not limited thereto. For example, according to example embodiments, the third semiconductor pattern 251 that is in contact with the substrate 100 is also removed, thereby exposing the top surface of the substrate 100.

The third semiconductor pattern 251 and the fourth semiconductor pattern 252 alternately stacked on the substrate 100 are exposed through lateral surfaces of the second recess 315r.

When the second recess 315r is formed in the second fin-type structure 315, the first region I may be covered using a photoresist pattern. However, example embodiments of the present disclosure are not limited thereto.

Figure 9A:
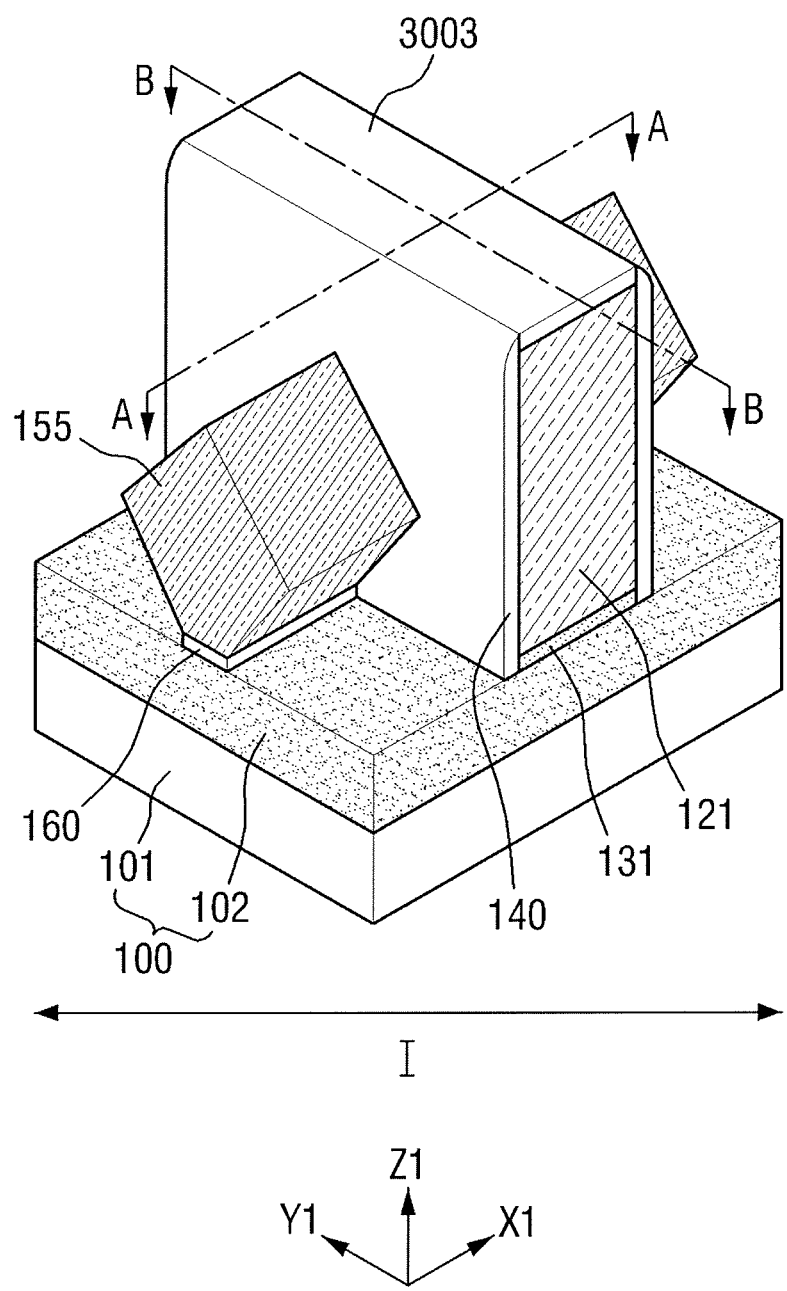
Figure 9B:
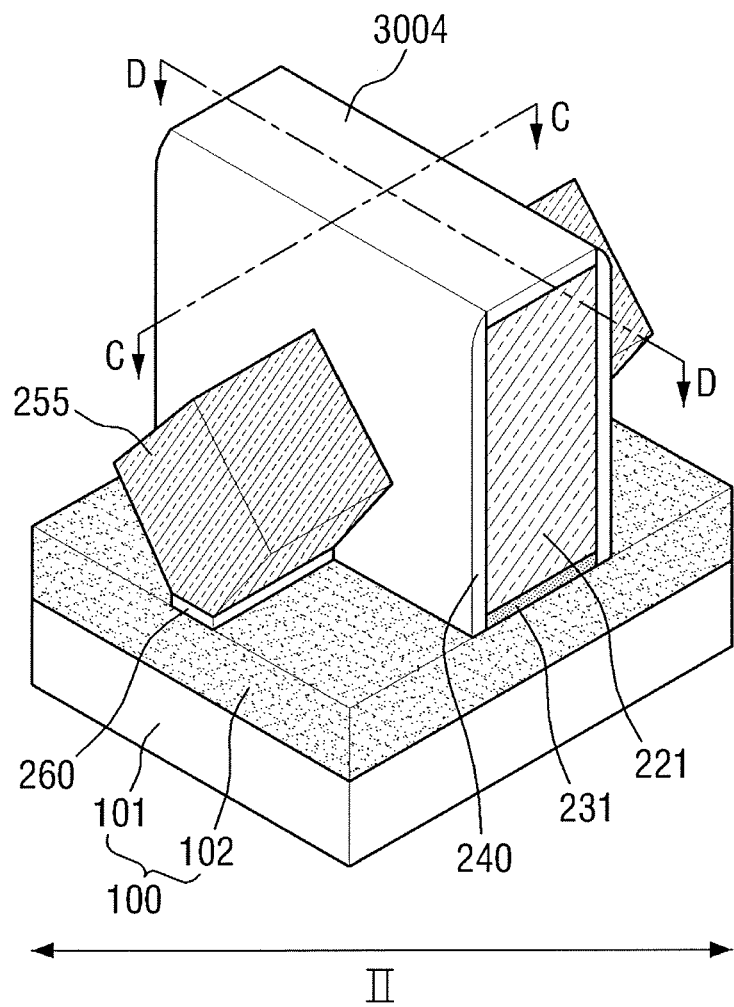
Figures 1, 10A:
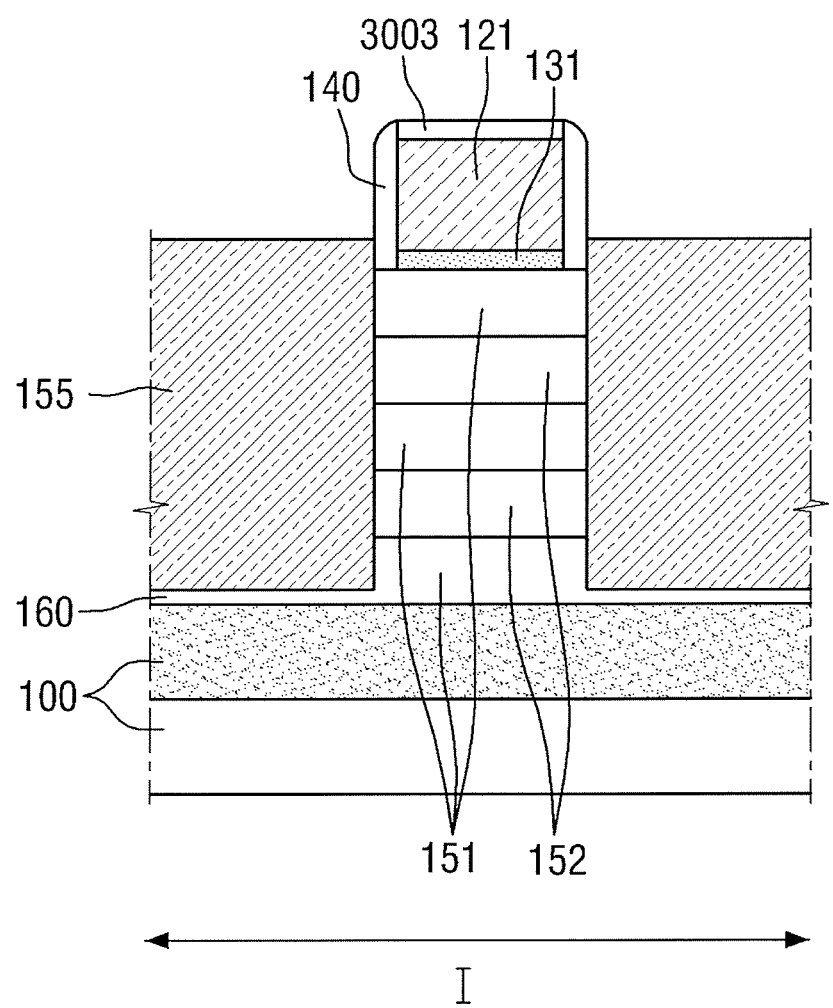
Figures 2, 10A:
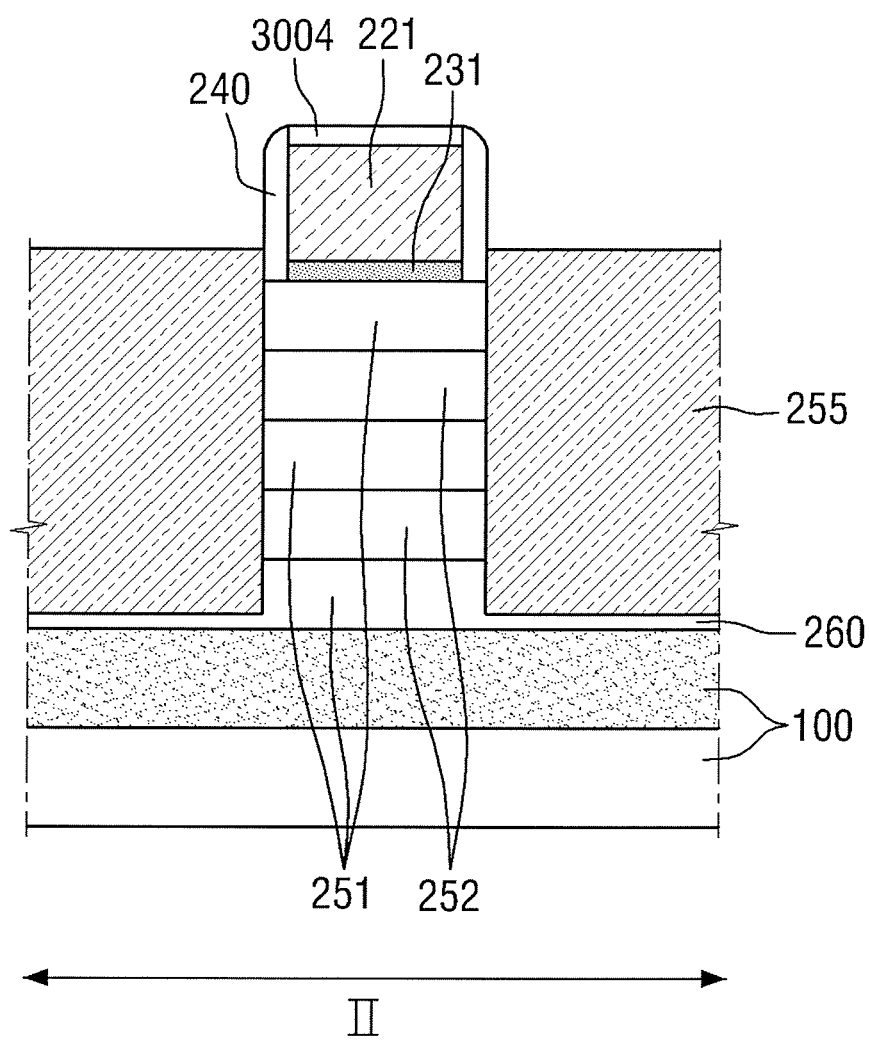
Figures 1, 10B:
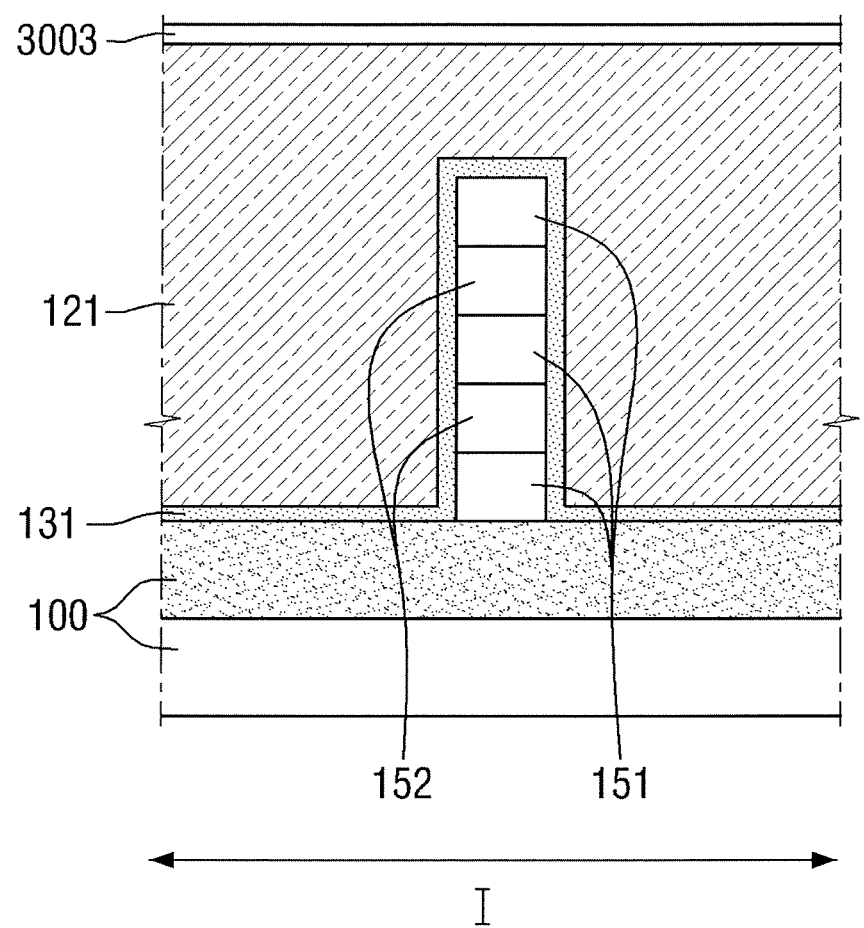
Figures 2, 10B:
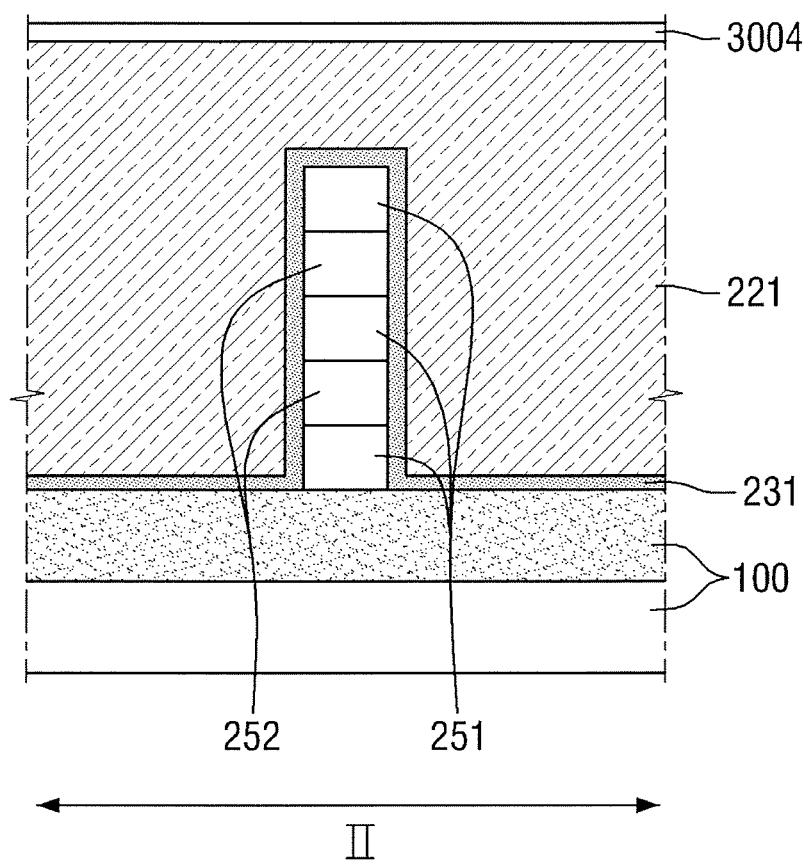

FIGS. 10A-1 and 10A-2 are cross-sectional views taken along lines A-A and C-C in FIGS. 9A and 9B, and FIGS. 10B-1 and 10B-2 are cross-sectional views taken along lines B-B and D-D in FIGS. 9A and 9B.

Referring to FIGS. 9A-9B and 10A-1 to 10B-2, a second epitaxial layer 255 filling the second recess 315r is formed on the second fin-type structure 315. The second epitaxial layer 255 functions as a second source/drain, and is formed at opposite sides of the second dummy gate electrode 221. Herein, the second epitaxial layer 255 may be referred to as the second source/drain 255.

The second epitaxial layer 255 may be formed by epitaxial growth. The second epitaxial layer 255 may be grown using the second epitaxial seed layer 260 and the third semiconductor pattern 251 and the fourth semiconductor pattern 252 exposed through the lateral surfaces of the second recess 315r as seed layers. In example embodiments, the second epitaxial seed layer 260 is not provided, and the second epitaxial layer 255 may be grown using the third semiconductor pattern 251 and the fourth semiconductor pattern 252 exposed through the lateral surfaces of the second recess 315r as seed layers.

The second epitaxial layer 255 may have an outer circumferential surface having various shapes. For example, the shape of the outer circumferential surface of the second epitaxial layer 255 may be at least one of a diamond, a circle and a rectangle. In FIGS. 9A and 9B, a diamond shape (also referred to as a pentagonal or hexagonal shape) is illustrated by way of example. However, example embodiments of the present disclosure are not limited thereto.

In an example embodiment, the second epitaxial layer 255 may include a material capable of applying compressive stress to the third semiconductor pattern 251 to be used as a channel region of an n-channel metal-oxide-semiconductor field effect transistors (n-type MOSFET) in a subsequent process, or the same material as the third semiconductor pattern 251. The second epitaxial layer 255 may include a material having a lattice constant less than or equal to the third semiconductor pattern 251. In an example embodiment, when the third semiconductor pattern 251 includes Si, the second epitaxial layer 255 includes Si or a material having a smaller lattice constant than Si (e.g., silicon carbide (SiC)).

In FIGS. 10A-1 to 10B-2, the first epitaxial layer 155 makes contact with the first semiconductor pattern 151 and the second semiconductor pattern 152 positioned under the first dummy gate electrode 121 and the first gate spacer 140. The second epitaxial layer 255 makes contact with the third semiconductor pattern 251 and the fourth semiconductor pattern 252 positioned under the second dummy gate electrode 221 and the second gate spacer 240.

The following description is made with reference to FIGS. 10A-1 to 10B-2.

Figures 1, 11A:
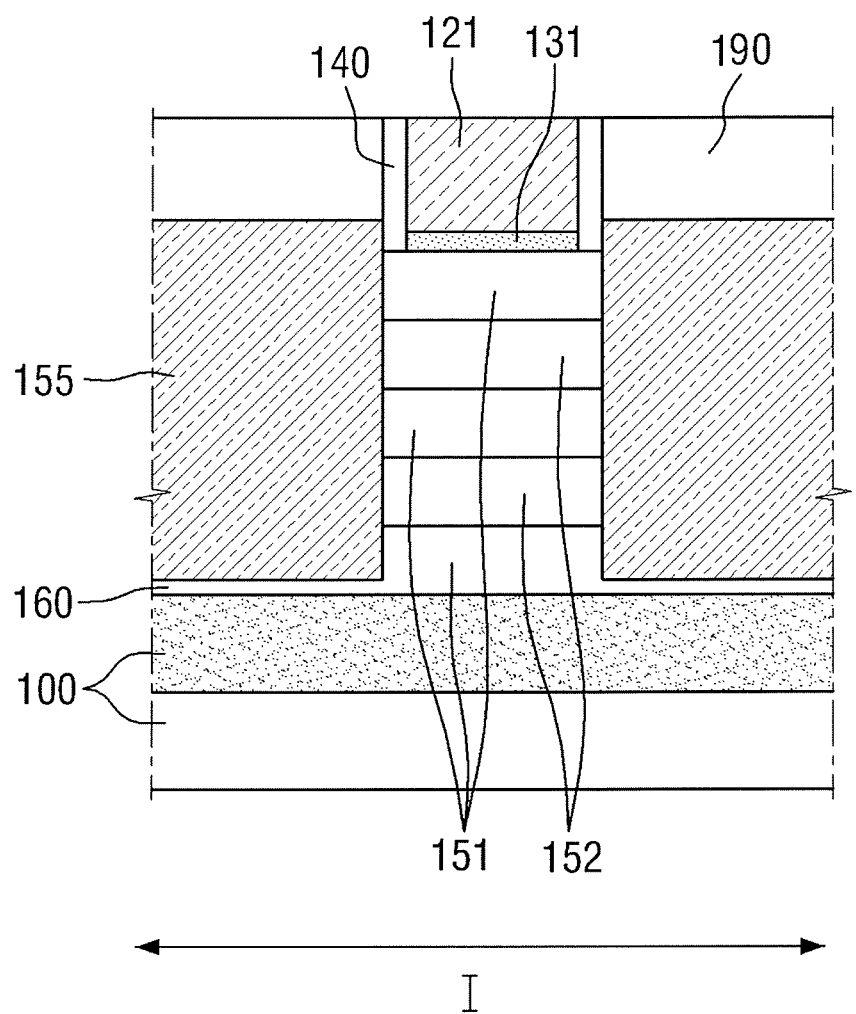
Figures 2, 11A:
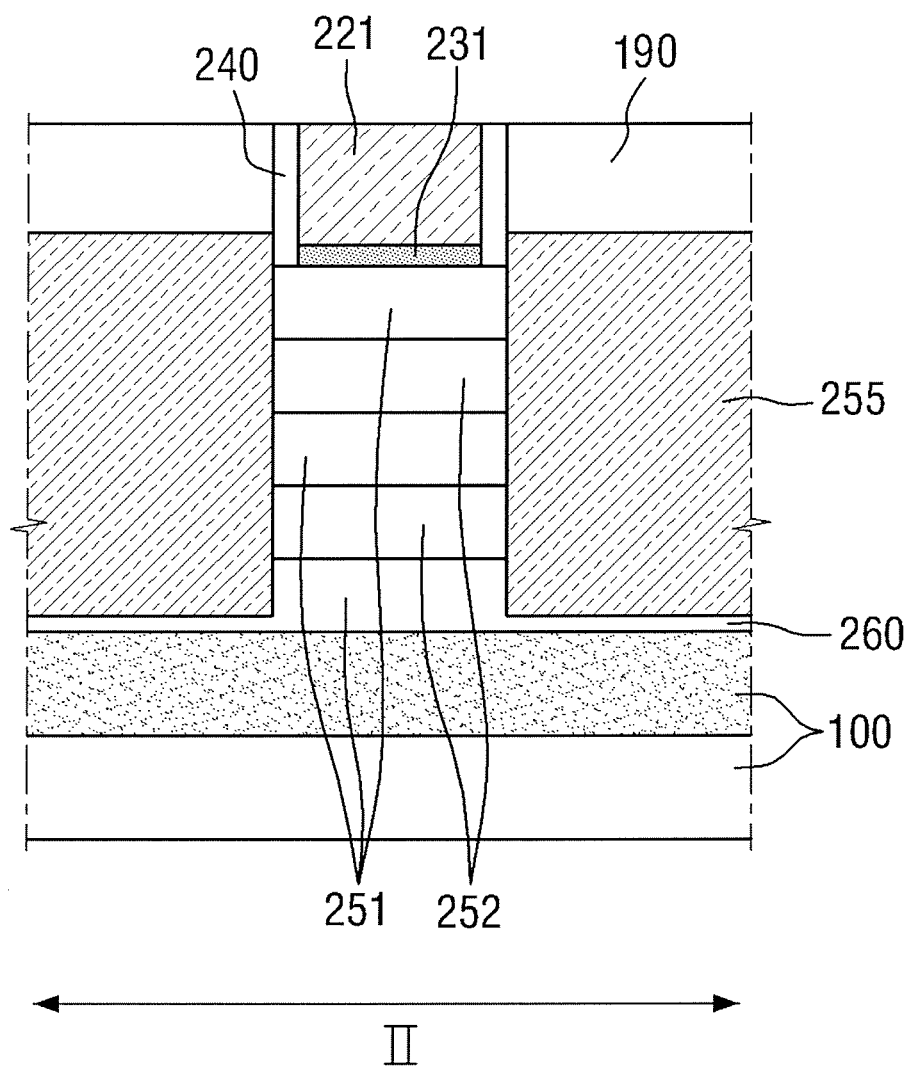
Figures 1, 11B:
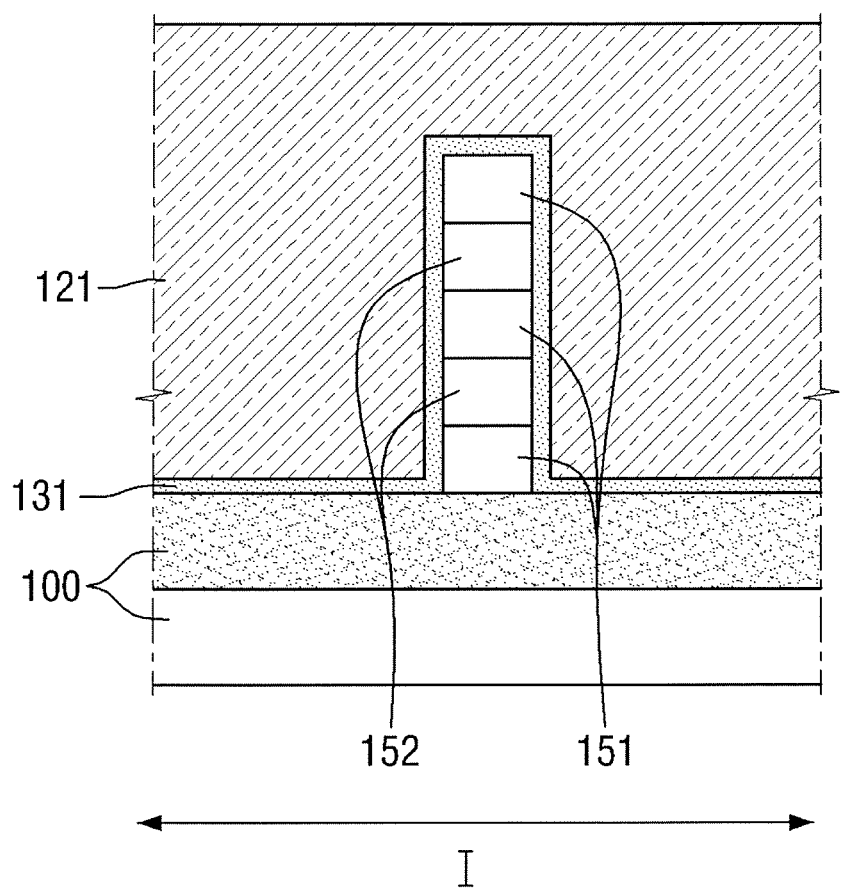
Figures 2, 11B:
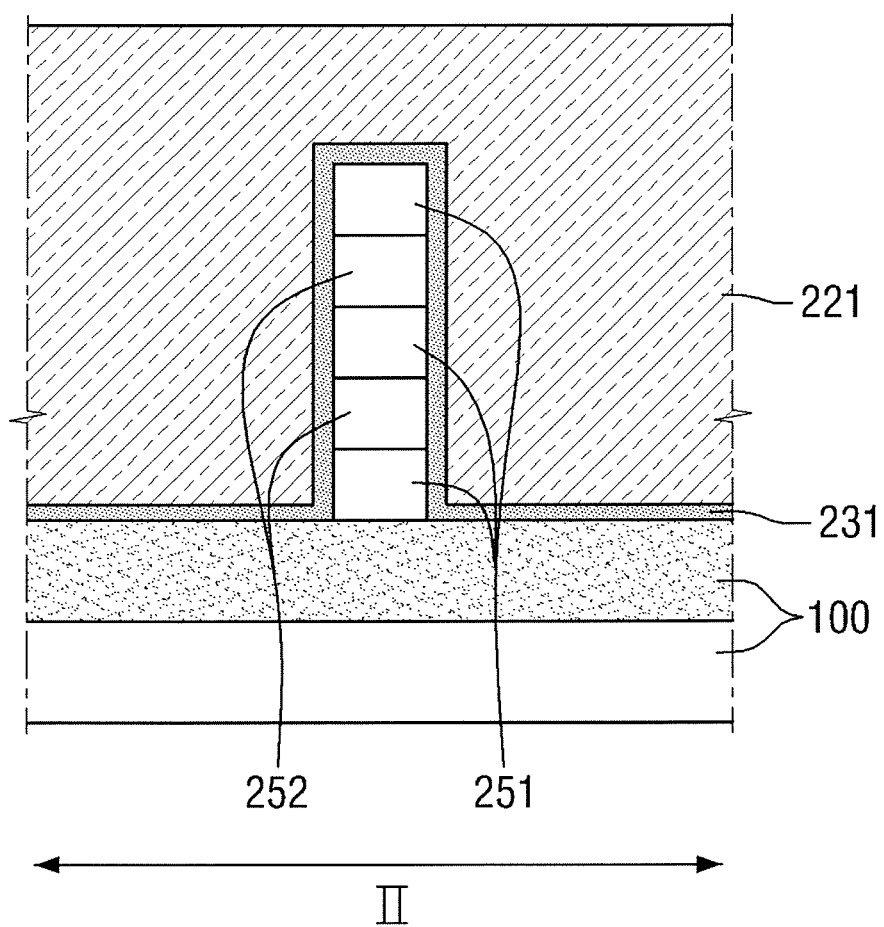
Figures 1, 12A:
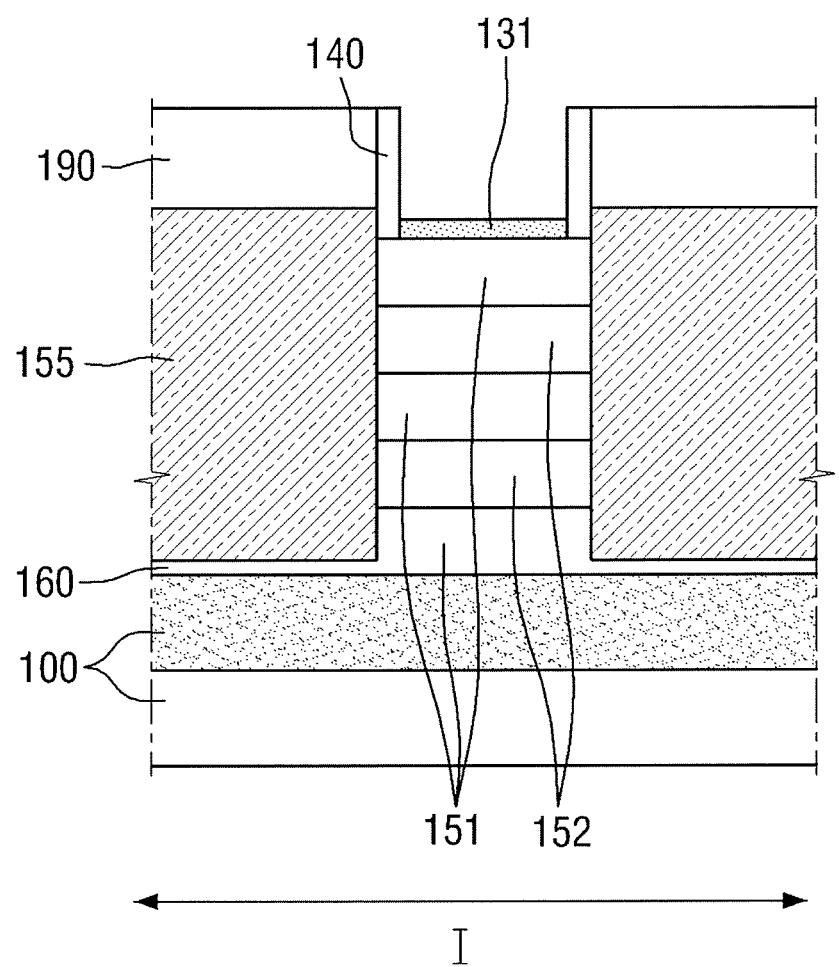
Figures 2, 12A:
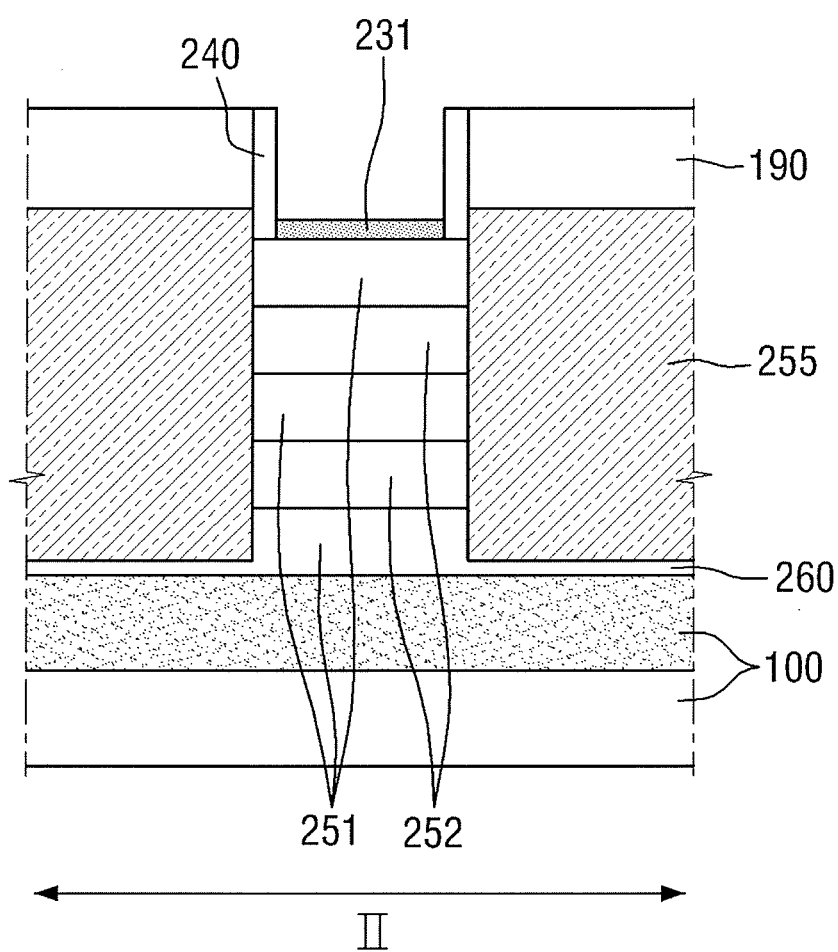
Figures 1, 12B:
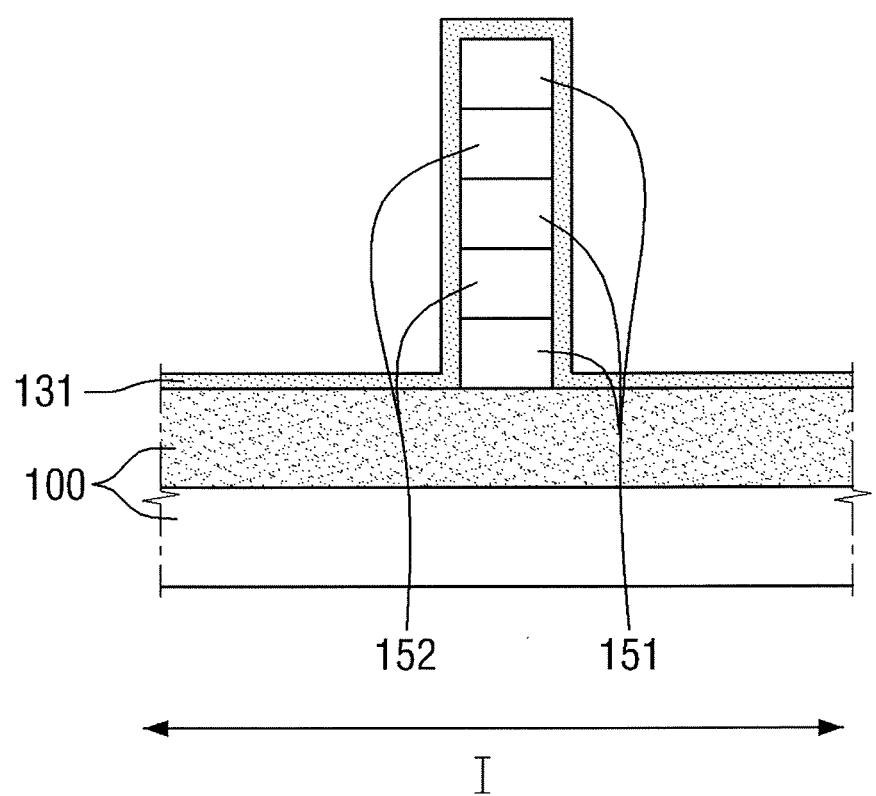
Figures 2, 12B:
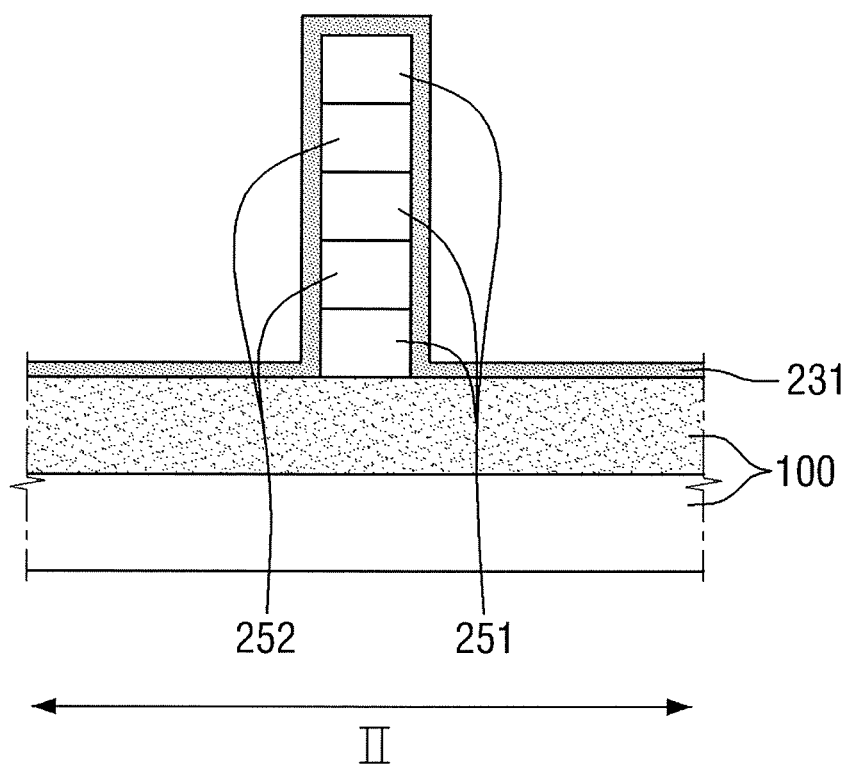
Figures 1, 13A:
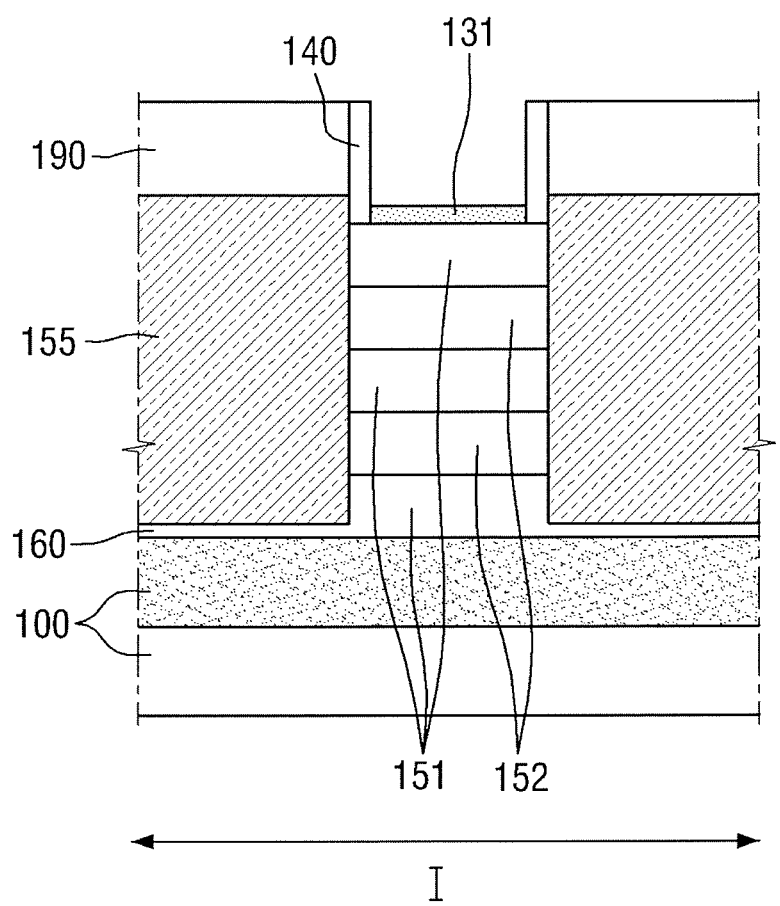
Figures 2, 13A:
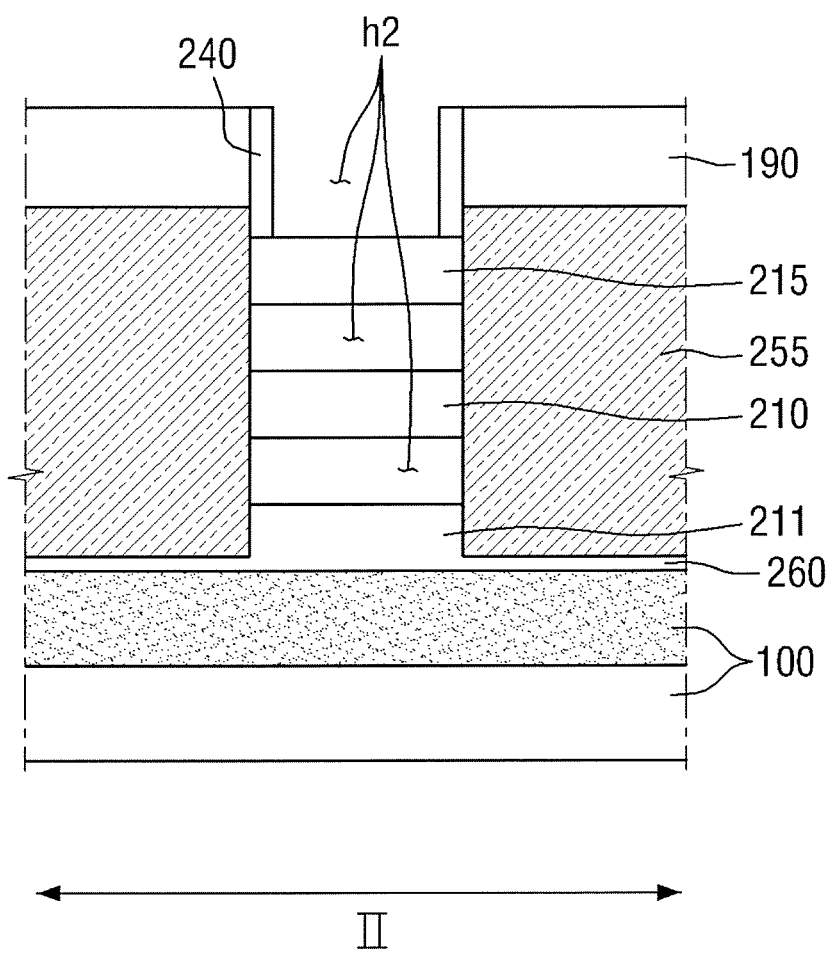
Figures 1, 13B:
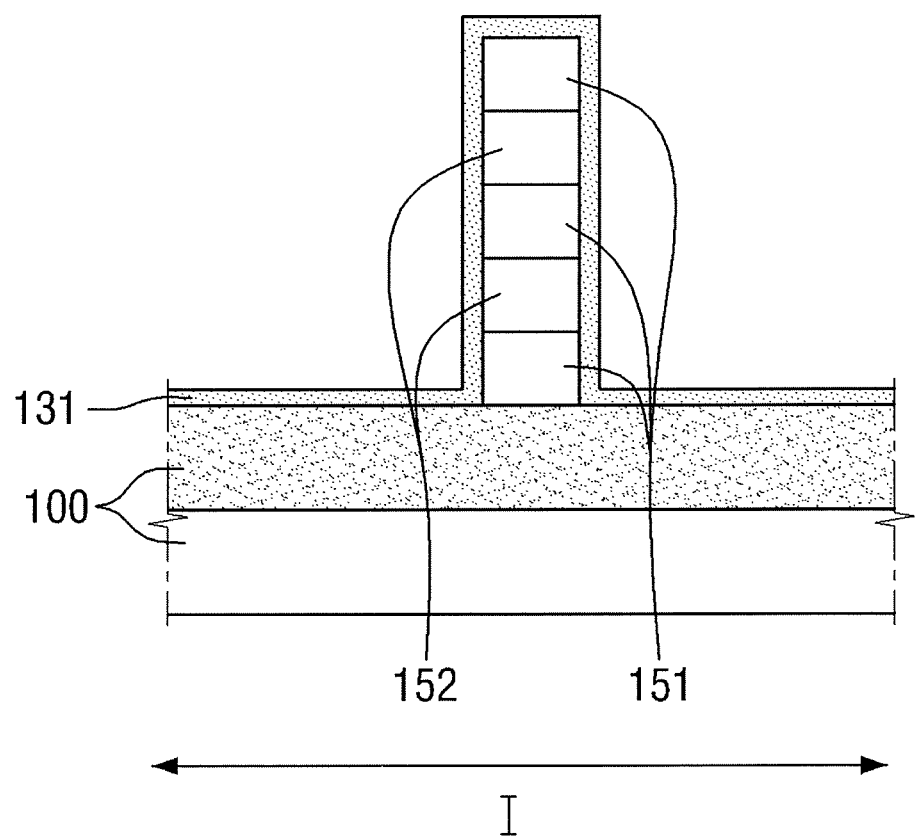
Figures 2, 13B:
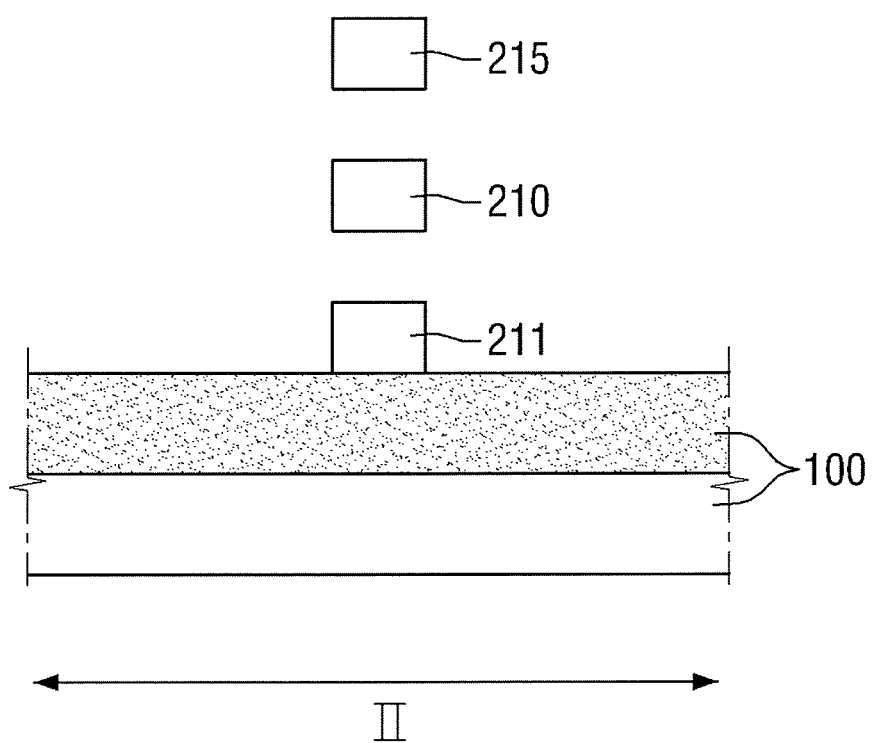
Figures 1, 14A:
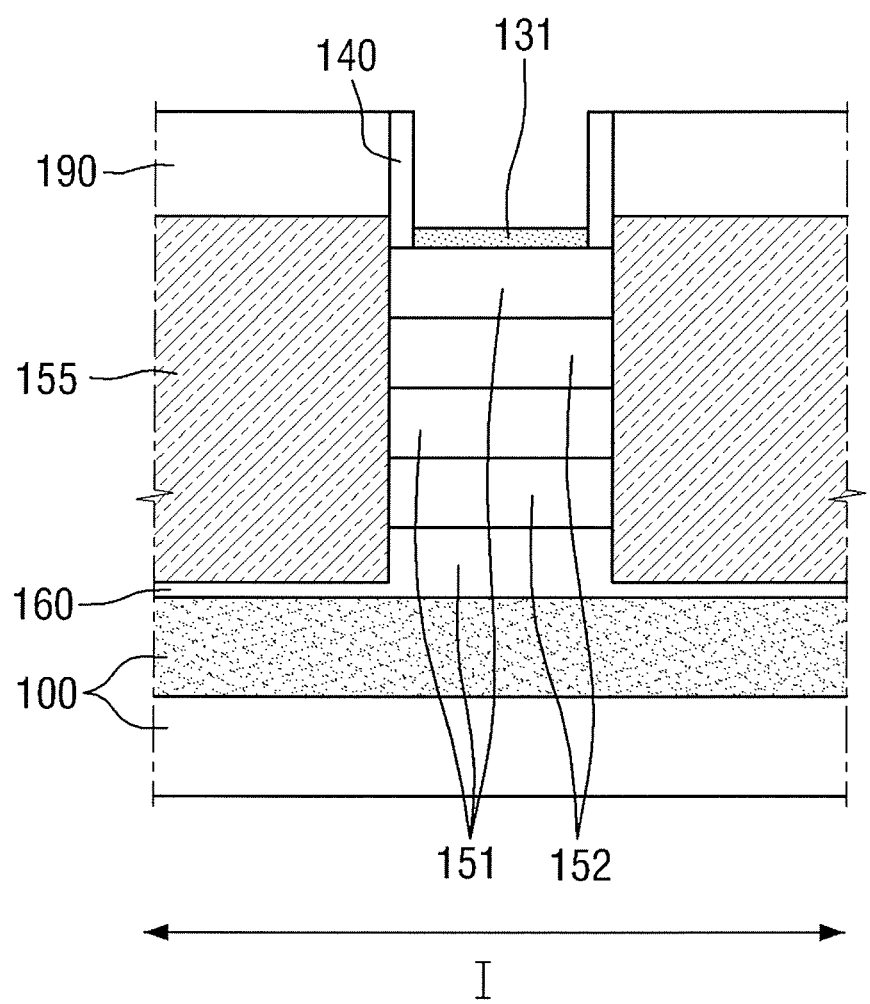
Figures 2, 14A:
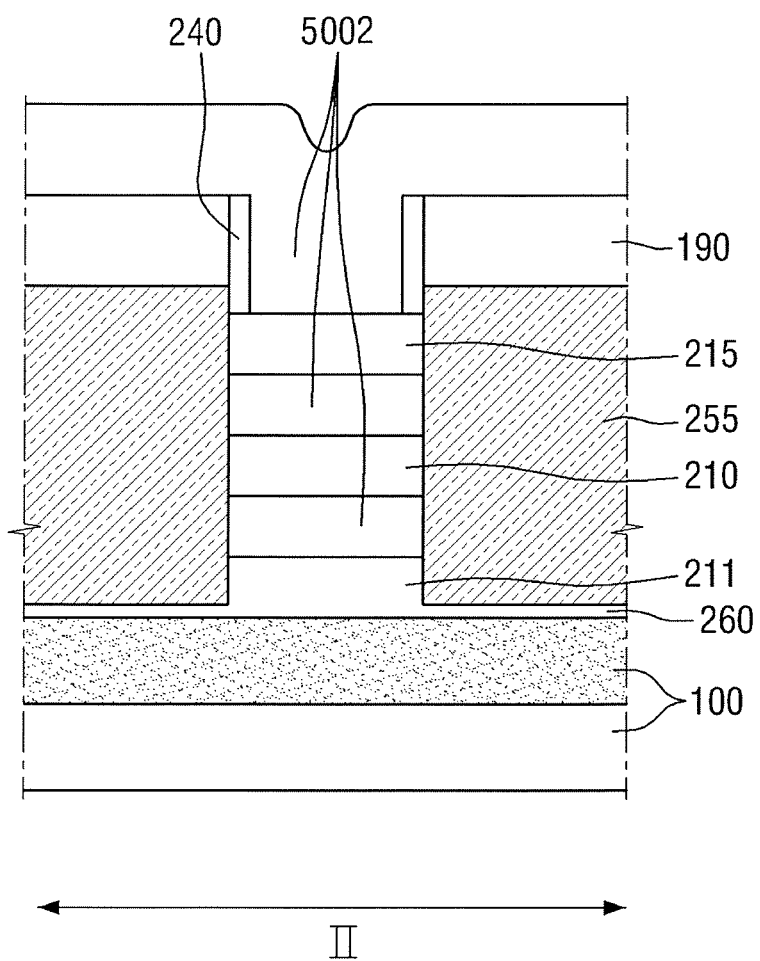
Figures 1, 14B:
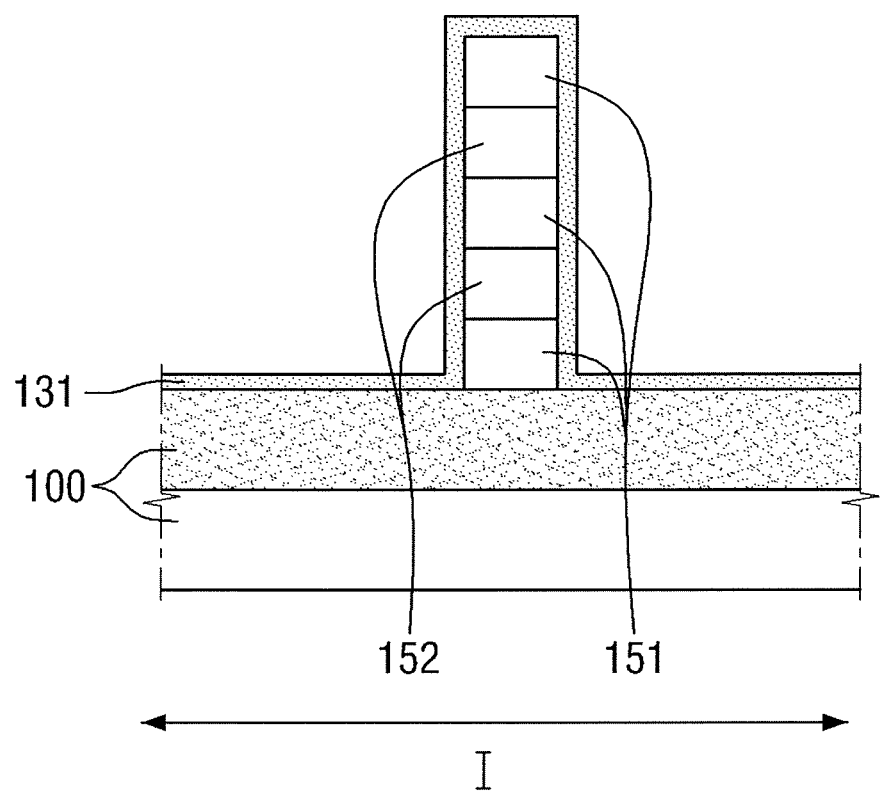
Figures 2, 14B:
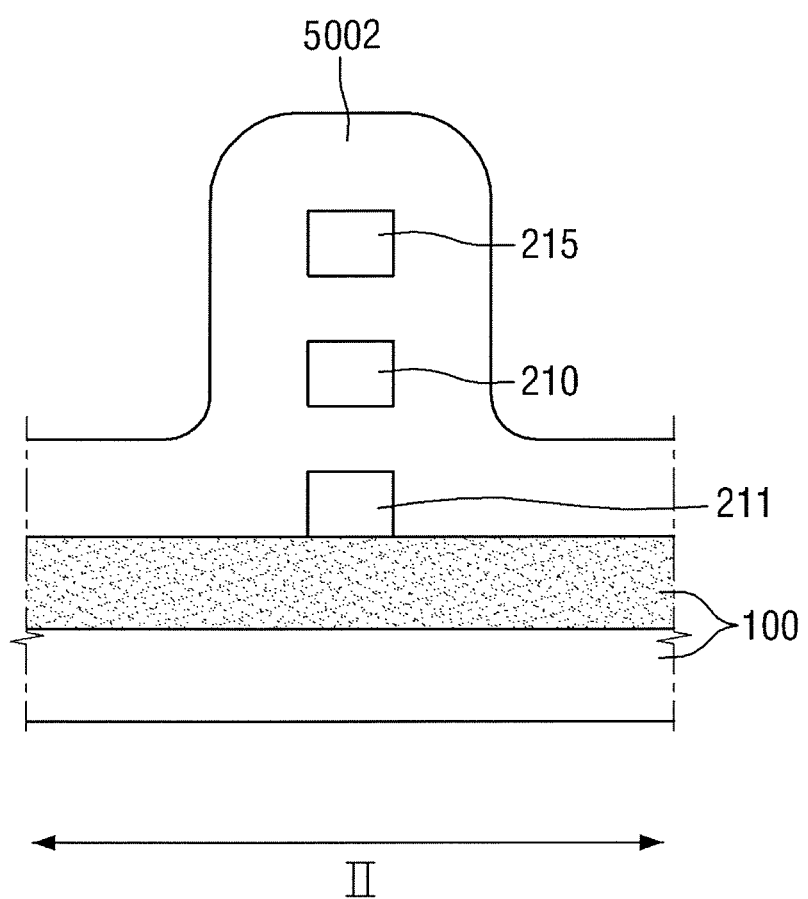
Figures 1, 15A:
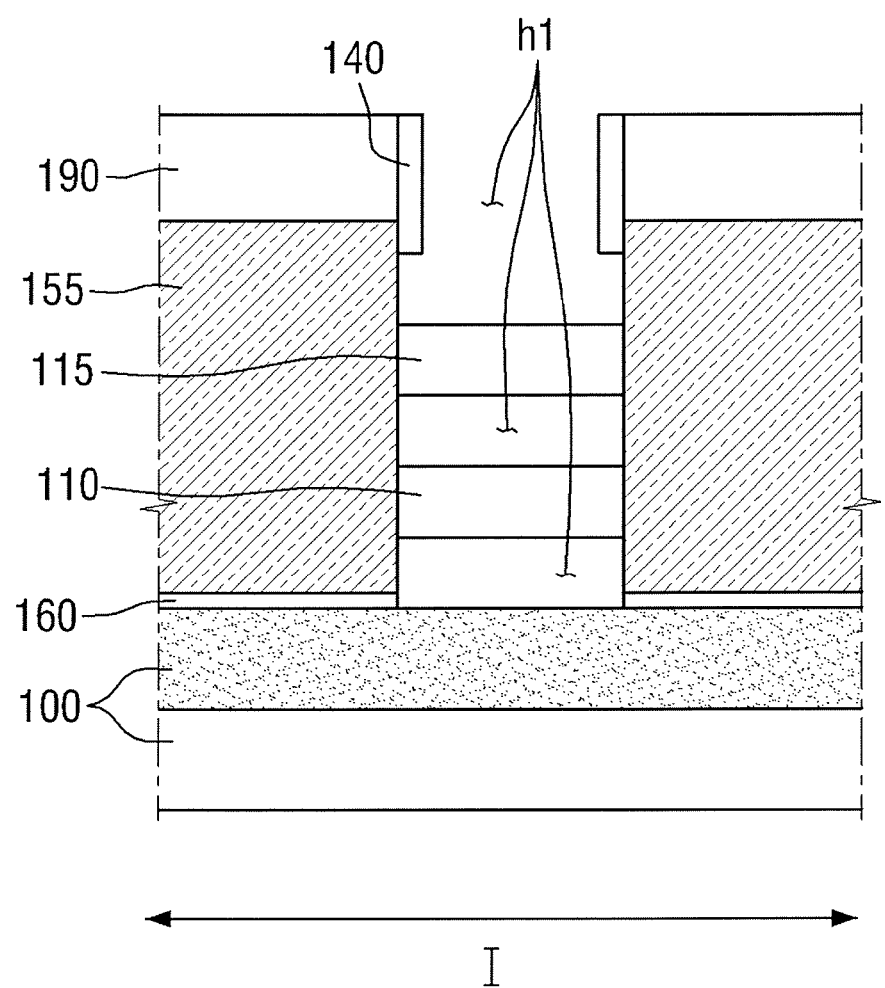
Figures 2, 15A:
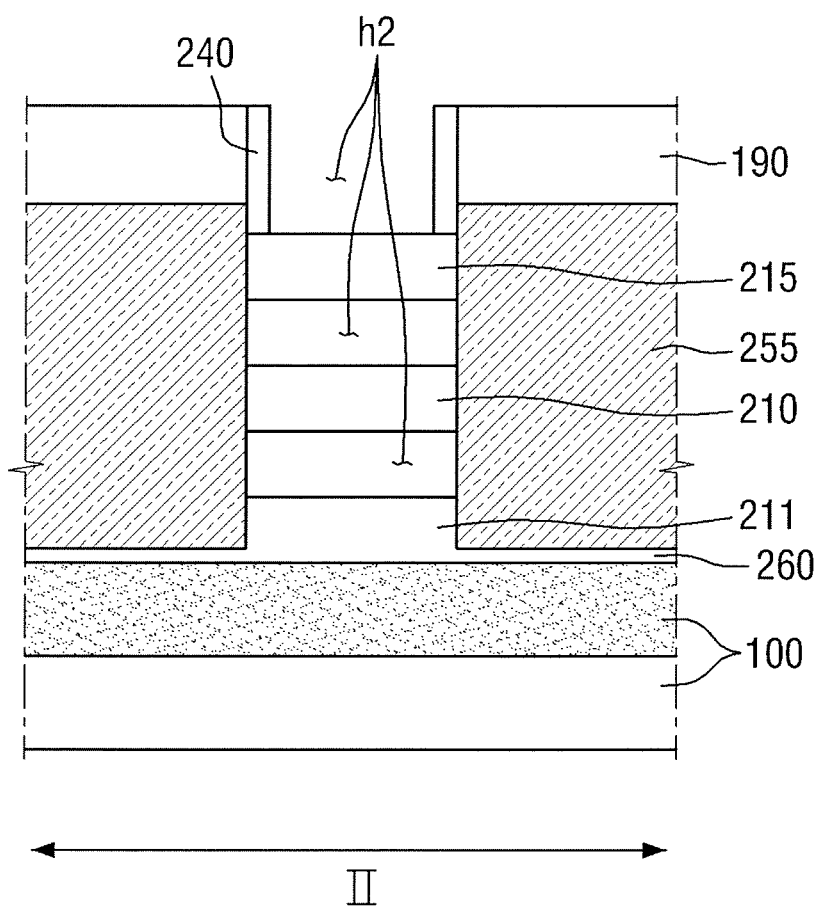
Figures 1, 15B:
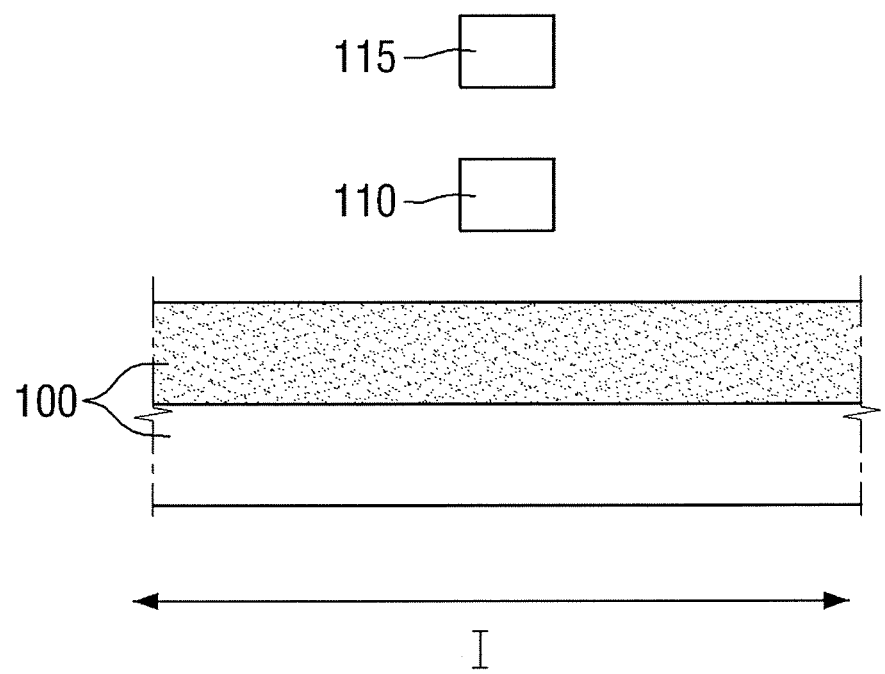
Figures 2, 15B:
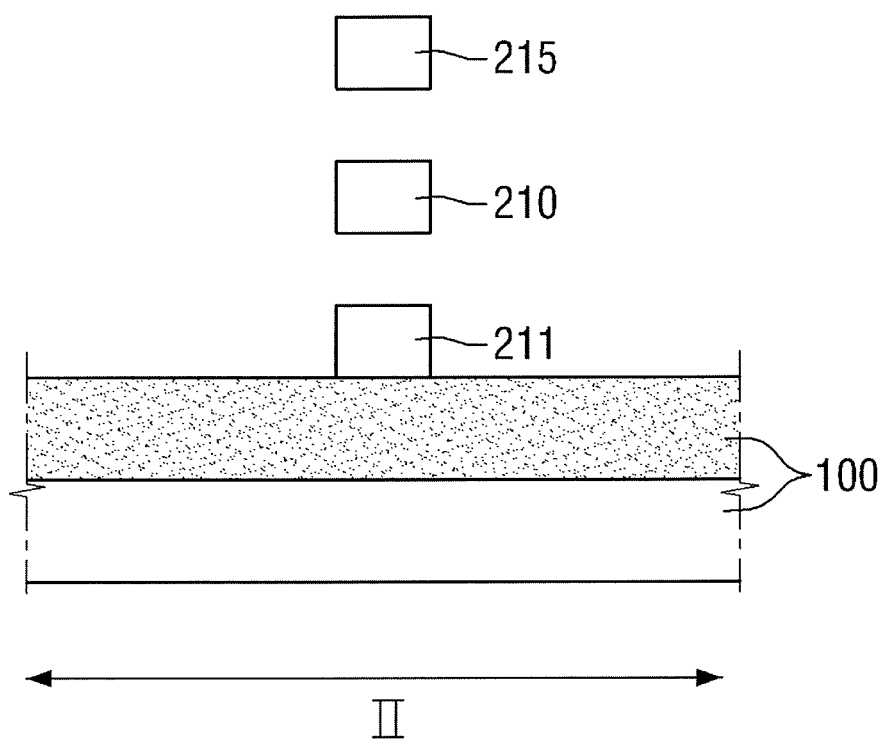
Figures 1, 16A:
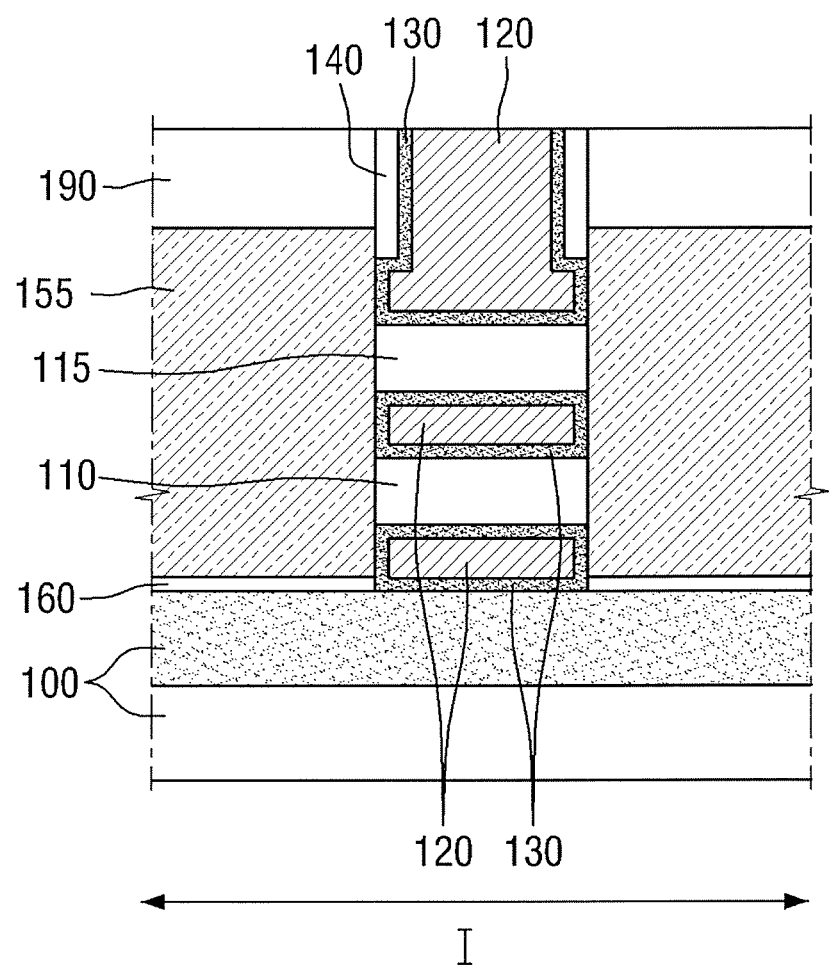
Figures 2, 16A:
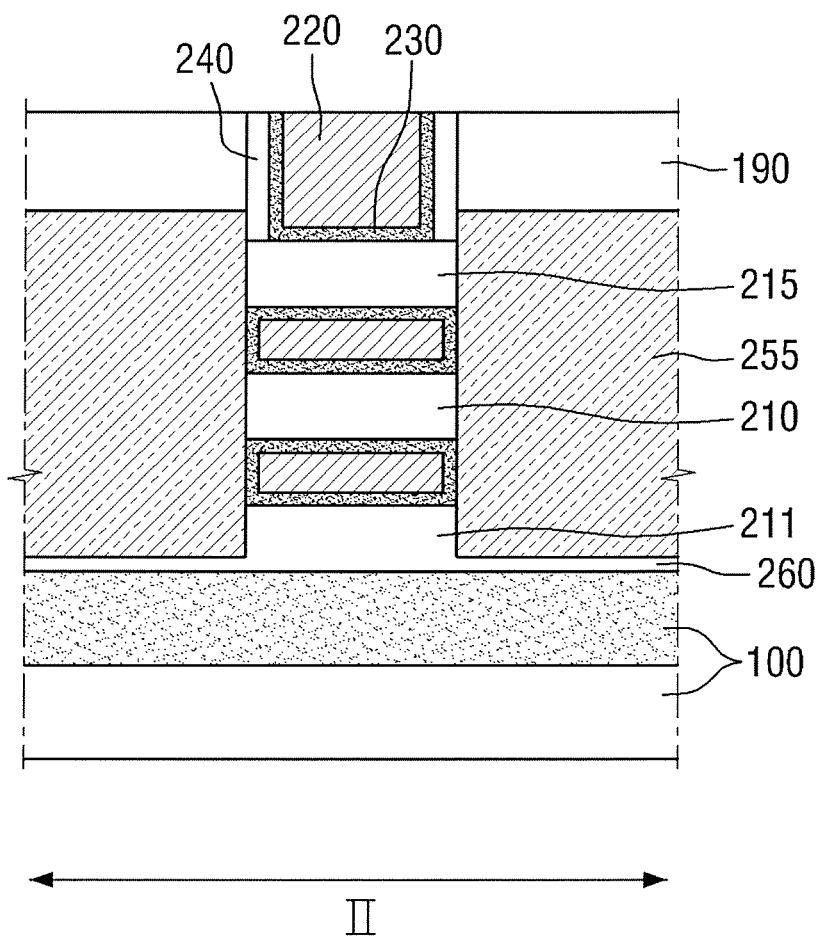
Figures 1, 16B:
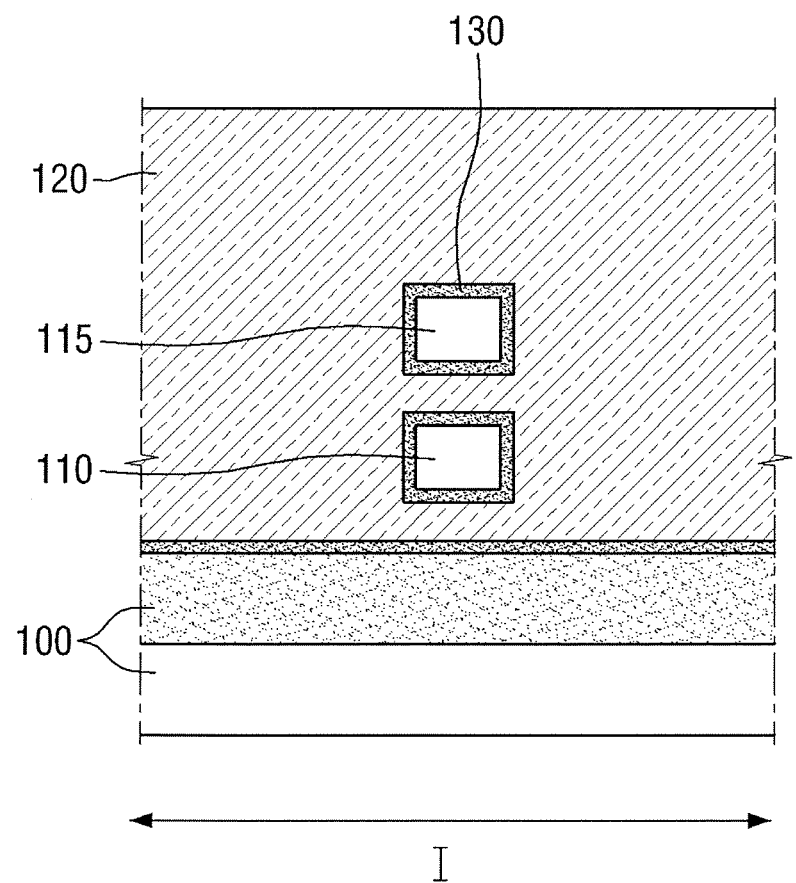
Figures 2, 16B:
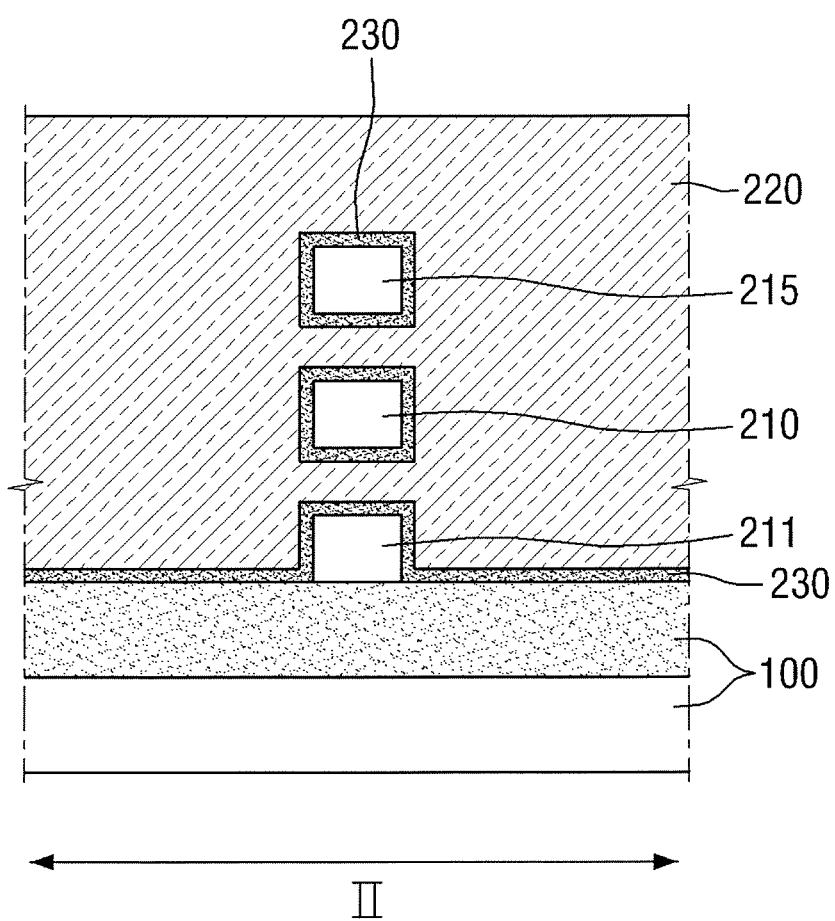

Referring to FIGS. 11A-1 and 11A-2, first, an interlayer insulating layer 190 covering the first source/drain 155, the second source/drain 255, the first dummy gate electrode 121, the second dummy gate electrode 221, the first gate spacer 140 and the second gate spacer 240, is formed on the substrate 100. Next, the interlayer insulating layer 190 is planarized until the first dummy gate electrode 121 and the second dummy gate electrode 221 are exposed. As a result, as shown, the third mask pattern 3003 and the fourth mask pattern 3004 are removed and top surfaces of the first dummy gate electrode 121 and the second dummy gate electrode 221 are exposed.

The interlayer insulating layer 190 may include, for example, at least one of a low-k material, oxide, nitride and oxynitride. The low-k material may include, for example, flowable oxide (FOX), tonen silazene (TOSZ), undoped silicate glass (USG), borosilicate glass (BSG), phosphosilicate glass (PSG), borophosphor silicate glass (BPSG), plasma enhanced tetraethyl orthosilicate (PETEOS), fluoride silicate glass (FSG), high density plasma (HDP) oxide, plasma enhanced oxide (PEOX), flowable CVD (FCVD), or combinations thereof. However, example embodiments of the present disclosure are not limited thereto.

Referring to FIGS. 12A-1 to 12B-2, the first dummy gate electrode 121 and the second dummy gate electrode 221 having exposed top surfaces are removed. As the first dummy gate electrode 121 and the second dummy gate electrode 221 are removed, the first capping layer 131 and the second capping layer 231 are exposed.

Referring to FIGS. 13A-1 to 13B-2, the fourth semiconductor pattern 252 is removed using a second etchant having a higher etch rate relative to the fourth semiconductor pattern 252, further relative to the third semiconductor pattern 251. In addition, the fourth semiconductor pattern 252 and the second capping layer 231 may be removed together. In an example embodiment, the fourth semiconductor pattern 252 and the second capping layer 231 may include the same semiconductor material. In this case, the fourth semiconductor pattern 252 and the second capping layer 231 may be removed together through the same etching process. In an example embodiment, the fourth semiconductor pattern 252 and the second capping layer 231 are removed at substantially the same time using the same etching process.

Therefore, a second wire pattern 210 and a fourth wire pattern 215, each formed of the third semiconductor pattern 251, are formed on the second region II. That is, a second wire pattern group including one or more wire patterns (e.g., the second wire pattern 210 and the fourth wire pattern 215) is formed on the second region II. In an example embodiment, while the second wire pattern 210 and the fourth wire pattern 215 are formed, the third semiconductor pattern 251 that is in contact with the substrate 100 is not removed. As a result, a dummy wire pattern 211 that is in contact with the substrate 100 may be formed on the second region II. The second wire pattern group (210, 215) may be formed to extend in the third direction X2. The second wire pattern group (210, 215) may be formed on the upper substrate 102 such that it is spaced apart from the upper substrate 102. That is, in an example embodiment, the second wire pattern group (210, 215) does not make contact with the substrate 100.

As shown in the figures, the second wire pattern 210 and the fourth wire pattern 215 may have rectangular cross sections. However, example embodiments of the present disclosure are not limited thereto. For example, according to example embodiments, corners of the second wire pattern 210 and the fourth wire pattern 215 may be rounded through trimming.

In an example embodiment, the transistor formed on the second region II is an N-type transistor, and the second wire pattern group (210, 215) includes, for example, a material having high electron mobility. The second wire pattern group (210, 215) may include, for example, one of Si or a III-V group compound semiconductor. However, example embodiments of the present disclosure are not limited thereto.

As the fourth semiconductor pattern 252 is removed, a space h2 is formed. The second epitaxial layer 255 may be exposed through the space h2.

Referring to FIGS. 14A-1 to 14B-2, a second mask layer 5002 covering the second wire pattern group (210, 215) and the dummy wire pattern 211 is formed on the second region II.

The second mask layer 5002 may include at least one of silicon oxide, silicon nitride, silicon oxynitride, a metal, photoresist, spin on glass (SOG) and/or spin on hard mask (SOH). However, example embodiments of the present disclosure are not limited thereto. Therefore, the second mask layer 5002 may include a material having etching selectivity with respect to the first capping layer 131. The second mask layer 5002 may be formed by, for example, at least one of chemical vapor deposition (CVD), physical vapor deposition (PVD), atomic layer deposition (ALD) and spin coating. However, example embodiments of the present disclosure are not limited thereto.

Next, referring to FIGS. 15A-1 to 15B-2, an etching process may be performed using the second mask layer 5002, thereby sequentially removing the first capping layer 131 and the first semiconductor pattern 151.

For example, in a state in which the second region II is covered by the second mask layer 5002, the first semiconductor pattern 151 is removed using a first etchant having a higher etch rate relative to the first semiconductor pattern 151, further relative to the second semiconductor pattern 152.

As a result, a first wire pattern 110 and a third wire pattern 115, each formed of the second semiconductor pattern 152, are formed on the first region I. That is, a first wire pattern group including one or more wire patterns (e.g., the first wire pattern 110 and the third wire pattern 115) is formed on the first region I. The first wire pattern group (110, 115) may be formed to extend in the first direction X1. The first wire pattern group (110, 115) is formed on the upper substrate 102 such that it is spaced apart from the upper substrate 102. That is, in an example embodiment, the first wire pattern group (110, 115) does not make contact with the substrate 100. In an example embodiment, the first wire pattern group (110, 115) is formed at substantially the same time as exposing the first capping layer 131 by removing the first dummy gate electrode 121.

As shown in the figures, the first wire pattern 110 and the third wire pattern 115 may have rectangular cross-sections. However, example embodiments of the present disclosure are not limited thereto. For example, according to example embodiments, corners of the first wire pattern 110 and the third wire pattern 115 may be rounded through trimming.

In an example embodiment, the transistor formed on the first region I is a P-type transistor, and the first wire pattern group (110, 115) includes, for example, a material having high hole mobility. The first wire pattern group (110, 115) may include, for example, one of SiGe and Ge. However, example embodiments of the present disclosure are not limited thereto.

As the first semiconductor pattern 151 is removed, a space h1 is formed. The first epitaxial layer 155 may be exposed through the space h1.

In the example embodiment shown in FIGS. 15A-1 to 15B-2, a dummy wire pattern is not formed on the first region I and is formed on the second region II. However, example embodiments of the present disclosure are not limited thereto. For example, in an example embodiment, a dummy wire pattern is formed on the first region I and is not formed on the second region II.

Referring to FIGS. 16A-1 to 16B-2, a first gate insulation layer 130 is formed along the periphery of the first wire pattern 110, the periphery of the third wire pattern 115, sidewalls of the first gate spacer 140 and the exposed first epitaxial layer 155. In addition, a second gate insulation layer 230 is formed along the periphery of the second wire pattern 210, the periphery of the fourth wire pattern 215, sidewalls of the second gate spacer 240 and the exposed second epitaxial layer 255. Further, the second gate insulation layer 230 is formed along sidewalls and a top surface of the dummy wire pattern 211. The first gate insulation layer 130 and the second gate insulation layer 230 may be conformally formed.

As a result, a portion of the first epitaxial layer 155 exposed by removing the first semiconductor pattern 151 makes contact with the first gate insulation layer 130. In addition, a portion of the second epitaxial layer 255 exposed by removing the fourth semiconductor pattern 252 makes contact with the second gate insulation layer 230.

Each of the first gate insulation layer 130 and the second gate insulation layer 230 may include, for example, a high-k material having a higher dielectric constant than silicon oxide. Each of the first gate insulation layer 130 and the second gate insulation layer 230 may include, for example, one or more materials selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. However, example embodiments of the present disclosure are not limited thereto.

Next, a first gate electrode 120 surrounding the periphery of the first wire pattern 110 and the periphery of the third wire pattern 115 is formed on the first gate insulation layer 130. The first gate electrode 120 may entirely surround the periphery of the first wire pattern 110 and the periphery of the third wire pattern 115. The first gate electrode 120 is formed to extend lengthwise in the second direction Y1. The first gate electrode 120 may also be formed in a space between the first wire pattern 110 and the substrate 100.

In addition, a second gate electrode 220 surrounding the periphery of the second wire pattern 210 and the periphery of the fourth wire pattern 215 is formed on the second gate insulation layer 230. The second gate electrode 220 may entirely surround the periphery of the second wire pattern 210 and the periphery of the fourth wire pattern 215. The second gate electrode 220 is formed to extend lengthwise in the fourth direction Y2. In addition, since the second gate electrode 220 is formed on a top surface and sidewalls of the dummy wire pattern 211, it may exist between the second wire pattern 210 and the dummy wire pattern 211.

The first gate electrode 120 and the second gate electrode 220 may include a conductive material. As shown in the figures, in an example embodiment, the first gate electrode 120 and the second gate electrode 220 are each formed of a single layer. However, example embodiments of the present disclosure are not limited thereto. For example, each of the first gate electrode 120 and the second gate electrode 220 may include a work function controlling conductive layer for adjusting a work function and a filling conductive layer for filling a space formed by the work function controlling conductive layer.

Each of the first gate electrode 120 and the second gate electrode 220 may include, for example, at least one of TiN, WN, TaN, Ru, TiC, TaC, Ti, Ag, Al, TiAl, TiAlN, TiAlC, TaCN, TaSiN, Mn, Zr, W, and Al. Alternatively, each of the first gate electrode 120 and the second gate electrode 220 may be made of a non-metal material, such as Si or SiGe. The first gate electrode 120 and the second gate electrode 220 may be formed by, for example, a replacement process. However, example embodiments of the present disclosure are not limited thereto.

A planarization process may be performed to form the first gate insulation layer 130, the second gate insulation layer 230, the first gate electrode 120 and the second gate electrode 220.

Through the processes described with reference to FIGS. 1 to 16, the semiconductor device shown in FIGS. 17A and 17B can be fabricated.

Figure 17A:
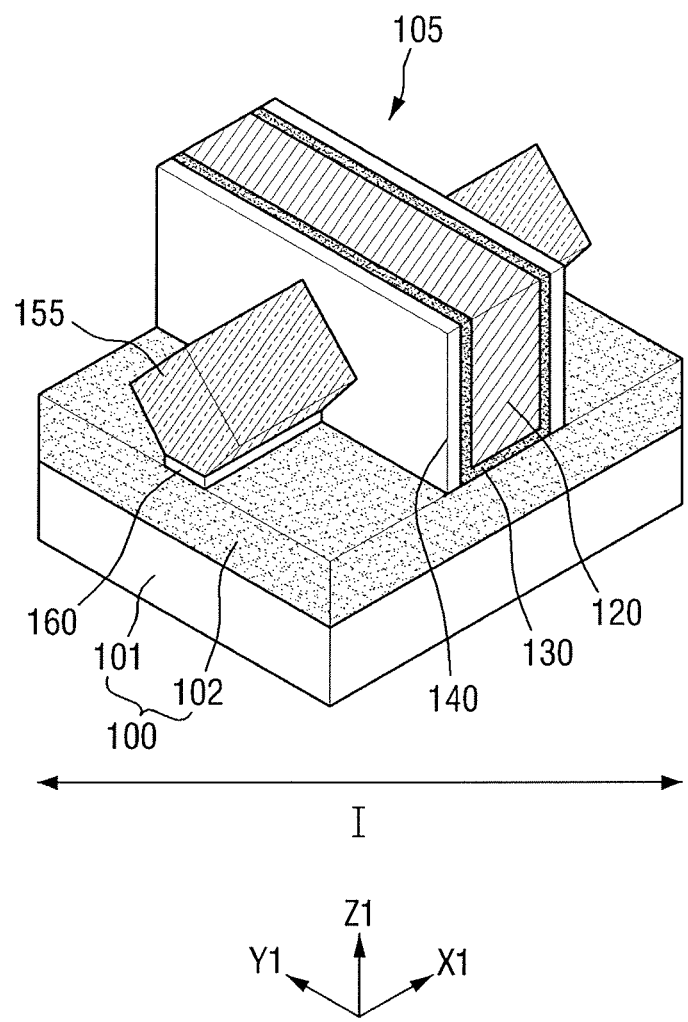
Figure 17B:
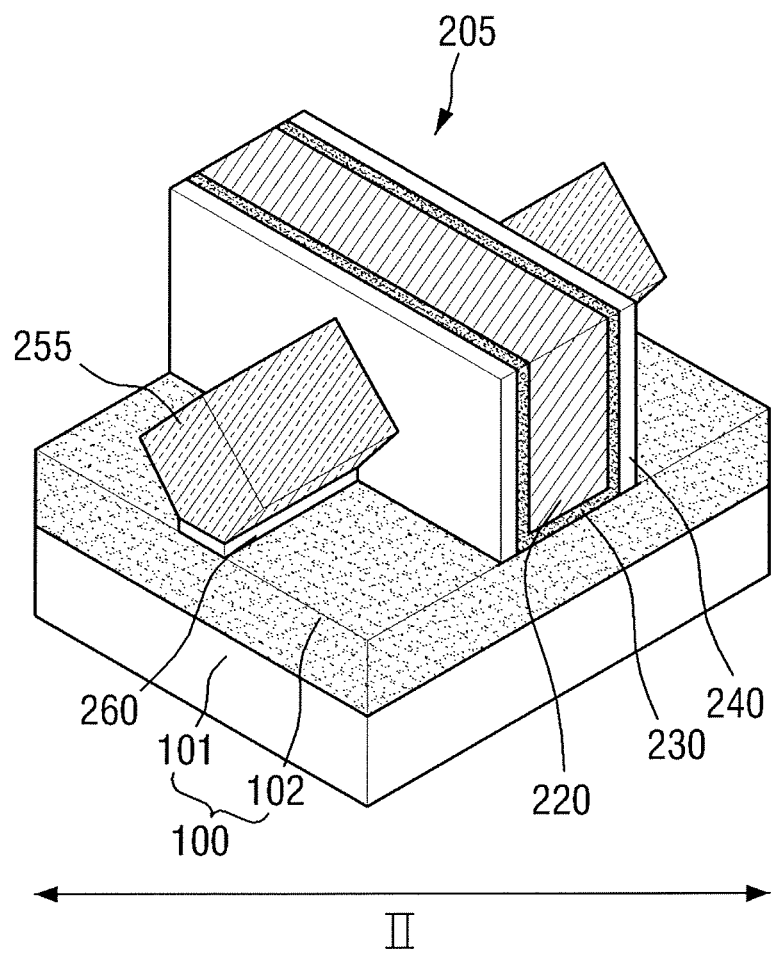
Figure 17B:
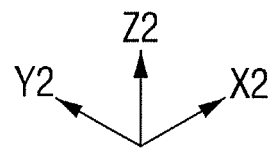
Figures 1, 18A:
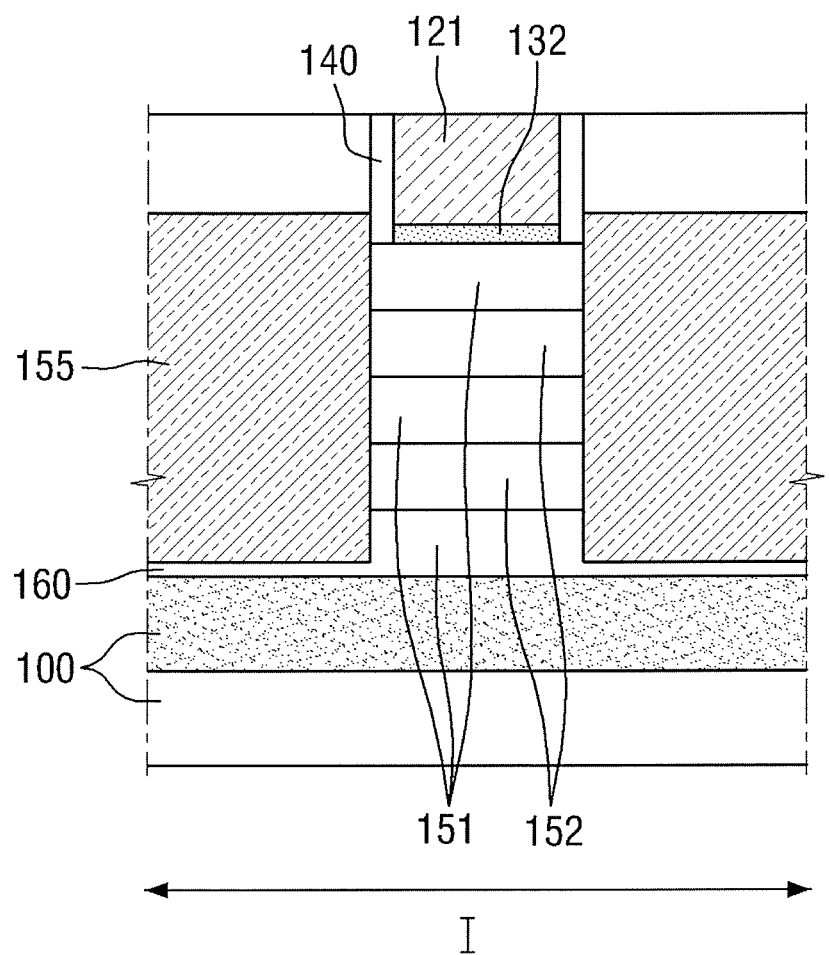
Figures 2, 18A:
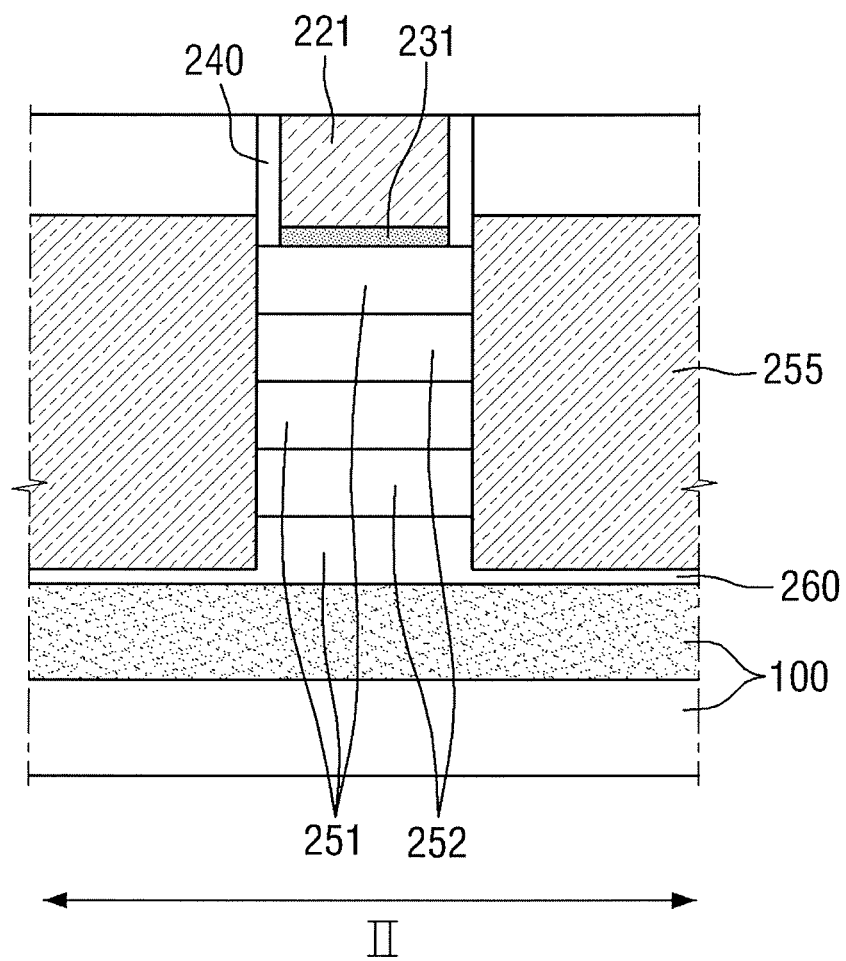
Figures 1, 18B:
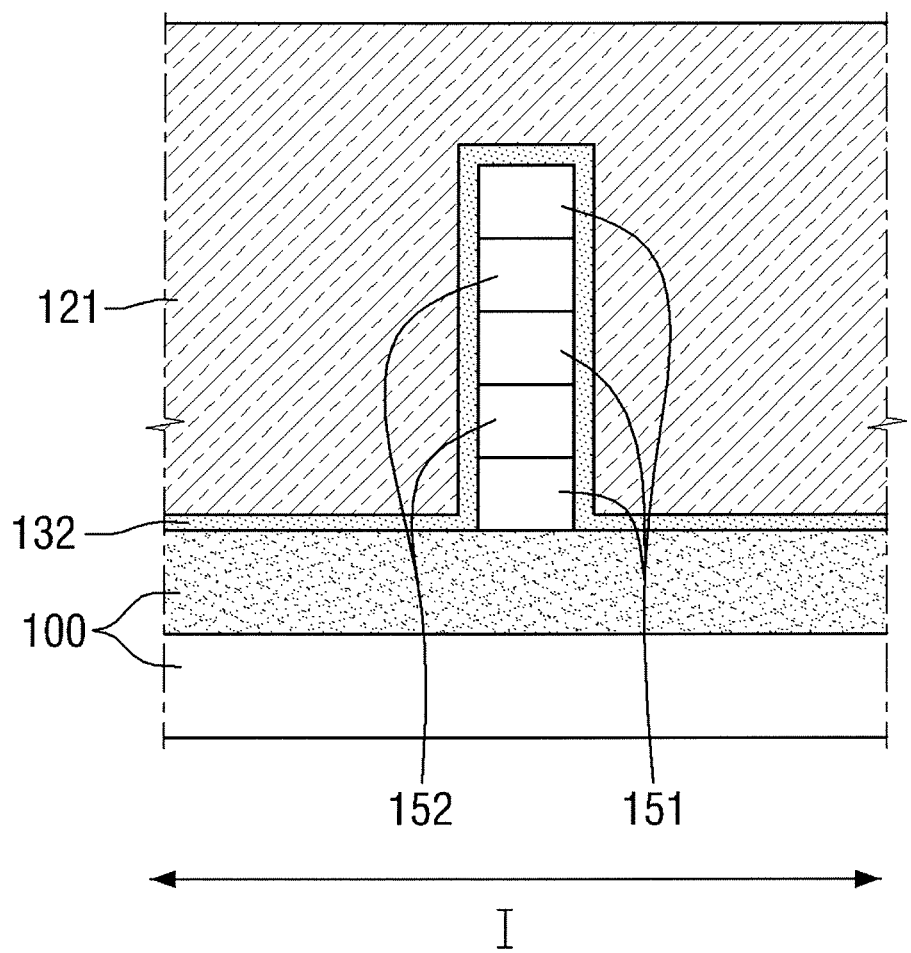
Figures 2, 18B:
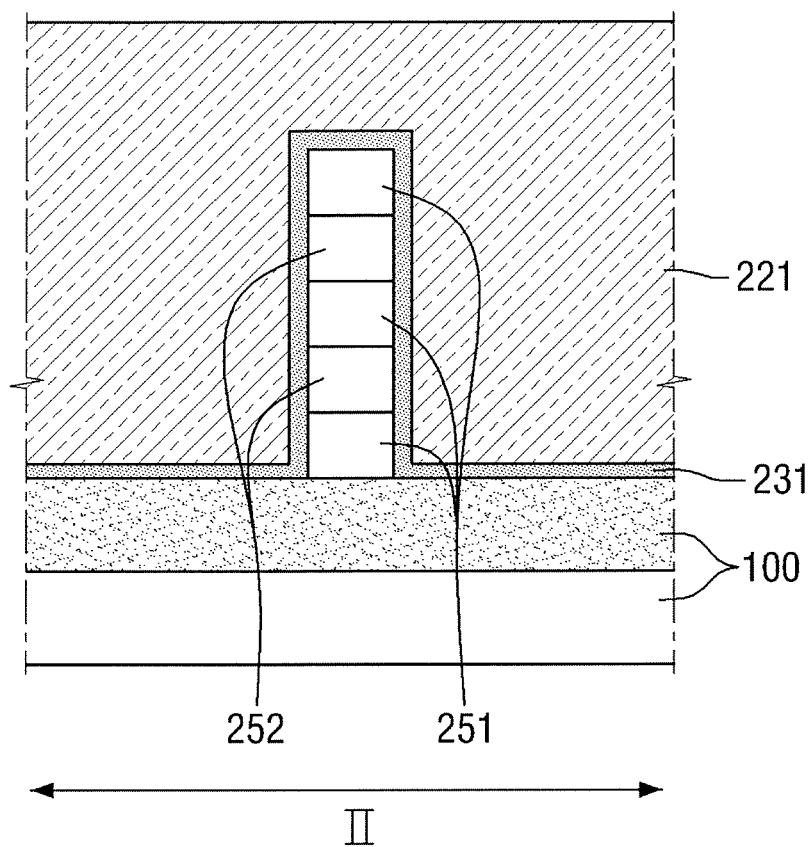
Figures 1, 19A:
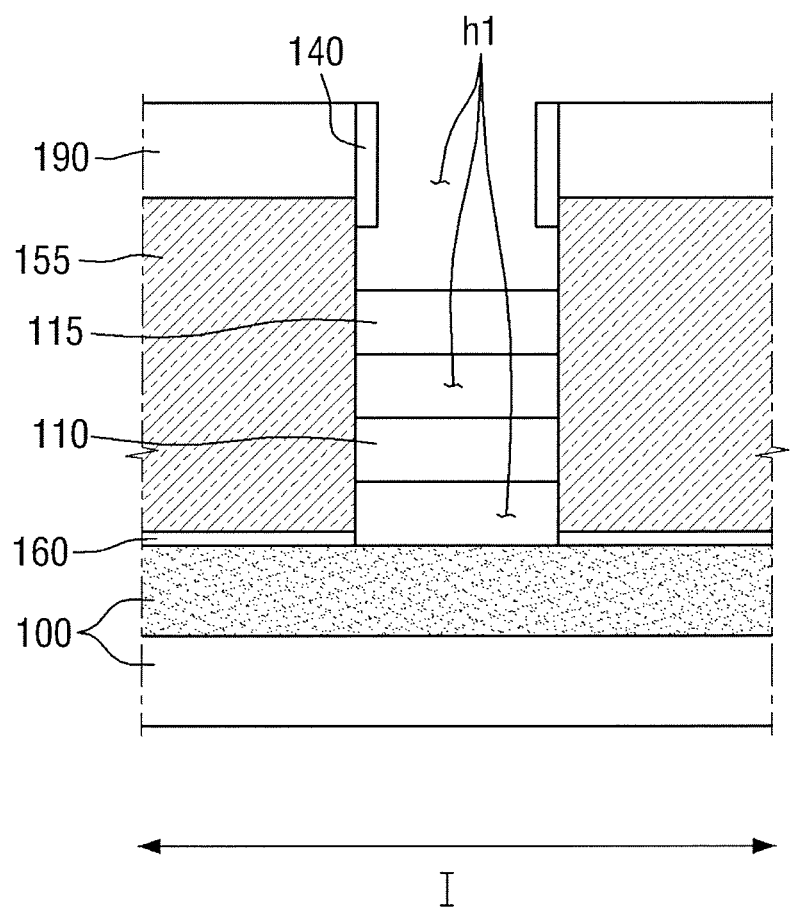
Figures 2, 19A:
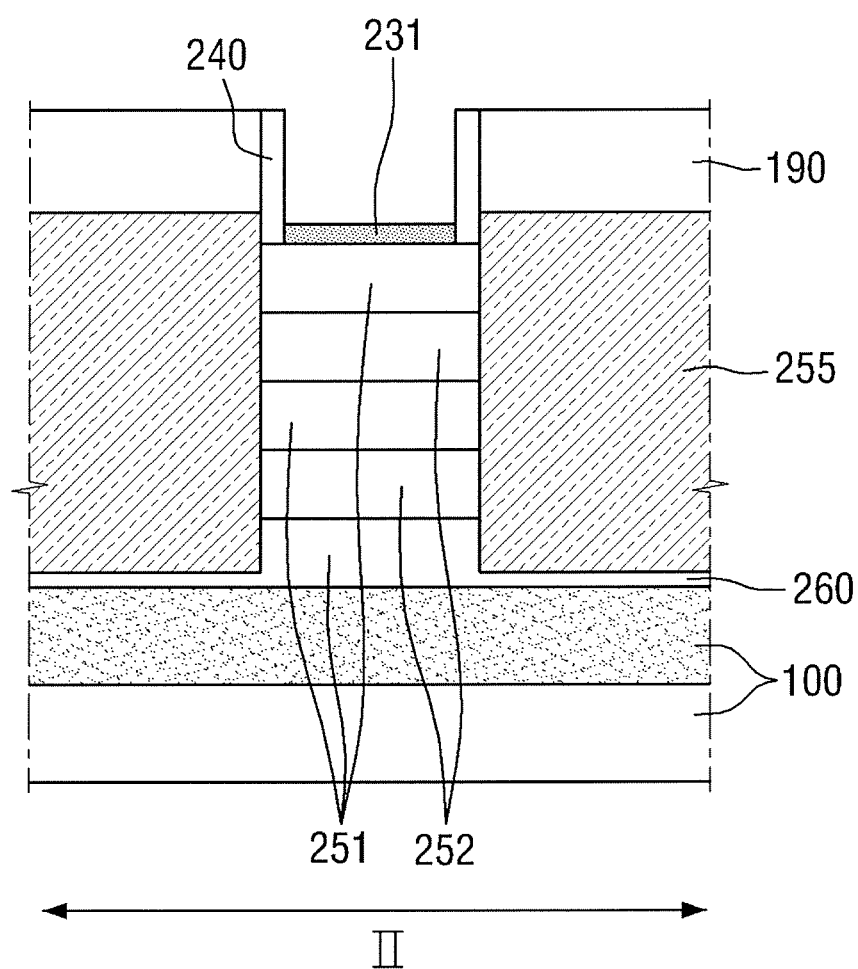
Figures 1, 19B:
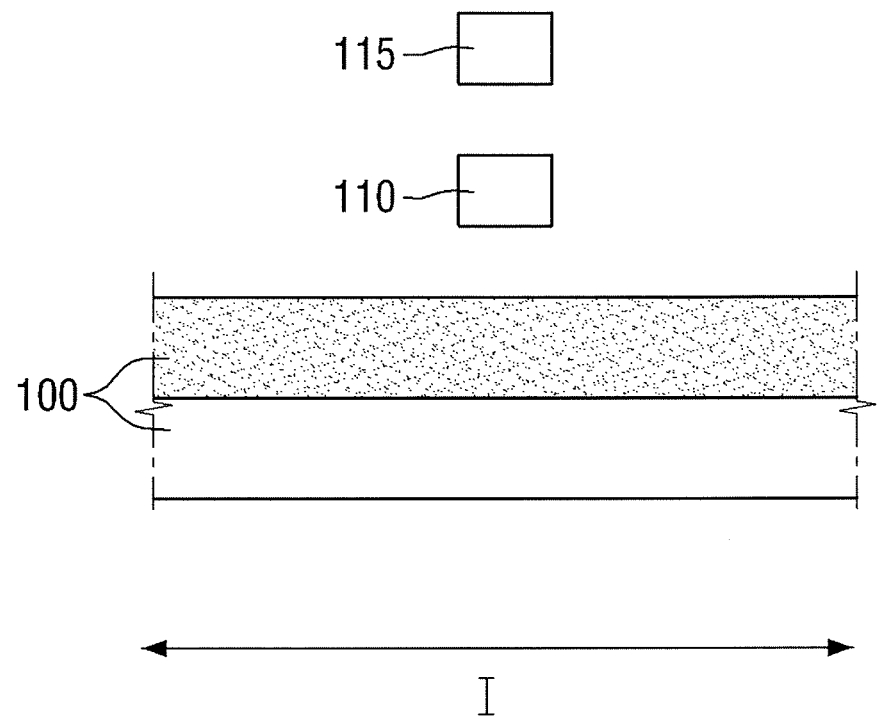
Figures 2, 19B:
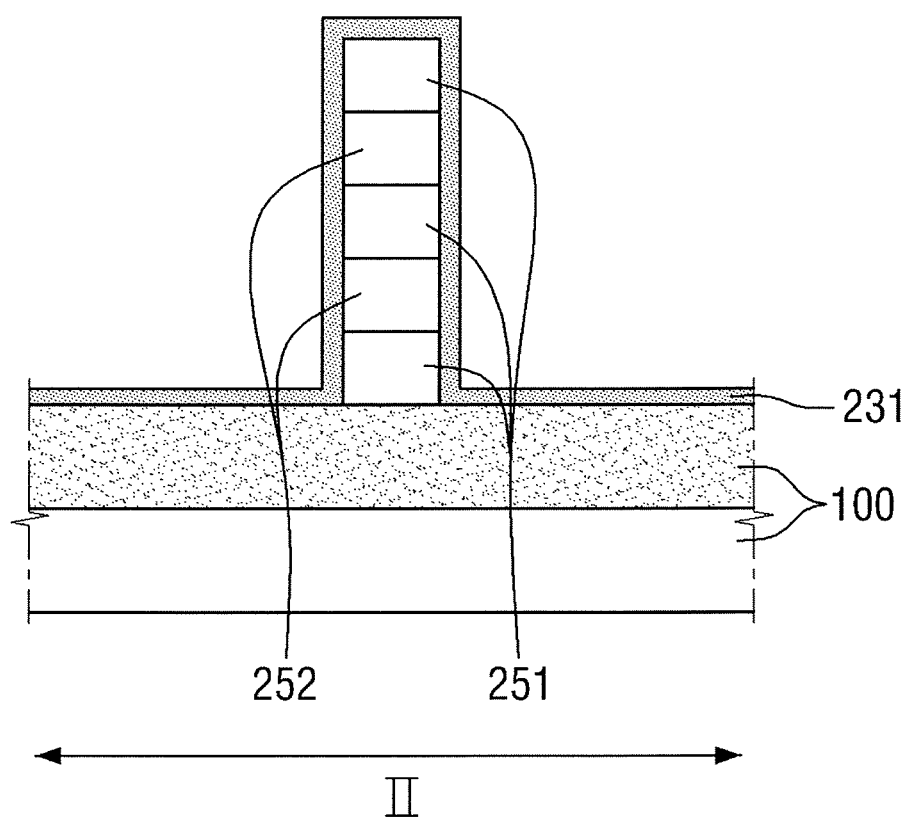
Figures 1, 20A:
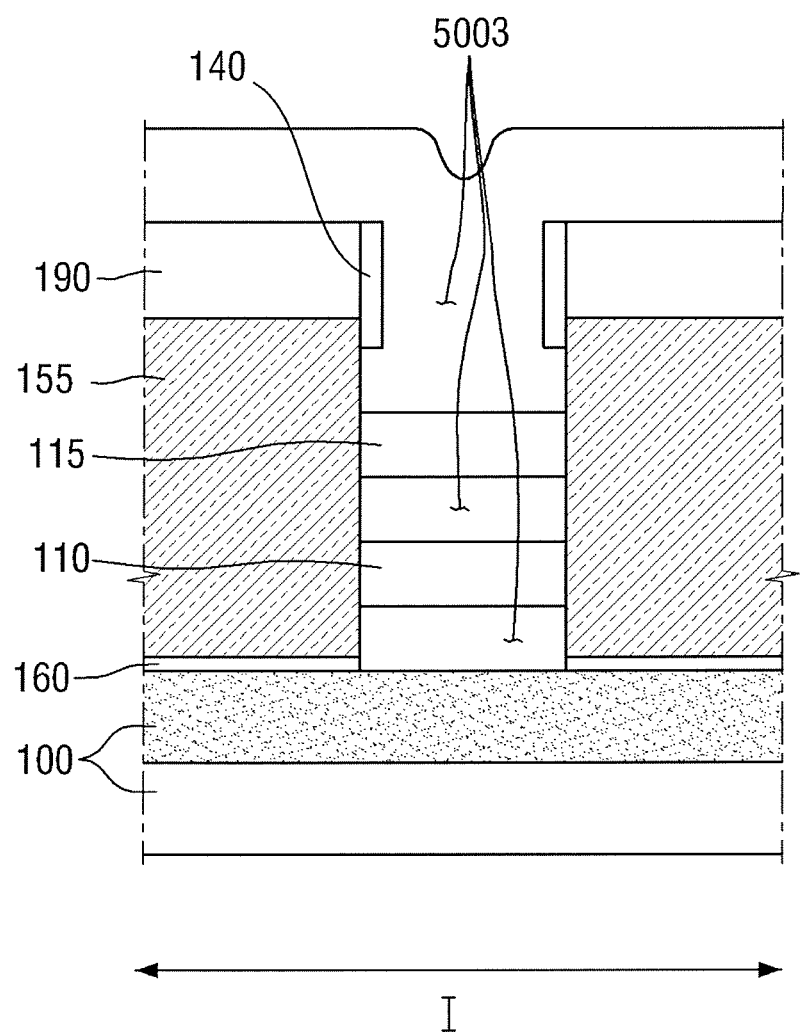
Figures 2, 20A:
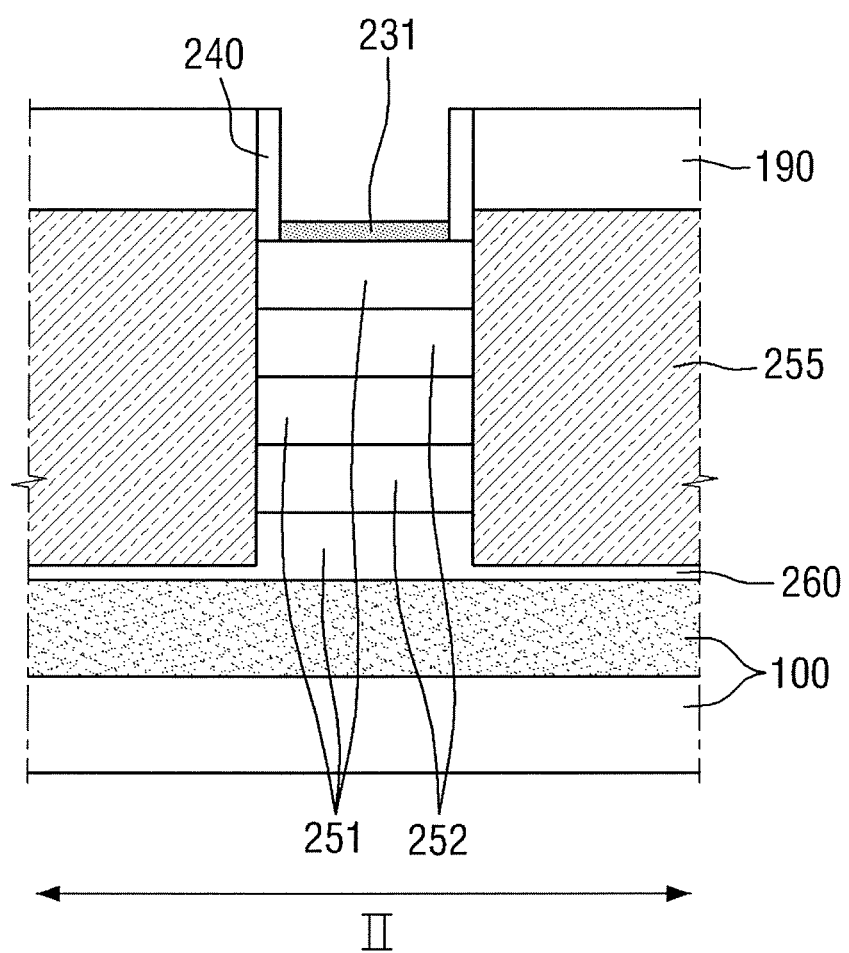
Figures 1, 20B:
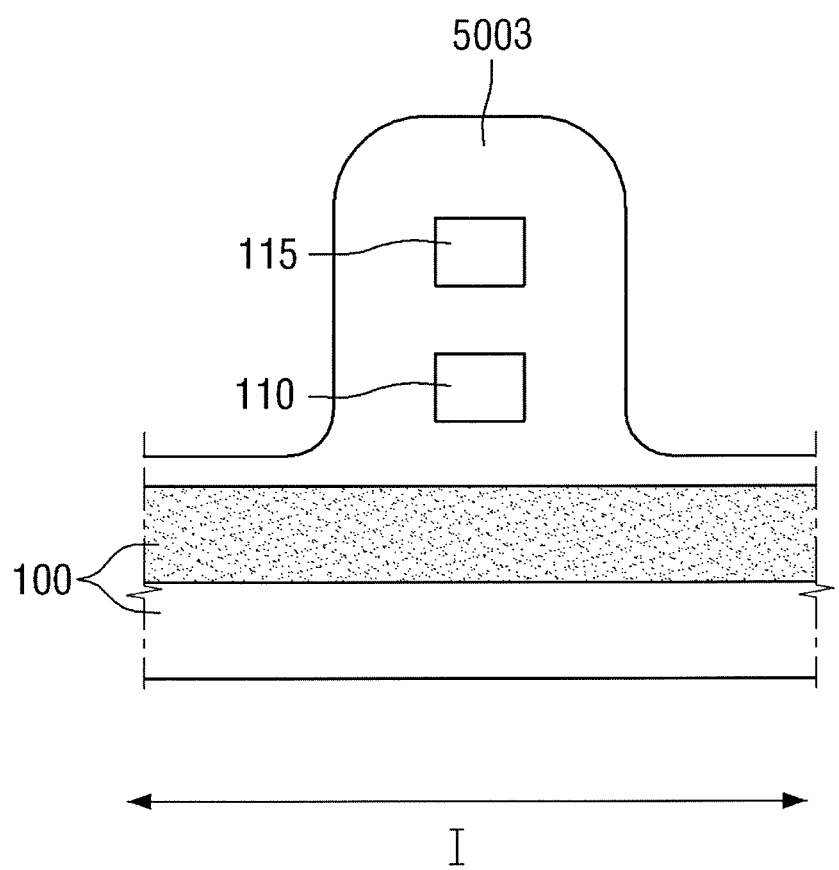
Figures 2, 20B:
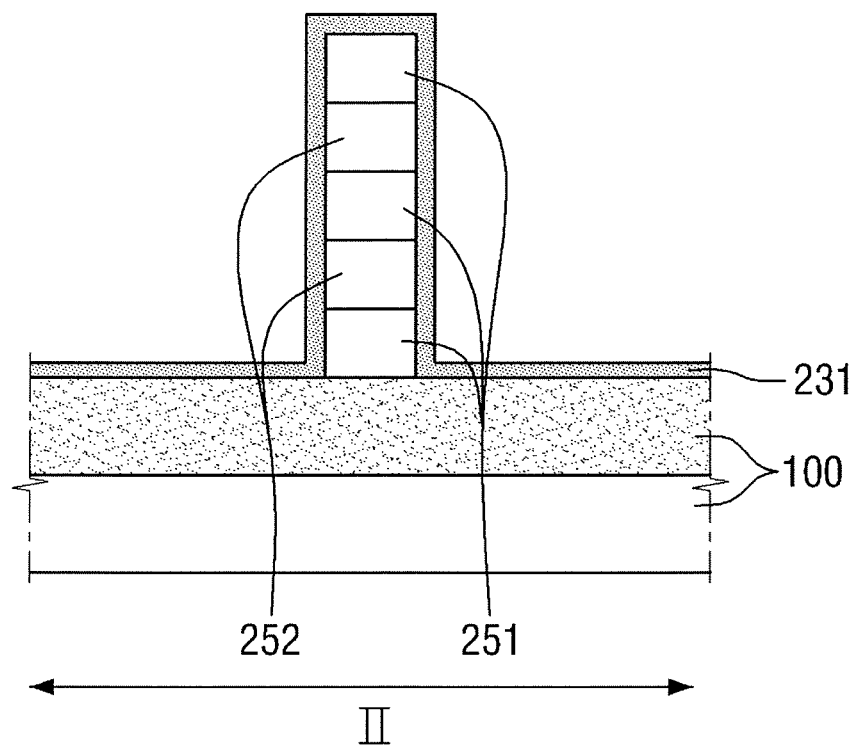
Figures 1, 21A:
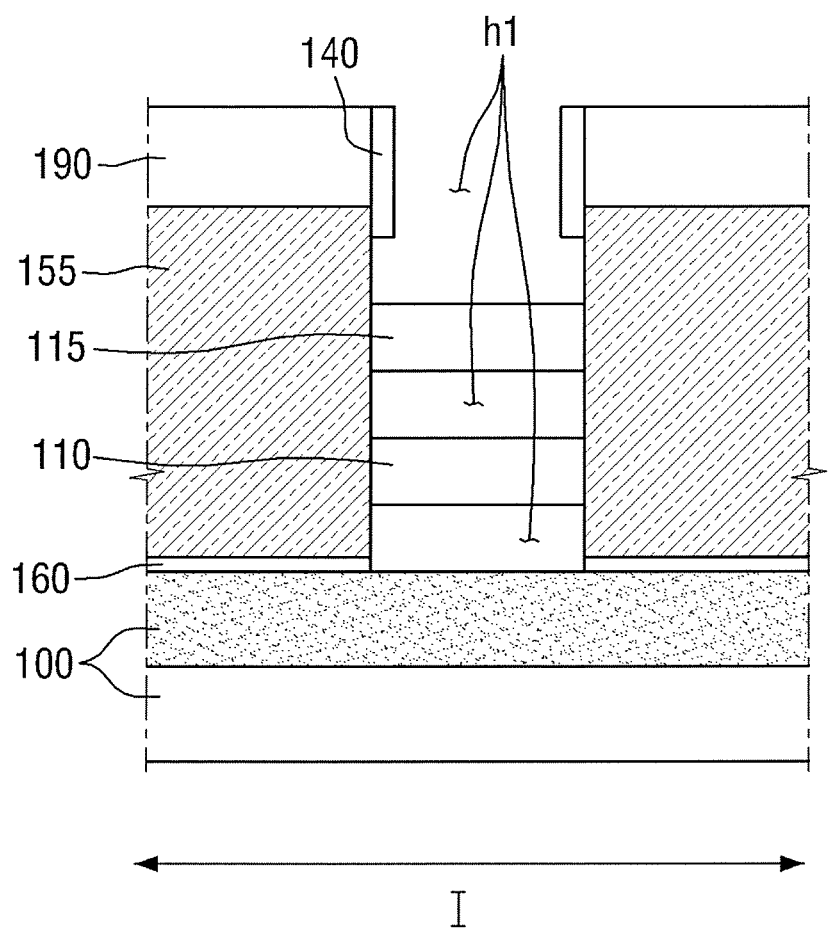
Figures 2, 21A:
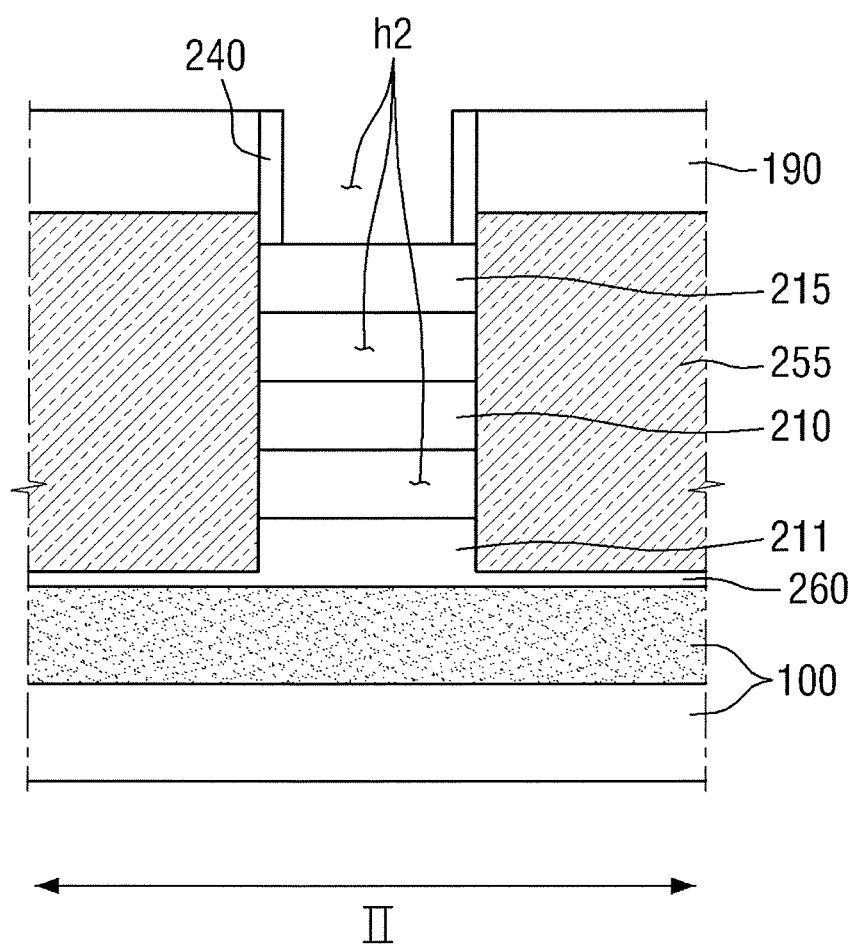
Figures 1, 21B:
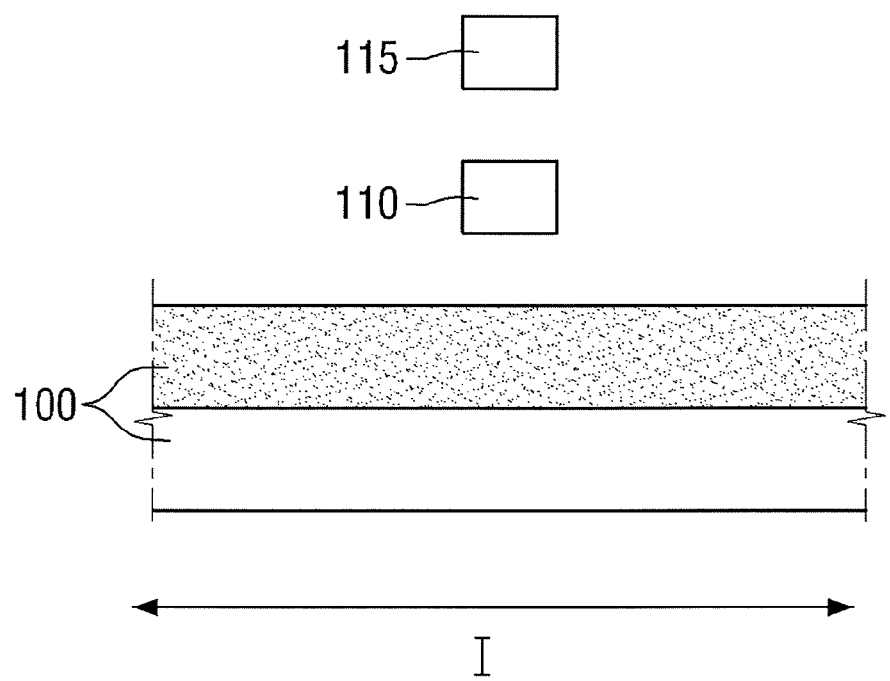
Figures 2, 21B:
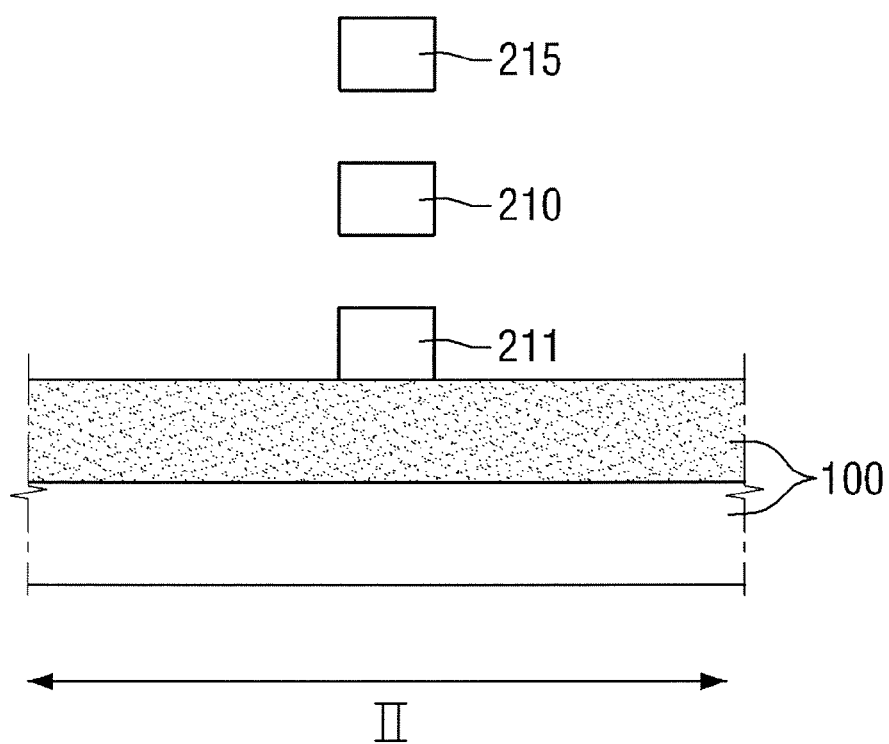

Referring to FIGS. 17A and 17B, a semiconductor device according to an example embodiment of the present disclosure may include a first transistor 105 (e.g., a p-type MOSFET) and a second transistor 205 (e.g., an n-type MOSFET).

As described above, the first transistor 105 may be a P-type transistor and the second transistor 205 may be an N-type transistor. However, example embodiments of the present disclosure are not limited thereto.

FIGS. 18A-1 to 21B-2 are cross-sectional views illustrating a method of fabricating a semiconductor device according to an example embodiment of the present disclosure.

FIGS. 18A-1 to 18B-2 correspond to FIGS. 11A-1 to 11-B2 illustrating intermediate process steps in a method of fabricating a semiconductor device according to an example embodiment of the present disclosure. The method of fabricating a semiconductor device according to the example embodiment shown in FIGS. 18A-1 to 18B-2 is substantially similar to the method of fabricating a semiconductor device according to the example embodiment shown in FIGS. 11A-1 to 11B-2, except that the first capping layer 131 shown in FIGS. 11A-1 and 11B-1 is replaced with a third capping layer 132. Therefore, for convenience of explanation, a further description of steps and components previously described may be omitted herein.

In an example embodiment, the third capping layer 132 is formed on a first region I. The third capping layer 132 and a first semiconductor pattern 151 may include the same semiconductor material. In addition, the third capping layer 132 may include one of silicon (Si) and a III-V semiconductor. However, example embodiments of the present disclosure are not limited thereto.

Referring to FIGS. 19A-1 to 19B-2, a first dummy gate electrode 121, the third capping layer 132 and the first semiconductor pattern 151 may be sequentially removed from the exposed first region I. In addition, a second dummy gate electrode 221 may be sequentially removed from the exposed second region II.

For example, in an example embodiment, the first dummy gate electrode 121, the third capping layer 132 and the first semiconductor pattern 151 may be removed from the exposed first region I through the same etching process.

The etching process may include removing the first dummy gate electrode 121, the third capping layer 132 and the first semiconductor pattern 151 using a first etchant having a higher etch rate relative to the first semiconductor pattern 151, further relative to the second semiconductor pattern 152.

As a result, a first wire pattern 110 and a third wire pattern 115, each formed of the second semiconductor pattern 152, are formed on the first region I. That is, a first wire pattern group including one or more wire patterns (e.g., the first wire pattern 110 and the third wire pattern 115) is formed on the first region I.

As the first semiconductor pattern 151 is removed, a space h1 is formed. In addition, the first epitaxial layer 155 may be exposed through the space h1.

Referring to 20A-1 to 20B-2, a third mask layer 5003 covering the first wire pattern group (110, 115) is formed on the first region I. The third mask layer 5003 may include at least one of silicon oxide, silicon nitride, silicon oxynitride, a metal, photo resist, spin on glass (SOG) and/or spin on hard mask (SOH). However, example embodiments of the present disclosure are not limited thereto. Therefore, the third mask layer 5003 may include a material having etching selectivity with respect to the second capping layer 231. The third mask layer 5003 may be formed by at least one of chemical vapor deposition (CVD), physical vapor deposition (PVD), atomic layer deposition (ALD) and spin coating. However, example embodiments of the present disclosure are not limited thereto.

Referring to FIGS. 21A-1 to 21B-2, an etching process may be performed using the third mask layer 5003, thereby sequentially removing the second capping layer 231 and a fourth semiconductor pattern 252 from the exposed second region II.

The second capping layer 231 and the fourth semiconductor pattern 252 may be removed using a second etchant having a higher etch rate relative to the fourth semiconductor pattern 252, further relative to the third semiconductor pattern 251.

As the result, a second wire pattern 210 and a fourth wire pattern 215, each formed of the third semiconductor pattern 251, are formed on the second region II. That is, a second wire pattern group including one or more wire patterns (e.g., the second wire pattern 210 and the fourth wire pattern 215) is formed on the second region II. In an example embodiment, while the second wire pattern 210 and the fourth wire pattern 215 are formed, the third semiconductor pattern 251 that is in contact with the substrate 100 is not removed. Accordingly, a dummy wire pattern 211 that is in contact with the substrate 100 may be formed on the second region II.

According to an example embodiment, the second capping layer 231 may include a semiconductor material, which may be the same as that of the fourth semiconductor pattern 252. In addition, according to an example embodiment, the second capping layer 231 may include an insulating material such as, for example, silicon oxide. However, example embodiments of the present disclosure are not limited thereto. In an example embodiment in which the second capping layer 231 includes silicon oxide, the second capping layer 231 and the fourth semiconductor pattern 252 may be sequentially removed using different etchants. However, example embodiments of the present disclosure are not limited thereto. Therefore, the second capping layer 231 and the fourth semiconductor pattern 252 may be removed together using the same etchant through the same process.

As the fourth semiconductor pattern 252 is removed, a space h2 is formed. In addition, the second epitaxial layer 255 may be exposed through the space h2.

Figure 22:
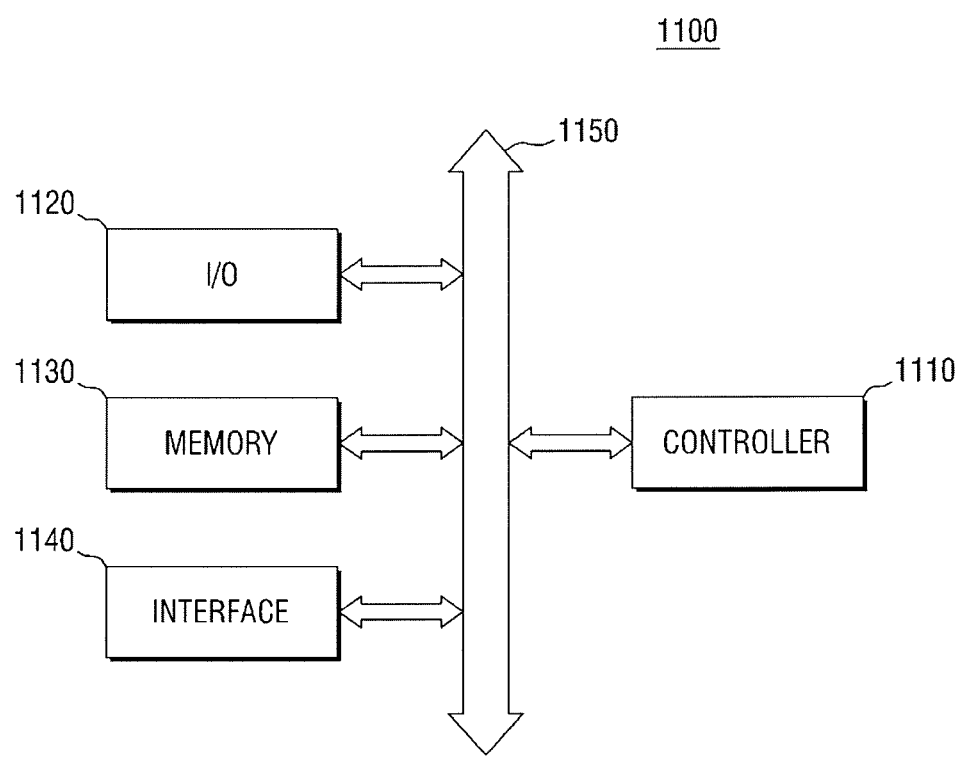
FIG. 22 is a block diagram of an electronic system including semiconductor devices fabricated according to example embodiments of the present disclosure.

FIG. 22 is a block diagram of an electronic system including semiconductor devices fabricated according to example embodiments of the present disclosure.

Referring to FIG. 22, the electronic system 1100 may include a controller 1110, an input/output (I/O) device 1120, a memory 1130, an interface 1140 and a bus 1150. The controller 1110, the I/O device 1120, the memory 1130, and/or the interface 1140 may be connected to each other through the bus 1150. The bus 1150 corresponds to a path through which data moves.

The controller 1110 may include, for example, at least one of a microprocessor, a digital signal processor, a microcontroller, and logic elements capable of functions similar to those of these elements. The I/O device 1120 may include, for example, a keypad, a keyboard, a display device, etc. The memory device 1130 may store data and/or commands. The interface 1140 may perform functions of transmitting data to a communication network and/or receiving data from the communication network. The interface 1140 may be wired or wireless. For example, the interface 1140 may include an antenna or a wired/wireless transceiver, etc.

The electronic system 1100 may further include, for example, high-speed DRAM and/or SRAM as the working memory, which may improve the operation of the controller 1110. In addition, a semiconductor device fabricated according to example embodiments of the present disclosure may be provided in the memory device 1130, and/or may be provided in some components of the controller 1110 and/or the I/O device 1120.

The electronic system 1100 may be utilized in, for example, a personal digital assistant (PDA), a portable computer, a web tablet, a wireless phone, a mobile phone, a digital music player, a memory card, or any type of electronic device capable of transmitting and/or receiving information in a wireless environment.

Figure 23:
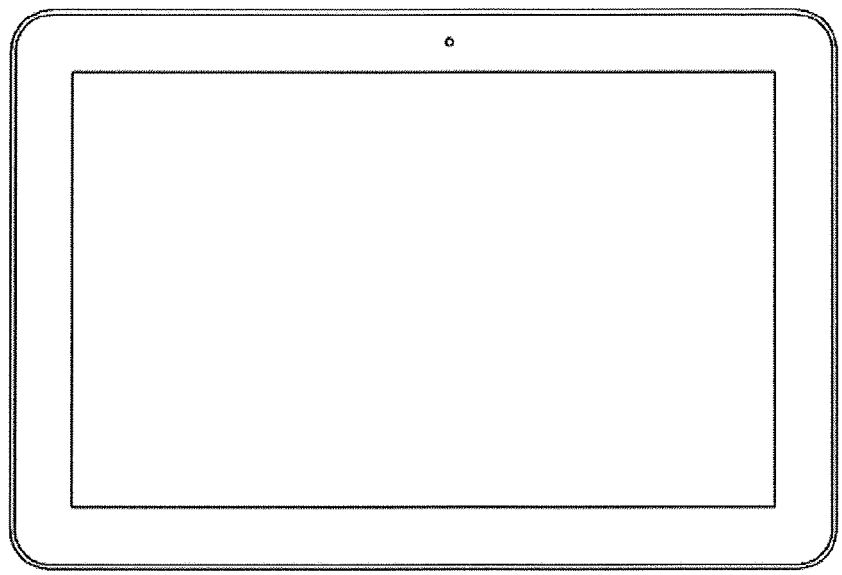
FIGS. 23 and 24 illustrate exemplary semiconductor systems in which semiconductor devices fabricated according to example embodiments of the present disclosure are implemented.
Figure 24:
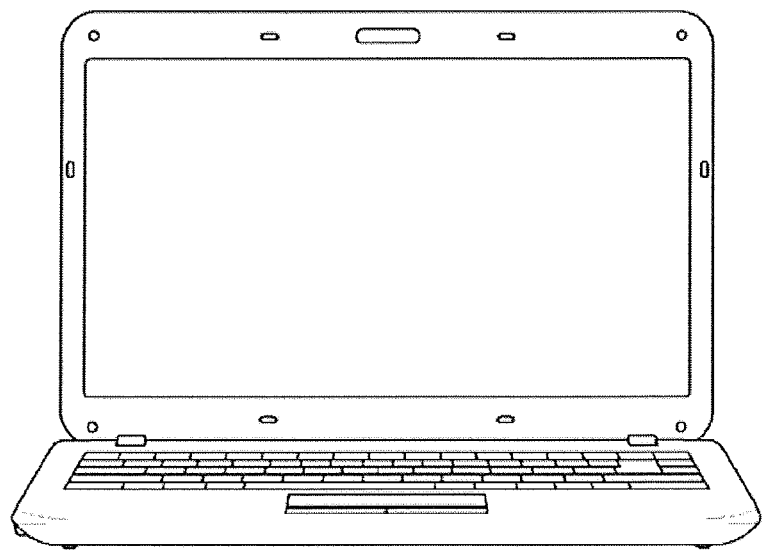

FIGS. 23 and 24 illustrate exemplary semiconductor systems in which semiconductor devices fabricated according to example embodiments of the present disclosure may be utilized.

FIG. 23 illustrates an example in which a semiconductor device fabricated according to an example embodiment of the present disclosure is utilized in a tablet PC 1200. FIG. 24 illustrates an example in which a semiconductor device fabricated according to an example embodiment of the present disclosure is utilized in a notebook computer 1300. Thus, at least one of the semiconductor devices fabricated according to example embodiments of the present disclosure can be utilized in a tablet PC, a notebook computer, etc. For example, semiconductor devices fabricated according to example embodiments of the present disclosure may also be applied to other integrated circuit (IC) devices not illustrated herein.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A method of fabricating a semiconductor device, comprising:
    forming a first fin-type structure on a first region of a substrate, wherein the first fin-type structure comprises a first semiconductor pattern and a second semiconductor pattern alternately stacked on one another and extending in a first direction;
    forming a second fin-type structure on a second region of the substrate, wherein the second fin-type structure comprises a third semiconductor pattern and a fourth semiconductor pattern alternately stacked on one another and extending in a second direction;
    forming a first capping layer extending in a third direction different from the first direction on the first fin-type structure;
    forming a second capping layer on sidewalls and a top surface of the second fin-type structure, wherein the second capping layer extends in a fourth direction different from the second direction and comprises a semiconductor material;
    forming a first dummy gate electrode on the first capping layer and a second dummy gate electrode on the second capping layer;
    exposing the first capping layer and the second capping layer by removing the first dummy gate electrode and the second dummy gate electrode;
    forming a second wire pattern group comprising the third semiconductor pattern on the second region by removing the second capping layer and the fourth semiconductor pattern; and
    forming a first wire pattern group comprising the second semiconductor pattern on the first region by removing the first capping layer and the first semiconductor pattern.

2. The method of claim 1, wherein the second capping layer is formed on the sidewalls and the top surface of the second fin-type structure through epitaxial growth.

3. The method of claim 2, wherein the second capping layer is conformally formed on the sidewalls and the top surface of the second fin-type structure.

4. The method of claim 1, wherein the second capping layer and the fourth semiconductor pattern are removed using a same etching process.

5. The method of claim 4, wherein removing the second capping layer and the fourth semiconductor pattern comprises:
    removing the second capping layer and the fourth semiconductor pattern using an etchant having a higher etch rate relative to the fourth semiconductor pattern compared to the first semiconductor pattern,
    wherein the second capping layer and the fourth semiconductor pattern are removed using the etchant while the first capping layer covers the first fin-type structure.

6. The method of claim 1, wherein forming the second capping layer comprises:
    forming the first capping layer on the first fin-type structure and the second fin-type structure;
    exposing the second fin-type structure by removing the first capping layer formed on the second fin-type structure; and
    forming the second capping layer on the sidewalls and the top surface of the exposed second fin-type structure.

7. The method of claim 6, wherein forming the second capping layer further comprises:

forming a mask layer on the first fin-type structure; and
removing the first capping layer formed on the second fin-type structure using the mask layer.

8. The method of claim 1, wherein the second wire pattern group comprises at least one second wire pattern, and the method further comprises:
forming a gate insulation layer along a periphery of the at least one second wire pattern and sidewalls of a second gate spacer; and
forming a gate electrode surrounding the at least one second wire pattern on the gate insulation layer.

9. The method of claim 1, wherein the first capping layer is an insulator.

10. The method of claim 1, wherein forming the first wire pattern group and exposing the first capping layer by removing the first dummy gate electrode are performed using a same etching process.

11. The method of claim 10, wherein forming the second wire pattern group comprises:
forming a mask layer covering the first wire pattern group and removing the second capping layer and the fourth semiconductor pattern using the mask layer.

12. A method of fabricating a semiconductor device, comprising:
forming a first fin-type structure on a first region of a substrate, wherein the first fin-type structure comprises a first semiconductor pattern and a second semiconductor pattern alternately stacked on one another and extending in a first direction;
forming a second fin-type structure on a second region of the substrate, wherein the second fin-type structure comprises a third semiconductor pattern and a fourth semiconductor pattern alternately stacked on one another and extending in a second direction;
forming a first capping layer on sidewalls and a top surface of the first fin-type structure, wherein the first capping layer extends in a third direction different from the first direction;
forming a second capping layer on the second fin-type structure, wherein the second capping layer extends in a fourth direction different from the second direction;
forming a first dummy gate electrode on the first capping layer and a second dummy gate electrode on the second capping layer;
exposing the first capping layer and the second capping layer by removing the first dummy gate electrode and the second dummy gate electrode;
forming a second wire pattern group comprising the third semiconductor pattern on the second region by removing the second capping layer and the fourth semiconductor pattern; and
forming a first wire pattern group comprising the second semiconductor pattern on the first region by removing the first capping layer and the first semiconductor pattern,
wherein the first capping layer and the second capping layer comprise different materials.

13. The method of claim 12, wherein forming the first wire pattern group is performed at substantially a same time as exposing the first capping layer by removing the first dummy gate electrode.

14. The method of claim 13, wherein forming the second wire pattern group comprises:
forming a mask layer covering the first wire pattern group; and
removing the second capping layer and the fourth semiconductor pattern using the mask layer.

15. The method of claim 12, wherein the second capping layer and the fourth semiconductor pattern are removed at substantially a same time using a same etching process.

16. A method of fabricating a semiconductor device, comprising:
forming a first fin-type structure on a first region of a substrate, wherein the first fin-type structure comprises a first semiconductor pattern and a second semiconductor pattern alternately stacked on one another;
forming a second fin-type structure on a second region of the substrate, wherein the second fin-type structure comprises a third semiconductor pattern and a fourth semiconductor pattern alternately stacked on one another, and a material forming the fourth semiconductor pattern is silicon-germanium (SiGe) or germanium (Ge);
forming a first capping layer on the first fin-type structure, wherein the first capping layer comprises silicon oxide;
forming a second capping layer on the second fin-type structure, wherein a material forming the second capping layer and the material forming the fourth semiconductor pattern are a same material; and
removing the second capping layer and the fourth semiconductor material at substantially a same time using a same etching process;
forming a first dummy gate electrode on the first capping layer and a second dummy gate electrode on the second capping layer;
exposing the first capping layer and the second capping layer by removing the first dummy gate electrode and the second dummy gate electrode;
forming a second wire pattern group comprising the third semiconductor pattern on the second region by removing the second capping layer and the fourth semiconductor pattern; and
forming a first wire pattern group comprising the second semiconductor pattern on the first region by removing the first capping layer and the first semiconductor pattern.

17. The method of claim 16, wherein the second capping layer and the fourth semiconductor material are removed at substantially a same time using a same mask layer.

18. The method of claim 16, wherein the second capping layer is formed on sidewalls and a top surface of the second fin-type structure through epitaxial growth.

19. The method of claim 16, wherein forming the second capping layer comprises:
forming the first capping layer on the first fin-type structure and the second fin-type structure;
exposing the second fin-type structure by removing the first capping layer formed on the second fin-type structure;
forming the second capping layer on sidewalls and a top surface of the exposed second fin-type structure;
forming a mask layer on the first fin-type structure; and
removing the first capping layer formed on the second fin-type structure using the mask layer.

* * * * *